US011222890B2

(12) United States Patent
Qiao et al.

(10) Patent No.: US 11,222,890 B2
(45) Date of Patent: Jan. 11, 2022

(54) INTEGRATED POWER SEMICONDUCTOR DEVICE AND METHOD FOR MANUFACTURING THE SAME

(71) Applicant: University of Electronic Science and Technology of China, Chengdu (CN)

(72) Inventors: Ming Qiao, Chengdu (CN); Linrong He, Chengdu (CN); Yi Li, Chengdu (CN); Chunlan Lai, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 41 days.

(21) Appl. No.: 16/839,089

(22) Filed: Apr. 3, 2020

(65) Prior Publication Data

US 2021/0074699 A1 Mar. 11, 2021

(30) Foreign Application Priority Data

Sep. 7, 2019 (CN) ........................ 201910845004.2

(51) Int. Cl.

*H01L 27/06* (2006.01)
*H01L 27/092* (2006.01)
(Continued)

(52) U.S. Cl.

CPC .... *H01L 27/0635* (2013.01); *H01L 21/76224* (2013.01); *H01L 21/823807* (2013.01);
(Continued)

(58) Field of Classification Search

CPC ........... H01L 27/0635; H01L 21/76224; H01L 21/823807; H01L 21/823814; H01L 21/823828; H01L 21/823857; H01L 21/823871; H01L 21/823878; H01L 21/823885; H01L 21/823892; H01L 29/0634; H01L 29/7396; H01L 29/7803; H01L 29/7817; H01L 29/7832; H01L 21/76283; H01L 29/66333; H01L 29/735; H01L 29/407; H01L 29/7395;
(Continued)

(56) References Cited

U.S. PATENT DOCUMENTS 7,829,971 B2 * 11/2010 Sone .................. H01L 27/1203
257/501

FOREIGN PATENT DOCUMENTS

CN 101452933 A 6/2009

* cited by examiner

*Primary Examiner* — David Vu
(74) *Attorney, Agent, or Firm* — Bayramoglu Law Offices LLC

(57) ABSTRACT

An integrated power semiconductor device, includes devices integrated on a single chip. The devices include a vertical high voltage device, a first high voltage pLDMOS device, a high voltage nLDMOS device, a second high voltage pLDMOS device, a low voltage NMOS device, a low voltage PMOS device, a low voltage NPN device, and a low voltage diode device. A dielectric isolation is applied to the first high voltage pLDMOS device, the high voltage nLDMOS device, the second high voltage pLDMOS device, the low voltage NMOS device, the low voltage PMOS device, the low voltage NPN device, and the low voltage diode device. A multi-channel design is applied to the first high voltage pLDMOS device, and the high voltage nLDMOS device. A single channel design is applied to the second high voltage pLDMOS device.

12 Claims, 40 Drawing Sheets

(51) Int. Cl.
*H01L 29/66* (2006.01)
*H01L 21/762* (2006.01)
*H01L 21/8238* (2006.01)
*H01L 29/06* (2006.01)
*H01L 29/739* (2006.01)
*H01L 29/78* (2006.01)

(52) U.S. Cl.
CPC ................ *H01L 21/823814* (2013.01); *H01L 21/823828* (2013.01); *H01L 21/823857* (2013.01); *H01L 21/823871* (2013.01); *H01L 21/823878* (2013.01); *H01L 21/823885* (2013.01); *H01L 21/823892* (2013.01); *H01L 29/0634* (2013.01); *H01L 29/7396* (2013.01); *H01L 29/7803* (2013.01); *H01L 29/7817* (2013.01); *H01L 29/7832* (2013.01)

(58) Field of Classification Search
CPC ............. H01L 27/1207; H01L 27/0922; H01L 29/66681; H01L 29/66712; H01L 29/7811; H01L 29/0619; H01L 29/402; H01L 29/0878; H01L 29/7831; H01L 29/42368; H01L 29/7824; H01L 29/7802; H01L 29/78; H01L 21/76267; H01L 21/84
See application file for complete search history.

INTEGRATED POWER SEMICONDUCTOR DEVICE AND METHOD FOR MANUFACTURING THE SAME

CROSS REFERENCE TO RELATED APPLICATIONS

This application is based upon and claims priority to Chinese Patent Application No. 201910845004.2, filed on Sep. 7, 2019, the entire content of which is incorporated herein by reference.

TECHNICAL FIELD

The present invention pertains to the technical field of semiconductor power devices, and relates to an integrated power semiconductor device and a method for manufacturing the same.

BACKGROUND

Because of the high precision of bipolar transistors in analog applications, high-integration of CMOS, and high power or voltage characteristic of DMOS (Double-diffused MOSFET), generally, bipolar analog circuits, CMOS logic circuits, CMOS analog circuits and DMOS high voltage power devices are integrated into a single chip (BCD process for short) of a high voltage power integrated circuit. BCD process integration technology is a commonly used monolithic integration technology that can significantly reduce system power loss, improve system performance, save circuit packaging costs and have better reliability.

Lateral high voltage devices are widely used in high voltage power integrated circuits because the drain terminal, gate terminal and source terminal of the lateral high voltage devices are all on the chip surface and are easy to be integrated with low-voltage signal circuits through internal connections. The relationship between a specific on-resistance ($R_{on,\ sp}$) and breakdown voltage (BV) of a DMOS device is $R_{on,\ sp} \propto BV^{2.3\text{-}2.6}$ under simple one-dimensional analysis. As a result, the turn-on resistance of the device increases sharply in high voltage applications, which limits the application of lateral high voltage DMOS devices in high voltage power integrated circuits, especially in circuits requiring low turn-on loss and small chip size. In order to solve the problem of high turn-on resistance, J. A. APPLES et al. proposed RESURF (Reduced SURface Field) technology to reduce the surface field, which is widely used in the design of high voltage devices. In addition, concepts such as Double-RESURF, Triple-RESURF LDMOS devices and Insulated-Gate Bipolar Transistor (IGBT) and other similar devices have also been proposed by others. Based on RESURF voltage sustaining principle, the inventor's invention of BCD semiconductor device and manufacturing technique thereof (patent number: ZL200810148118.3) has been patented. In the invention, nLIGBT, nLDMOS, low voltage NMOS, low voltage PMOS and low voltage NPN are monolithically integrated on a single crystal substrate to obtain well-performed power devices with high voltage, high speed, and low turn-on loss. Since no epitaxial process is used, the chip has a lower manufacturing cost. However, problems such as excessive leakage current and crosstalk in the chip cannot be avoided. Based on the above factors, the author proposes a partial buried oxygen ions integration technology, and the buried oxide layer is formed by ion implantation, which is lower in cost than other SOI processes. This technology integrates lateral high voltage devices, vertical high voltage devices, and low-voltage devices without leakage current and crosstalk problems, wherein the vertical high voltage devices can be VDMOS, and IGBT. Compared with the lateral high voltage devices, the vertical high voltage devices have a lower on-resistance and occupy a smaller chip area.

SUMMARY

In view of the above-mentioned deficiencies of the prior art, the objective of the present invention is to provide an integrated power semiconductor device and a method for manufacturing the same. This technology provides an integrated solution with no crosstalk, no leakage, low cost, high power, and low conduction loss.

In order to realize the above-mentioned objective of the present invention, the technical solution of the present invention is as follows.

1. An integrated power semiconductor device, includes devices integrated on a single chip; the devices include a vertical high voltage device 1, a first high voltage pLDMOS device 2, a high voltage nLDMOS device 3, a second high voltage pLDMOS device 4, a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices; a multi-channel design is applied to the first high voltage pLDMOS device 2, and the high voltage nLDMOS device 3; a single channel design is applied to the second high voltage pLDMOS device 4;

The vertical high voltage device 1 include a substrate 000, a second conductivity type epitaxial layer 201 located on the substrate 000, a closely connected cell region $C_n$ located in the second conductivity type epitaxial layer 201, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, and a first conductivity type field limiting ring 101 arranged at equal intervals below the field oxide dielectric layer 301; the cell region $C_n$ further includes a first conductivity type first body region 103 located in both sides of the cell region, a second conductivity type first emitter or source contact 200 and a first conductivity type first emitter or source contact 100, wherein the second conductivity type first emitter or source contact 200 and the first conductivity type first emitter or source contact 100 are located in the first conductivity type first body region 103 and adjacent to each other, a first emitter or source metal 500 in contact with the second conductivity type first emitter or source contact 200 and the first conductivity type first emitter or source contact 100, a first gate dielectric layer 303 located on an upper surface of the cell region $C_n$, and a first gate terminal 401 located on an upper surface of the first gate dielectric layer 303;

The first high voltage pLDMOS device 2 is located in an isolation region formed by a second dielectric trench 312 and a second oxygen ions injection layer 310, the second oxygen ions injection layer 310 is connected with the second dielectric trench 312 to form the isolation area, a second polysilicon filler 407 is located in the second dielectric trench 312; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in a side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in an isolation region formed by a third dielectric trench 313 and a third oxygen ions injection layer 311, the third oxygen ions injection layer 311 is connected with the third dielectric trench 313 to form the isolation area, a third polysilicon filler 408 is located in the third dielectric trench 313; the high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in a side of the second conductivity type drift region 219, a second conductivity type first field resistance region 217 located in the other side of second conductivity type drift region 219, a second conductivity type third source contact 215 located in both sides of the first conductivity type second body region 121 and in contact with a third source metal 519, a first conductivity type third source contact 120 between the second conductivity type third source contacts 215 and in contact with a third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in an isolation region formed by a fourth dielectric trench 314 and a fourth oxygen ions injection layer 315, the fourth oxygen ions injection layer 315 is connected with the fourth dielectric trench 314 to form the isolation area, a fourth polysilicon filler 409 is located in the fourth dielectric trench 314; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type a second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in an isolation region formed by a first dielectric trench 309 and a first oxygen ions injection layer 306, the first oxygen ions injection layer 306 is connected with the first dielectric trench 309 to form the isolation area, and a first polysilicon filler 404 is located in the first dielectric trench 309.

Preferably, the low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, a second conductivity type body contact 206 located on a side of the first conductivity type fifth source contact 108 away from the sixth gate terminal 403, and a second body metal 508 in contact with the second conductivity type body contact 206;

The low voltage NPN device 7 includes a second conductivity type second well region 208 located in a first conductivity type first deep well region 115, a second conductivity type collector contact 209 located in a side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212.

Preferably, the second oxygen ions injection layer 310, the third oxygen ions injection layer 311, the fourth oxygen ions injection layer 315, and the first oxygen ions injection layer 306 are located in the second conductivity type epitaxial layer 201.

Preferably, the second oxygen ions injection layer 310, the third oxygen ions injection layer 311, the fourth oxygen ions injection layer 315, and the first oxygen ions injection layer 306 are located in the substrate 000.

Preferably, a second conductivity type field resistance layer 223 is inserted between the substrate 000 and the second conductivity type epitaxial layer 201 in the vertical high voltage device 1.

Preferably, the first conductivity type first deep well region 115 is located in an isolation region formed by the first dielectric trench 309 and the first oxygen ions injection layer 306, or the first conductivity type first deep well region 115 is located outside the isolation region formed by the first dielectric trench 309 and the first oxygen ions injection layer 306, and a first conductivity type contact ring 105 is located in the edge of first conductivity type the first deep well region 115 and is in contact with a contact ring metal 502;

The first high voltage pLDMOS device 2 is located in a first conductivity type second deep well region 123, the first conductivity type second deep well region 123 is located outside an isolation region formed by the second dielectric trench 312 and the second oxygen ions injection layer 310, and a first conductivity type contact ring 105 is located inside the edge of the first conductivity type second deep well region 123 and is in contact with a contact ring metal 502;

The high voltage nLDMOS device 3 is located in a first conductivity type third deep well region 116, the first conductivity type third deep well region 116 is located outside an isolation region formed by the third dielectric trench 313 and the third oxygen ions injection layer 311, and a first conductivity type contact ring 105 is located inside the edge of the first conductivity type third deep well region 116 and is in contact with a contact ring metal 502;

The second high voltage pLDMOS device 4 is located in a first conductivity type fourth deep well region 125, the first conductivity type fourth deep well region 125 is located outside an isolation region formed by the fourth dielectric trench 314 and the fourth oxygen ions injection layer 315, and a first conductivity type contact ring 105 is located inside the edge of the first conductivity type fourth deep well region 125 and is in contact with a contact ring metal 502.

Preferably, the second conductivity type first well region 205 of the low voltage PMOS device 6 and the second conductivity type second well region 208 of the low voltage NPN device 7 are in contact with the first oxygen injection layer 306.

Preferably, the substrate 000 is a first conductivity type substrate 102 or a second conductivity type substrate 218.

Preferably, the substrate 000 is a first conductivity type substrate 102, the vertical high voltage device 1 is a high voltage IGBT device 1, the first conductivity type first deep well region 115 is located outside an isolation region formed by the first dielectric trench 309 and the first oxygen ions injection layer 306, and a first conductivity type contact ring 105 is located inside the edge of the f first conductivity type first deep well region 115 and in contact with a contact ring metal 502;

The high voltage IGBT device 1 further includes a Schottky contact cell $S_n$ located between the cell regions $C_n$; the Schottky contact cell $S_n$ includes a first conductivity type first body region 103 located in the second conductivity type epitaxial layer 201, a second conductivity type second cathode contact 225 located between the first conductivity type first body regions 103 and not in contact with the first conductivity type first body region 103, a second cathode metal 527 in contact with the second conductivity type second cathode contact 225, and a pre-metal dielectric layer 302 to isolate the Schottky contact cell $S_n$ and the cell region $C_n$.

Preferably, substrate 000 is a second conductivity type substrate 218, the low voltage NMOS device 5 includes a first conductivity type well region 129 located in an isolation region formed by the first dielectric trench 309 and the first oxygen ions injection layer 306, a fifth gate dielectric layer 304 located on an upper surface of first conductivity type well region 129, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type well region 129, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106.

2. The present invention also provides another integrated power semiconductor device, includes devices integrated on a single chip; the devices include a high voltage SJ-VDMOS device 1, a first high voltage pLDMOS device 2, a high voltage nLDMOS device 3, a second high voltage pLDMOS device 4, and a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices. A multi-channel design is applied to the first high voltage pLDMOS device 2, and the high voltage nLDMOS device 3; a single channel design is applied to the second high voltage pLDMOS device 4; the first oxygen ions injection layer 306, the second oxygen ions injection layer 310, the third oxygen ions injection layer 311, and the fourth oxygen ions injection layer 315 are located in the second conductivity type substrate 218;

The high voltage SJ-VDMOS device 1 includes a second conductivity type substrate 218, a second conductivity type epitaxial layer 201 located on the second conductivity type substrate 218, a closely connected cell region $C_n$ located in the second conductivity type epitaxial layer 201, a first conductivity type first body region 103 located outside the outermost cell region $C_n$, a second conductivity type first source contact 104 located in the first conductivity type first body region 103, a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and located in the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the fifth dielectric trenches 317 and located on a surface of the second conductivity type epitaxial layer 201, and a first gate terminal 401 located on an upper surface of the first gate dielectric layer 303;

The first high voltage pLDMOS device 2 is located in an isolation region formed by a second dielectric trench 312 and a second oxygen ions injection layer 310, the second oxygen ions injection layer 310 is connected with the second dielectric trench 312 to form the isolation area, a second polysilicon filler 407 is located in the second dielectric trench 312; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in a side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in an isolation region formed by a third dielectric trench 313 and a third oxygen ions injection layer 311, the third oxygen ions injection layer 311 is connected with the third dielectric trench 313 to form the isolation area, a third polysilicon filler 408 is located in the third dielectric trench 313; the high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in a side of the second conductivity type drift region 219, a second conductivity type first field resistance region 217 located in the other side of the second conductivity type drift region 219, a second conductivity type third source contact 215 located in both sides of the first conductivity type second body region 121 and in contact with a third source metal 519, a first conductivity type third source contact 120 located between the second conductivity type third source contacts 215 and in contact with third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in an isolation region formed by a fourth dielectric trench 314 and a fourth oxygen ions injection layer 315, the fourth oxygen ions injection layer 315 is connected with the fourth dielectric trench 314 to form the isolation area, a fourth polysilicon filler 409 is located in the fourth dielectric trench 314; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on a outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in an isolation region formed by a first dielectric trench 309 and a first oxygen ions injection layer 306, the first oxygen ions injection layer 306 is connected with the first dielectric trench 309 to form the isolation area, and a first polysilicon filler 404 is located in the first dielectric trench 309.

Preferably, the high voltage SJ-VDMOS device 1 further includes a JFET cell region $J_n$ located between the cell regions $C_n$; the JFET cell region $J_n$ includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and located in the second conductivity type epitaxial layer 201, a first conductivity type first source contact 104 located in the first conductivity type first body region 103, a first source metal 501 in contact with the first conductivity type first source contact 104, a second conductivity type first source contact 202 located between the first conductivity type first body regions 103, and a seventh source metal 524 in contact with the second conductivity type first source contact 202; the seventh source metal 524 is isolated from the first source metal 501 by the pre-metal dielectric layer 302.

3. The present invention also provides another integrated power semiconductor device, includes devices integrated on a single chip; the devices include a high voltage LIGBT device 1, a first high voltage pLDMOS device 2, a high voltage nLDMOS device 3, a second high voltage pLDMOS device 4, and a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices; a multi-channel design is applied to the first high voltage pLDMOS device 2, and the high voltage nLDMOS device 3; a single channel design is applied to the second high voltage pLDMOS device 4;

The high voltage LIGBT device 1 includes a first conductivity type substrate 102, a second conductivity type epitaxial layer 201 located on the first conductivity type substrate 102, a first conductivity type first body region 103 located in one side of the second conductivity type epitaxial layer 201, a second conductivity type first emitter contact 227 located in both sides of the first body type first body region 103, a first conductivity type first emitter contact 114 located between the second conductivity type first emitter contacts 227, a first emitter metal 528 in contact with the first conductivity type the first emitter contact 227 and the first conductivity type first emitter contact 114, a second gate dielectric layer 307 located on an upper surface of the first conductivity type first body region 103 and the second conductivity type epitaxial layer 201, a second gate terminal 405 located on the second gate dielectric layer 307, a second conductivity type second field resistance region 226 located in the other side of the second conductivity type epitaxial layer 201, a first conductivity type first collector contact 131 located in the second conductivity type second field resistance region 226, wherein, the first conductivity type first collector contact 131 is in contact with a third collector metal 526 above it, a field oxide dielectric layer 301 located on an upper surface of the second conductivity type epitaxial layer 201 and inserted between the first conductivity type first body region 103 and the second conductivity type second field resistance region 226, and a pre-metal dielectric layer 302 located on the field oxide dielectric layer 301 and the second gate terminal 405 to isolate the first emitter metal 528 and the second gate terminal 405;

The first high voltage pLDMOS device 2 is located in a first conductivity type second deep well region 123, a first conductivity type contact ring 105 is located inside the edge of the first conductivity type second deep well region 123 and in contact with a contact ring metal 502, a second dielectric trench 312 and a second polysilicon filler 407 located in the second dielectric trench 312 are located at the medial side of the first conductivity type contact ring 105, a second oxygen ions injection layer 310 is located at the bottom of the first conductivity type second deep well region 123 and connected to the second dielectric trench 312 to form an isolation region; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in one side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 located between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in a first conductivity type third deep well region 116, a first conductivity type contact ring 105 is located inside the edge of the first conductivity type third deep well region 116 and in contact with a contact ring metal 502, a third dielectric trench 313 and a third polysilicon filler 408 located in the third dielectric trench 313 are located at the medial side of the first conductivity type contact ring 105, a third oxygen ions injection layer 311 is located at the bottom of the first conductivity type third deep well region 116 and connected to the third dielectric trench 313 to form an isolation region; The high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in one side of the second conductivity type drift region 219, a second conductivity type first field resistance region 217 located in the other side of the second conductivity type drift region 219, a second conductivity type third source contact 215 located in both sides of the first conductivity type second body region 121 and in contact with a third source metal 519, a first conductivity type third source contact 120 located between the second conductivity type third source contacts 215 and in contact with a third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in a first conductivity type fourth deep well region 125, a first conductivity type contact ring 105 is located inside the edge of the first conductivity type fourth deep well region 125 and in contact with a contact ring metal 502, a fourth dielectric trench 314 and a fourth polysilicon filler 409 located in the fourth dielectric trench 314 are located at the medial side of the first conductivity type contact ring 105, a fourth oxygen ions injection layer 315 is located at the bottom of the first conductivity type fourth deep well region 125 and connected to the fourth dielectric trench 314 to form an isolation region; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on a outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in a first conductivity type first deep well region 115, a first conductivity type contact ring 105 is located inside the edge of the first conductivity type first deep well region 115 and is in contact with a contact ring metal 502, a first dielectric trench 309 and a first polysilicon filler 404 located in the first dielectric trench 309 are located at the medial side of the first conductivity type contact ring 105, a first oxygen ions injection layer 306 is located in the bottom of the first conductivity type first deep well region 115 and is connected to the first dielectric trench 309 to form an isolation region;

The low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, and a second conductivity type body contact 206 located on a side of the first conductivity type fifth source contact 108 away from the sixth gate terminal 403, a second body metal 508 in contact with the second conductivity type body contact 206;

The low voltage NPN device 7 includes a second conductivity type second well region 208 located in a first conductivity type first deep well region 115, a second conductivity type collector contact 209 located in one side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212.

4. The present invention also provides another integrated power semiconductor device, includes devices integrated on a single chip; The devices include a vertical high voltage device 1, and a low voltage NMOS device 5, a low voltage PMOS device 6, a low voltage NPN device 7, a low voltage PNP device 9 and a low voltage diode device 8;

The low voltage NMOS device 5, the low voltage PMOS device 6, the low voltage NPN device 7, the low voltage PNP device 9 and the low voltage diode device 8 are both located inside a first conductivity type first deep well region 115, a first conductivity type contact ring 105 is located in the edge of the first conductivity type first deep well region 115 and in contact with a contact ring metal 502, a first dielectric trench 309 is located at the medial side of the first conductivity type contact ring 105, a first oxygen ions injection layer 306 is located in the bottom of the first conductivity type first deep well region 115 and is connected to the first dielectric trench 309 to form an isolation region; the low voltage NMOS device 5, the low voltage PMOS device 6, the low voltage NPN device 7, the low voltage PNP device 9 and the low voltage Diode device 8 are isolated from each other by a first dielectric trench 309;

The low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, and a second conductivity type body contact 206 located on a side of the first conductivity type fifth source contact 108 away from the sixth gate terminal 403, a second body metal 508 in contact with the second conductivity type body contact 206;

The low voltage NPN device 7 includes a second conductivity type second well region 208 located in a first conductivity type first deep well region 115, a second conductivity type collector contact 209 located in one side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage PNP device 9 includes a first conductivity type second collector contact 112 located in a first conductivity type first deep well region 115, a second collector metal 514 in contact with the first conductivity type second collector contact 112, a second conductivity type base region 210 located in the first conductivity type first deep well region 115, a second conductivity type base contact 211 and a first conductivity type second emitter contact 111 located in the second conductivity type base region 210, a second base metal 513 in contact with the second conductivity type base contact 211, and a second emitter metal 512 in contact with the first conductivity type second emitter contact 111;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212.

Preferably, a second conductivity type field resistance layer 223 is inserted between the substrate 000 and the second conductivity type epitaxial layer 201 in the vertical high voltage device 1.

Preferably, the vertical high voltage device 1 include substrate 000, a second conductivity type epitaxial layer 201 located on the substrate 000, a closely connected cell region $C_n$ located in the second conductivity type epitaxial layer 201, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, and a first conductivity type field limiting ring 101 arranged at equal intervals below the field oxide dielectric layer 301; the cell region $C_n$ further includes a first conductivity type first body region 103 located in both sides of the cell region, a second conductivity type first emitter or source contact 200 and a first conductivity type first emitter or source contact 100, wherein the second conductivity type first emitter or source contact 200 and the first conductivity type first emitter or source contact 100 are located in the first conductivity type first body region 103 and adjacent to each other, a first emitter or source metal 500 in contact with the second conductivity type first emitter or source contact 200 and the first conductivity type first emitter or source contact 100, a first gate dielectric layer 303 located on an upper surface of the cell region $C_n$, and a first gate terminal 401 located on an upper surface of the first gate dielectric layer 303.

Preferably, the substrate 000 is a first conductivity type substrate 102 or a second conductivity type substrate 218.

Preferably, the substrate 000 is a second conductivity type substrate 218, and the vertical high voltage device 1 is a high voltage SJ-VDMOS device; the high voltage SJ-VDMOS device 1 includes a second conductivity type substrate 218, a second conductivity type epitaxial layer 201 located on the second conductivity type substrate 218, a closely connected cell region $C_n$ located in the second conductivity type epitaxial layer 201, a first conductivity type first body region 103 located outside the outermost cell region $C_n$, a second conductivity type first source contact 104 located in the first conductivity type first body region 103, a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and in of the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the fifth dielectric trenches 317 and located on an upper surface of the second conductivity type epitaxial layer 201, and a first gate terminal 401 located on an upper surface of the first gate dielectric layer 303.

Preferably, the substrate 000 is a second conductivity type substrate 218, and the vertical high voltage device 1 is a high voltage SJ-VDMOS device; the high voltage SJ-VDMOS device 1 includes a second conductivity type substrate 218, a second conductivity type epitaxial layer 201 located on the second conductivity type substrate 218, a closely connected cell region $C_n$ located in the second conductivity type epitaxial layer 201, a first conductivity type first body region 103 located outside the outermost cell region $C_n$, a second conductivity type first source contact 104 located in the first conductivity type first body region 103, a first conductivity type super junction pillar 130 located in the second conductivity type epitaxial layer 201, a pre-metal dielectric layer 302 located on a surface of the second conductivity type epitaxial layer 201, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a first conductivity type super junction pillar 130 located in the second conductivity type epitaxial layer 201, a first conductivity type first body region 103 located at the medial side of the first conductivity type super junction pillar 130 and located in the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the first conductivity type super junction pillars 130 and located in the second conductivity type epitaxial layer 201, and a first gate terminal 401 located on an upper surface of the first gate dielectric layer 303.

Preferably, the substrate 000 is a second conductivity type substrate 218, the high voltage SJ-VDMOS device 1 further includes a JFET cell region $J_n$ located between the cell regions $C_n$; the JFET cell region $J_n$ includes a first conductivity type super junction pillar 130 located in the second conductivity type epitaxial layer 201, wherein the first conductivity type super junction pillar 130 extends to the top of the second conductivity type substrate 218 and the upper surface of the second conductivity type epitaxial layer 201, a first conductivity type first body region 103 located at the medial side of the first conductivity type super junction pillars 130 and located in the second conductivity type epitaxial layer 201, a first conductivity type first source contact 104 located in the first conductivity type first body region 103, a first source metal 501 in contact with the first conductivity type first source contact 104, a second conductivity type first source contact 202 located between the first conductivity type first body regions 103, and a seventh source metal 524 in contact with the second conductivity type first source contact 202; the seventh source metal 524 is isolated from the first source metal 501 by the pre-metal dielectric layer 302.

Preferably, the substrate 000 is a first conductivity type substrate 102 and the vertical high voltage device 1 is a high voltage SJ-IGBT device; the high voltage SJ-IGBT device 1 includes a first conductivity type substrate 102, a second conductivity type epitaxial layer 201 located on the first conductivity type substrate 102, a closely connected cell region $C_n$ located in the second conductivity type epitaxial layer 201, a first conductivity type first body region 103 located outside the outermost cell region $C_n$, a second conductivity type first emitter contact 104 located in the first conductivity type first body region 103, a first conductivity type super junction pillar 130 located in the second conductivity type epitaxial layer 201, a pre-metal dielectric layer 302 located on a surface of the second conductivity type epitaxial layer 201, a metal field plate 523 located on a surface of the pre-metal dielectric layer 302, a second conductivity type cutoff ring 224 located at the outermost periphery of the high voltage SJ-IGBT device 1 and a cutoff ring metal 525 located on the second conductivity type cutoff ring 224; the cell region $C_n$ further includes a first conductivity type super junction pillar 130 located in the second conductivity type epitaxial layer 201, a first conductivity type first body region 103 located at the medial side of the first conductivity type super junction pillar 130 and located in the second conductivity type epitaxial layer 201, a second conductivity type first emitter contact 227 and a first conductivity type first emitter contact 114, wherein the second conductivity type first emitter contact and the first conductivity type first emitter contact are located in the first conductivity type first body region 103 and adjacent to each other, a first emitter metal 528 in contact with the second conductivity type first emitter contact 227 and the first conductivity type first emitter contact 114, a first gate dielectric layer 303 located between the first conductivity type super junction pillars 130 and located in the second conductivity type epitaxial layer 201, and a first gate terminal 401 located on an upper surface of the first gate dielectric layer 303.

5. In order to achieve the above-mentioned objective, the present invention further provides a method for manufacturing the integrated power semiconductor device which includes the following steps.

Step 1, use a substrate 000.

Step 2, oxygen ions with a predetermined amount is implanted into a substrate 000 through a photolithography technique and an ion implantation technique.

Step 3, an annealing treatment is performed to form a first oxygen ions injection layer 306, a second oxygen ions injection layer 310, a third oxygen ions injection layer 311.

Step 4, an epitaxy is performed to form a second conductivity type epitaxial layer 201

Step 5, a dielectric trench is formed through a deep trench etching process, an oxide layer is thermally grown on the side wall of the trench, a polysilicon is deposited to fill remaining gaps in the dielectric trench.

Step 6, a first conductivity type first deep well region 115, a first conductivity type first drift region 122, and a second conductivity type drift 219 are formed in the second conductivity type epitaxial layer 201 through a photolithography technique, an ion implantation technique, Ion Implantation technique and an annealing technique.

Step 7, an oxide layer is thermally grown on an upper surface of the second conductivity type epitaxial layer 201, field oxide dielectric layer 301 is formed.

Step 8, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type first field resistance region 119, a first conductivity type second body region 121, a second conductivity type first field resistance region 217.

Step 9, an oxide layer is thermally grown on the upper surface of the second conductivity type epitaxial layer 201 to form a gate dielectric layer, polysilicon is deposited, and gate terminal is formed by through a photolithography technique.

Step 10, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 11, a pre-metal dielectric layer 302 is deposited, and a metal layer is deposited after punching.

6. In order to achieve the above-mentioned objective, the present invention further provides a method for manufacturing the integrated power semiconductor device which includes the following steps.

Step 1, use a second conductivity type epitaxial layer 201.

Step 2, a first conductivity type first deep well region 115, a first conductivity type second deep well region 123, and a first conductivity type drift first drift region 122 are formed in the second conductivity type epitaxial layer 201 through a photolithography technique, an ion implantation technique, ion Implantation technique and an annealing technique.

Step 3, oxygen ions with a predetermined amount is implanted into the first conductivity type first deep well region 115, the first conductivity type second deep well region 123, and the first conductivity type drift first drift region 122 through a photolithography technique and an ion implantation technique.

Step 4, an annealing treatment is performed to form a first oxygen ions injection layer 306, a second oxygen ions injection layer 310, a third oxygen ions injection layer 311.

Step 5, a dielectric trench is formed through a deep trench etching process, an oxide layer is thermally grown on the side wall of the trench, a polysilicon is deposited to fill remaining gaps in the dielectric trench.

Step 6, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type first field resistance region 119, a first conductivity type second body region 121, a second conductivity type first field resistance region 217.

Step 7, an oxide layer is thermally grown on an upper surface of the second conductivity type epitaxial layer 201, field oxide dielectric layer 301 is formed.

Step 8, an oxide layer is thermally grown on the upper surface of the second conductivity type epitaxial layer 201 to form a gate dielectric layer, polysilicon is deposited, and gate terminal is formed by through a photolithography technique.

Step 9, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 10, a pre-metal dielectric layer 302 is deposited, and a metal layer is deposited after punching.

Step 11, the backside ion implant is performed to form the substrate 000

7. In order to achieve the above-mentioned objective, the present invention further provides a method for manufacturing the integrated power semiconductor device which includes the following steps.

Step 1, use a second conductivity type substrate 218.

Step 2, oxygen ions with a predetermined amount is implanted into the second conductivity type substrate 218 through a photolithography technique and an ion implantation technique.

Step 3, an annealing treatment is performed to form a first oxygen ions injection layer 306, a second oxygen ions injection layer 310, a third oxygen ions injection layer 311.

Step 4, an epitaxy is performed to form a second conductivity type epitaxial layer 201

Step 5, a dielectric trench is formed through a deep trench etching process, an oxide layer is thermally grown on the side wall of the trench, a polysilicon is deposited to fill remaining gaps in the dielectric trench.

Step 6, a first conductivity type a first deep well region 115, a first conductivity type a first drift region 122, and a second conductivity type drift 219 are formed in the second conductivity type epitaxial layer 201 through a photolithography technique, an ion implantation technique, Ion Implantation technique and an annealing technique.

Step 7, an oxide layer is thermally grown on an upper surface of the second conductivity type epitaxial layer 201, field oxide dielectric layer 301 is formed.

Step 8, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type a first field resistance region 119, a first conductivity type second body region 121, a second conductivity type first field resistance region 217.

Step 9, an oxide layer is thermally grown on the upper surface of the second conductivity type epitaxial layer 201 to form a gate dielectric layer, polysilicon is deposited, and gate terminal is formed by through a photolithography technique.

Step 10, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 11, a pre-metal dielectric layer 302 is deposited, and a metal layer is deposited after punching.

The present invention has the following advantages. The author proposes a partial buried oxygen ions integration technology, and the buried oxide layer is formed by ion implantation, which is lower in cost than other SOI processes. This technology integrates lateral high voltage devices, vertical high voltage devices, and low-voltage devices without leakage current and crosstalk problems. Vertical high voltage devices can be VDMOS, IGBT, etc., with lower on-resistance and smaller chip area than lateral high voltage devices.

Figure 1:
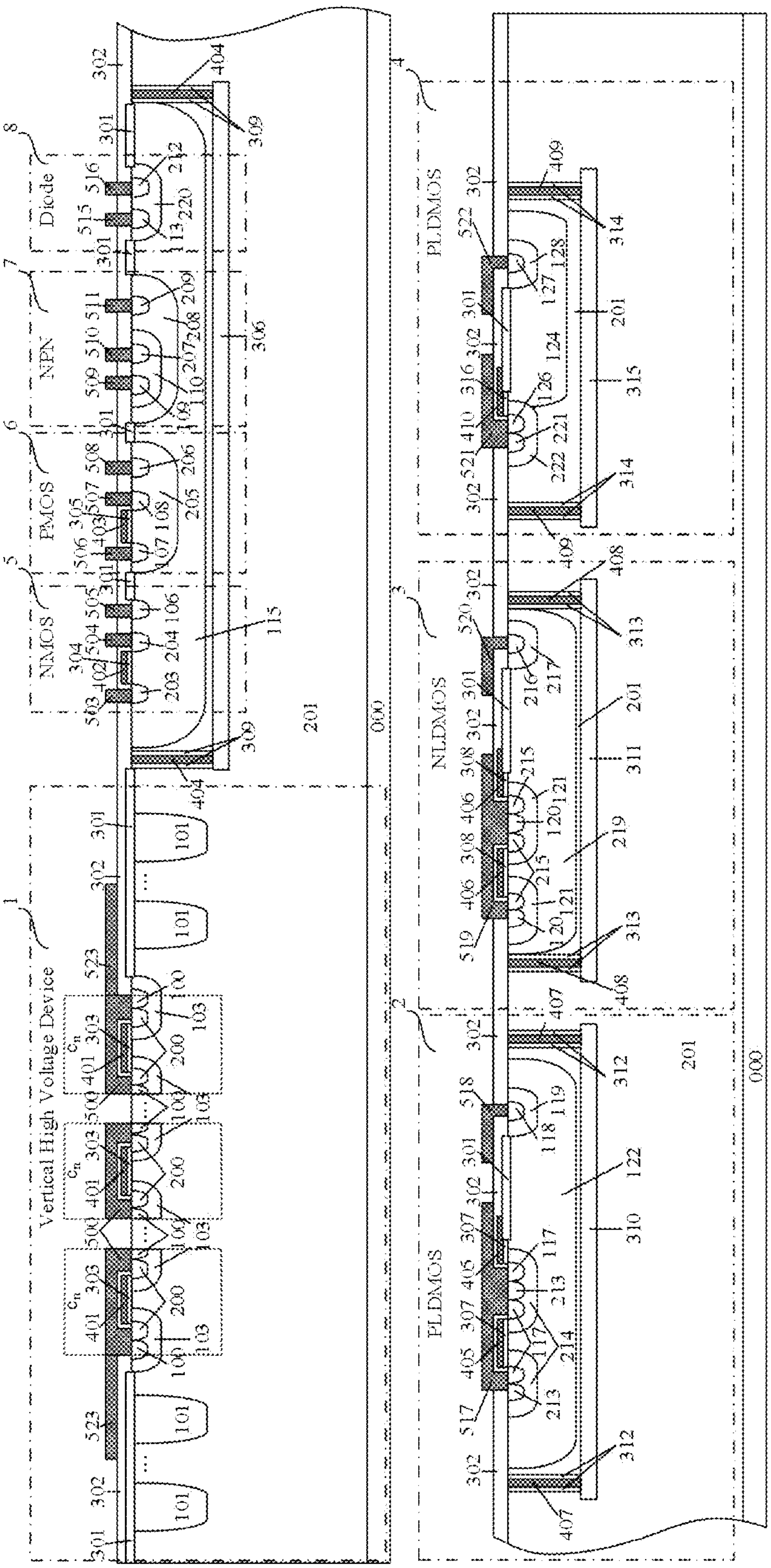
FIG. 1 is a structural schematic diagram of an integrated power semiconductor device according to Embodiment 1 of the present invention.

In the drawings, 000 is a substrate, 1 is a vertical high voltage device, 2 is a first high voltage pLDMOS device, 3 is a high voltage nLDMOS device, 4 is a second high voltage pLDMOS device, 5 is a low voltage NMOS device, 6 is a low voltage PMOS device, 7 is a low voltage NPN device, 8 is a low voltage diode device, 9 is a low voltage PNP device.

100 is a first conductivity type first emitter or source contact, 101 is a first conductivity type field limiting ring, 102 is a first conductivity type substrate, 103 is a first conductivity type first body region, 104 is a second conductivity type first source contact, 105 is a first conductivity type contact ring, 106 is a first conductivity type body contact, 107 is a first conductivity type third drain contact, 108 is a first conductivity type fifth source contact, 109 is a first conductivity type base contact, 110 is a first conductivity type base region, 111 is a first conductivity type a second emitter contact, 112 is a first conductivity type second collector contact, 113 is a first conductivity type anode contact, 114 is a first conductivity type first emitter contact, 115 is a first conductivity type first deep well region, 116 is a first conductivity type third deep well region, 117 is a first conductivity type second source contact, 118 is a first conductivity type first drain contact, 119 is a first conductivity type first field resistance region, 120 is a first conductivity type third source contact, 121 is a first conductivity type second body region, 122 is a first conductivity type first drift region, 123 is a first conductivity type second deep well region, 124 is a first conductivity type second drift region, 125 is a first conductivity type fourth deep well region, 126 is a first conductivity type fourth source contact, 127 is a first conductivity type second drain contact, 128 is a first conductivity type second field resistance region, 129 is a first conductivity type well region, 130 is a first conductivity type super junction pillar, 131 is a first conductivity type first collector contact.

200 is a second conductivity type a first emitter or source contact, 201 is a second conductivity type epitaxial layer, 202 is a second conductivity type first source contact, 203 is a second conductivity type second drain contact, 204 is a second conductivity type fifth source contact, 205 is a second conductivity type first well region, 206 is a second conductivity type body contact, 207 is a second conductivity type second emitter contact, 208 is a second conductivity type second well region, 209 is a second conductivity type collector contact, 210 is a second conductivity type base region, 211 is a second conductivity type base contact, 212 is a second conductivity type first cathode contact, 213 is a second conductivity type second source contact, 214 is a second conductivity type first body region, 215 is a second conductivity type third source contact, 216 is a second conductivity type first drain contact, 217 is a second conductivity type first field resistance region, 218 is a second conductivity type substrate, 219 is a second conductivity type drift region, 220 is a second conductivity type cathode region, 221 is a second conductivity type fourth source contact, 222 is a second conductivity type second body region, 223 is a second conductivity type field resistance layer, 224 is a second conductivity type cutoff ring, 225 is a second conductivity type second cathode contact, 226 is a second conductivity type second field resistance region, 227 is a second conductivity type first emitter contact.

301 is a field oxide dielectric layer, 302 is a pre-metal dielectric layer, 303 is a first gate dielectric layer, 304 is a fifth gate dielectric layer, 305 is a sixth gate dielectric layer, 306 is a first oxygen ions injection layer, 307 is a second gate dielectric layer, 308 is a third gate dielectric layer, 309 is a first dielectric trench, 310 is a second oxygen ions injection layer, 311 is a third oxygen ions injection layer, 312 is a second dielectric trench, 313 is a third dielectric trench, 314 is a fourth dielectric trench, 315 is a fourth oxygen ions injection layer, 316 is a fourth gate dielectric layer, 317 is a fifth dielectric trench.

401 is a first gate terminal, 402 is a fifth gate terminal, 403 is a sixth gate terminal, 404 is a first polysilicon filler, 405 is a second gate terminal, 406 is a third gate terminal, 407 is a second polysilicon filler, 408 is a third polysilicon filler, 409 is a fourth polysilicon filler, 410 is a fourth gate terminal, 411 is a fifth polysilicon filler.

500 is a first emitter or source metal, 501 is a first source metal, 502 is a contact ring metal, 503 is a fourth drain metal, 504 is a fifth source metal, 505 is a first body metal, 506 is a fifth drain metal, 507 is sixth source metal, 508 is a second body metal, 509 is a first base metal, 510 is a first emitter metal, 511 is a first collector metal, 512 is a second emitter metal, 513 is a second base metal, 514 is a second collector metal, 515 is an anode metal, 516 is a first cathode metal, 517 is a second source metal, 518 is a first drain metal, 519 is a third source metal, 520 is a second drain metal, 521 is a fourth source metal, 522 is a third drain metal, 523 is a metal field plate, 524 is a seventh source metal, 525 is a cutoff ring metal, 526 is a cutoff ring metal.

DETAILED DESCRIPTION OF THE EMBODIMENTS

The implementations of the present invention are described hereinafter through specific embodiments. It is easy to understand other advantages and effects of the present invention by those skilled in the art according to the disclosure of the specification. The present invention may also be implemented or applied through other different specific embodiments, and various details in the specification may be modified or changed without departing from the spirit of the present invention based on different aspects and applications.

Embodiment 1

As shown in FIG. 1, an integrated power semiconductor device, includes devices integrated on a single chip; the devices include a vertical high voltage device 1, a first high voltage pLDMOS device 2, a high voltage nLDMOS device 3, a second high voltage pLDMOS device 4, a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices; a multi-channel design is applied to the first high voltage pLDMOS device 2, and the high voltage nLDMOS device 3; a single channel design is applied to the second high voltage pLDMOS device 4;

The vertical high voltage device 1 include a substrate 000, a second conductivity type epitaxial layer 201 located on the substrate 000, a closely connected cell region $C_n$ located in the second conductivity type epitaxial layer 201, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, and a first conductivity type field limiting ring 101 arranged at equal intervals below the field oxide dielectric layer 301; the cell region $C_n$ further includes a first conductivity type first body region 103 located in both sides of the cell region, a second conductivity type first emitter or source contact 200 and a first conductivity type first emitter or source contact 100, wherein the second conductivity type first emitter or source contact 200 and the first conductivity type first emitter or source contact 100 are located in the first conductivity type first body region 103 and adjacent to each other, a first emitter or source metal 500 in contact with the second conductivity type first emitter or source contact 200 and the first conductivity type first emitter or source contact 100, a first gate dielectric layer 303 located on an upper surface of the cell region $C_n$, and a first gate terminal 401 located on an upper surface of the first gate dielectric layer 303;

The first high voltage pLDMOS device 2 is located in an isolation region formed by a second dielectric trench 312 and a second oxygen ions injection layer 310, the second oxygen ions injection layer 310 is connected with the second dielectric trench 312 to form the isolation area, a second polysilicon filler 407 is located in the second dielectric trench 312; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in one side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in an isolation region formed by a third dielectric trench 313 and a third oxygen ions injection layer 311, the third oxygen ions injection layer 311 is connected with the third dielectric trench 313 to form the isolation area, a third polysilicon filler 408 is located in the third dielectric trench 313; the high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in one side of the second conductivity type drift region 219, a second conductivity type first field resistance region 217 located in the other side of second conductivity type drift region 219, a second conductivity type third source contact 215 located in both sides of the first conductivity type second body region 121 and in contact with a third source metal 519, a first conductivity type third source contact 120 between the second conductivity type third source contacts 215 and in contact with a third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in an isolation region formed by a fourth dielectric trench 314 and a fourth oxygen ions injection layer 315, the fourth oxygen ions injection layer 315 is connected with the fourth dielectric trench 314 to form the isolation area, a fourth polysilicon filler 409 is located in the fourth dielectric trench 314; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on a outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type a second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in an isolation region formed by a first dielectric trench 309 and a first oxygen ions injection layer 306, the first oxygen ions injection layer 306 is connected with the first dielectric trench 309 to form the isolation area, and a first polysilicon filler 404 is located in the first dielectric trench 309;

The low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, a second conductivity type body contact 206 located on a side of the first conductivity type fifth source contact 108 away from the sixth gate terminal 403, and a second body metal 508 in contact with the second conductivity type body contact 206;

The low voltage NPN device 7 includes a second conductivity type second well region 208 located in a first conductivity type first deep well region 115, a second conductivity type collector contact 209 located in one side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212;

The second oxygen ions injection layer 310, the third oxygen ions injection layer 311, the fourth oxygen ions injection layer 315, and the first oxygen ions injection layer 306 are located in the second conductivity type epitaxial layer 201;

The substrate 000 is a first conductivity type substrate 102 or a second conductivity type substrate 218.

Embodiment 2

Figure 2:
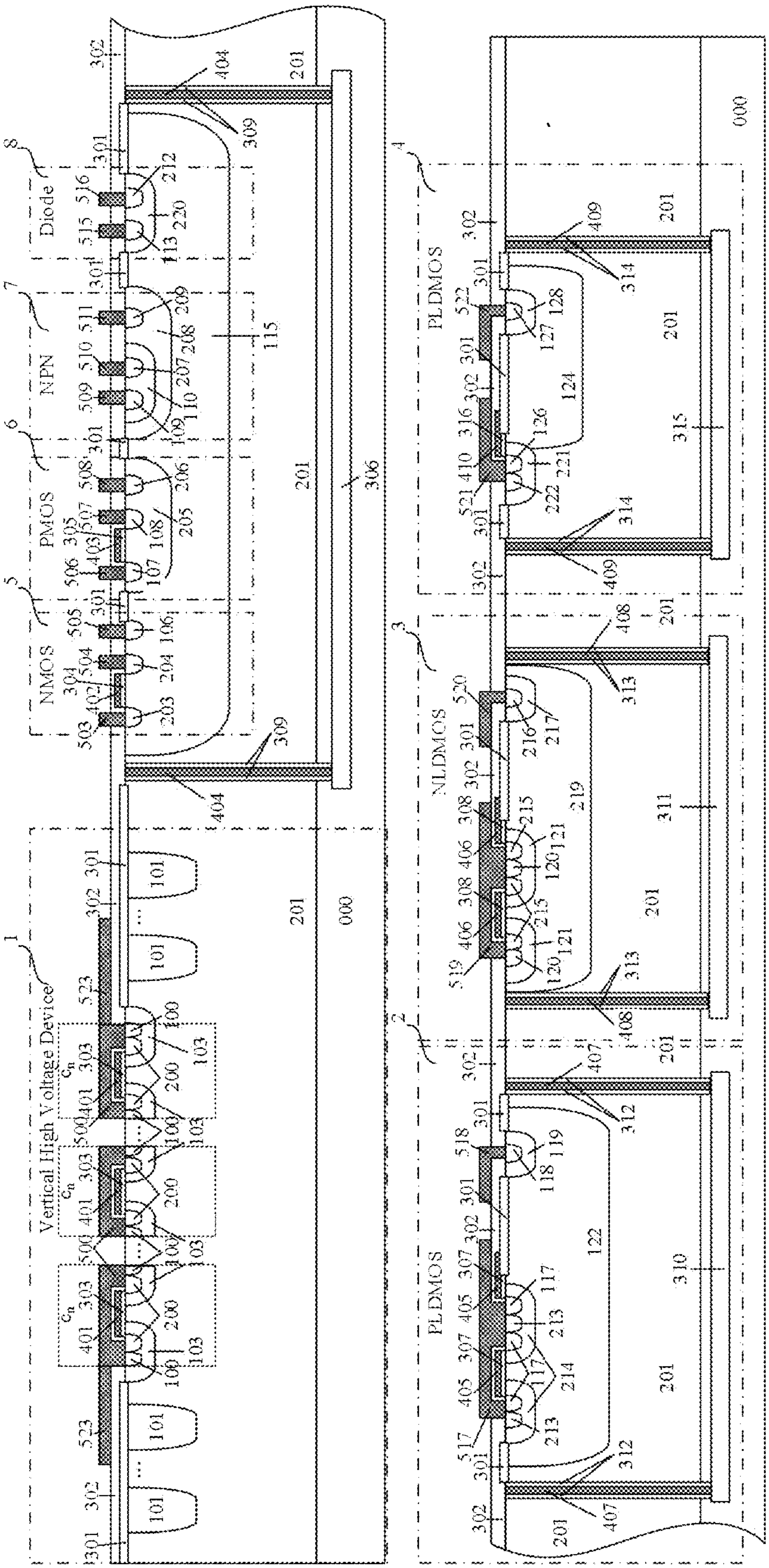
FIG. 2 is a structural schematic diagram of an integrated power semiconductor device according to Embodiment 2 of the present invention.

As shown in FIG. 2, the difference between this embodiment and the embodiment 1 is that the first oxygen ions injection layer 306, the second oxygen ions injection layer 310, the third oxygen ions injection layer 311, and the fourth oxygen ions injection layer 315 are located in the substrate 000.

Figure 17:
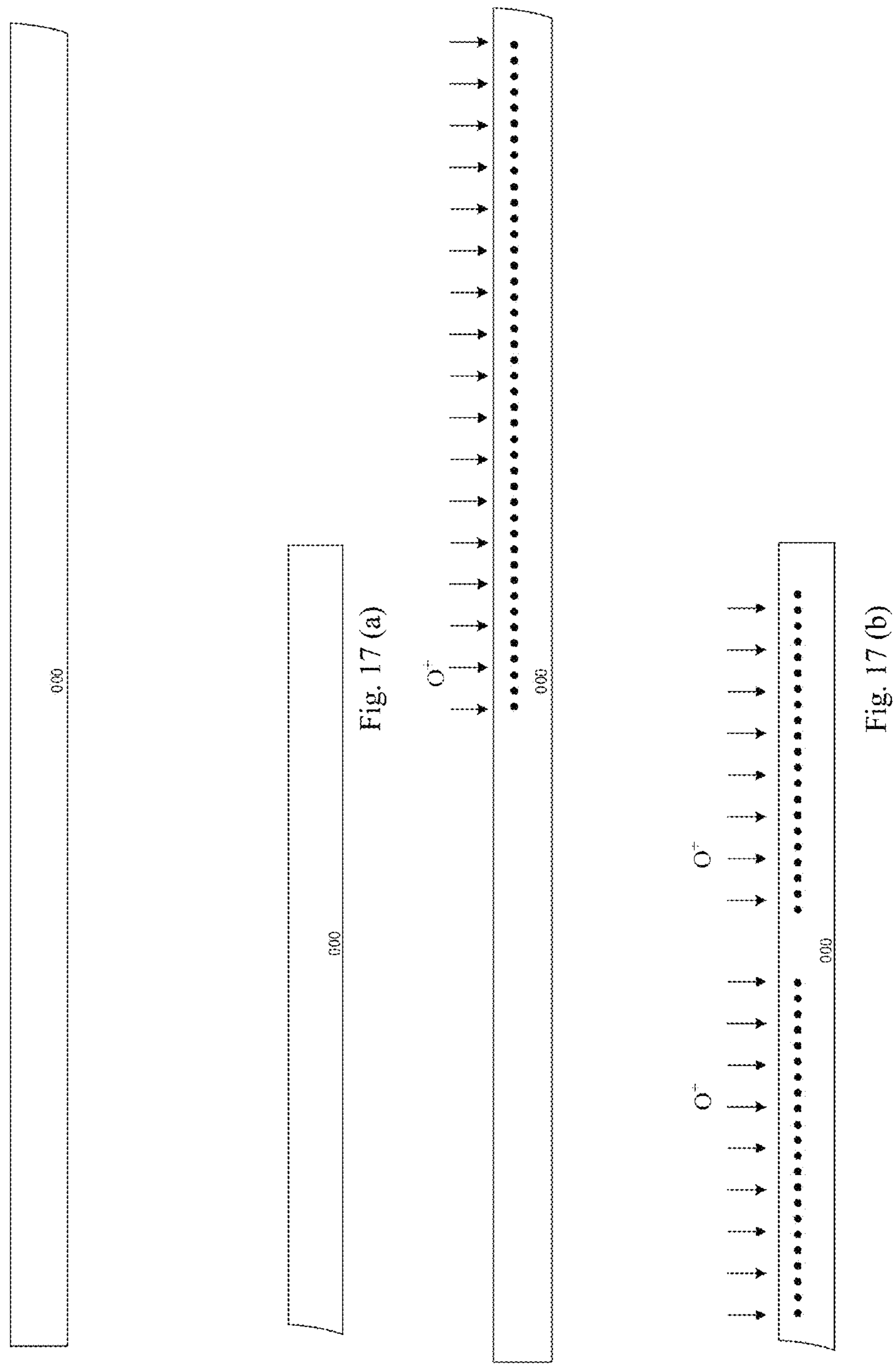
FIGS. 17 (*a*)-(*k*) show process flow diagrams of an integrated power semiconductor of Embodiment 2 of the present invention.
Figure 17:
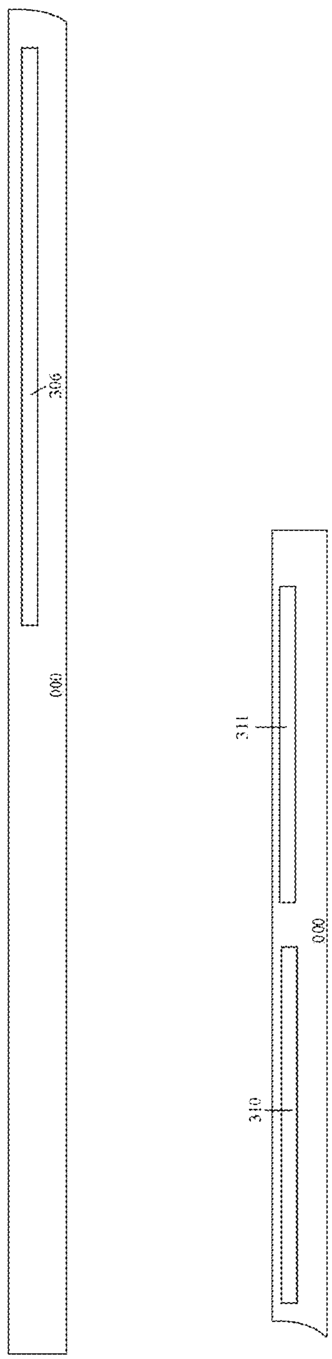
Figure 17:
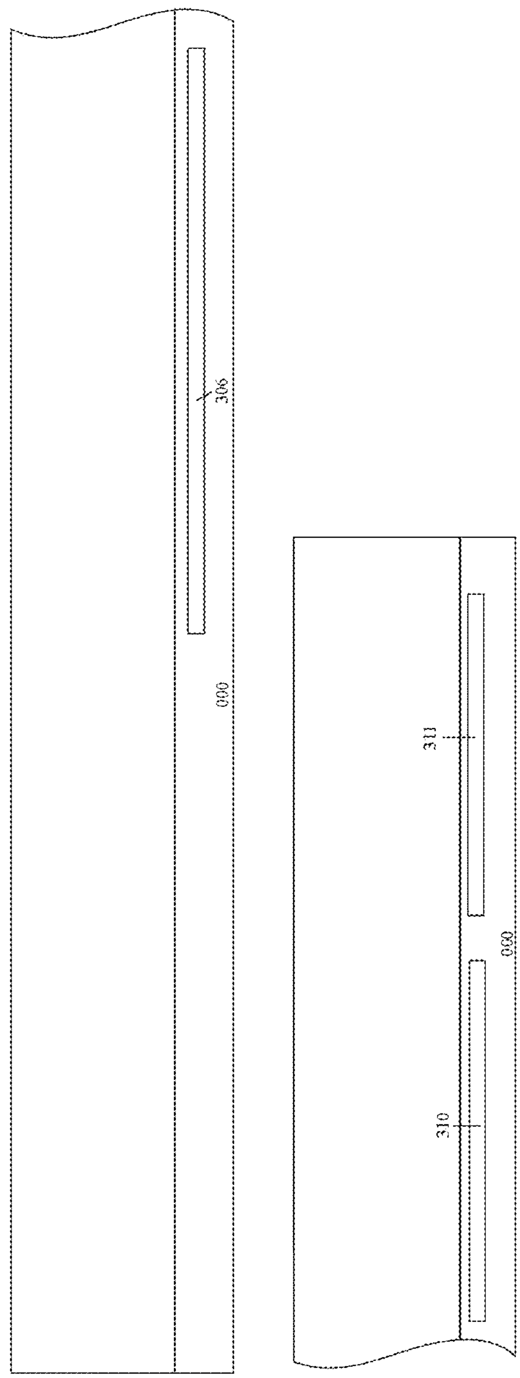
Figure 17:
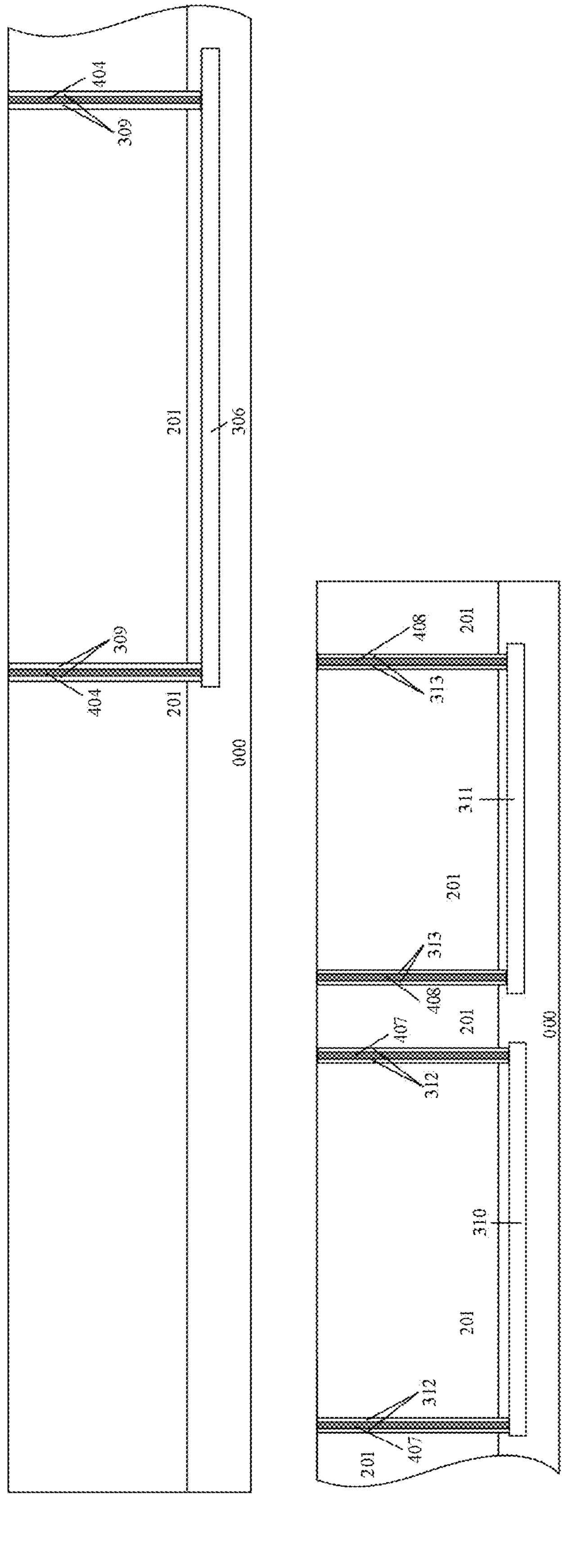
Figure 17:
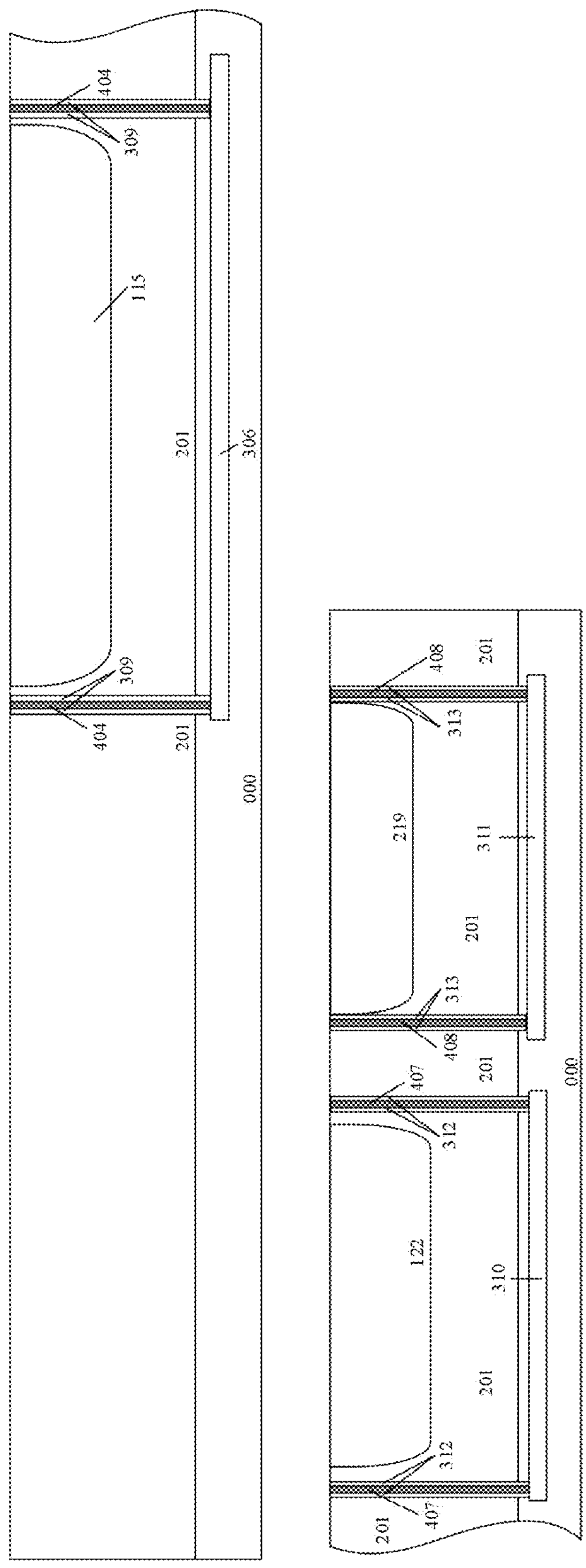
Figure 17:
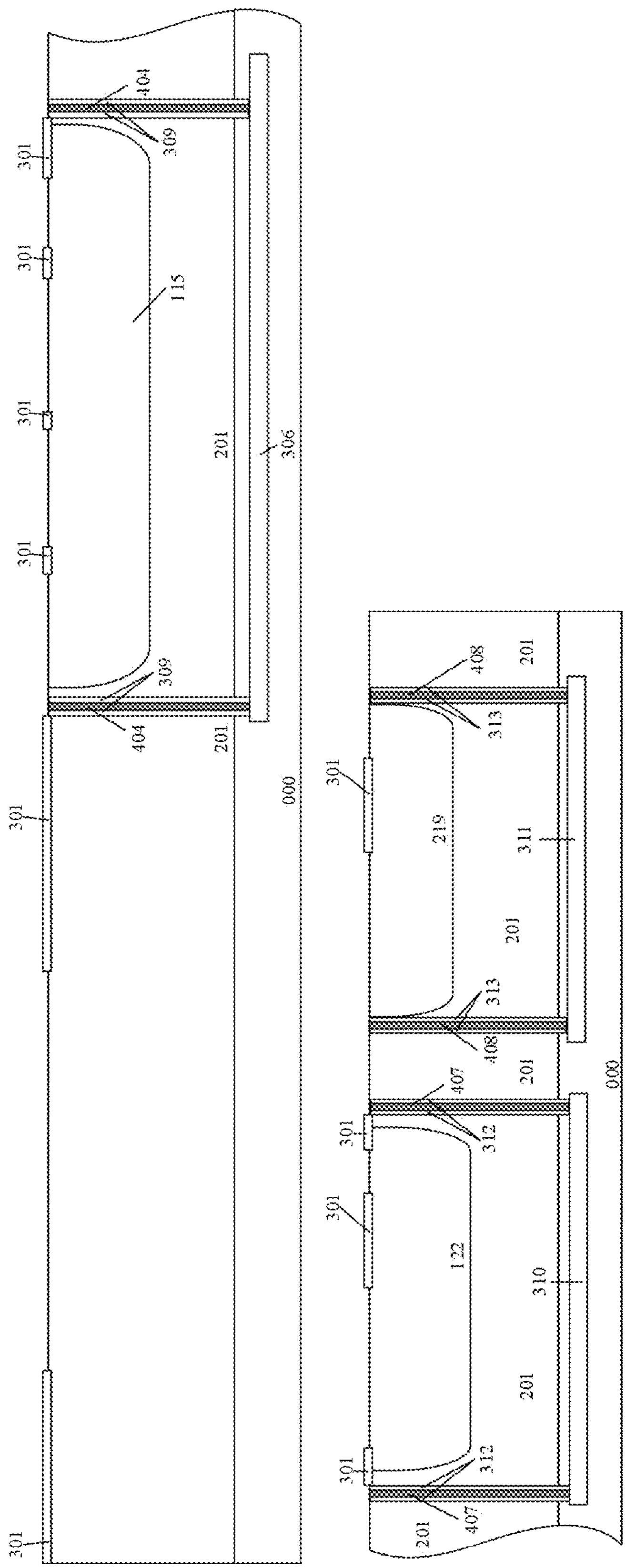
Figure 17:
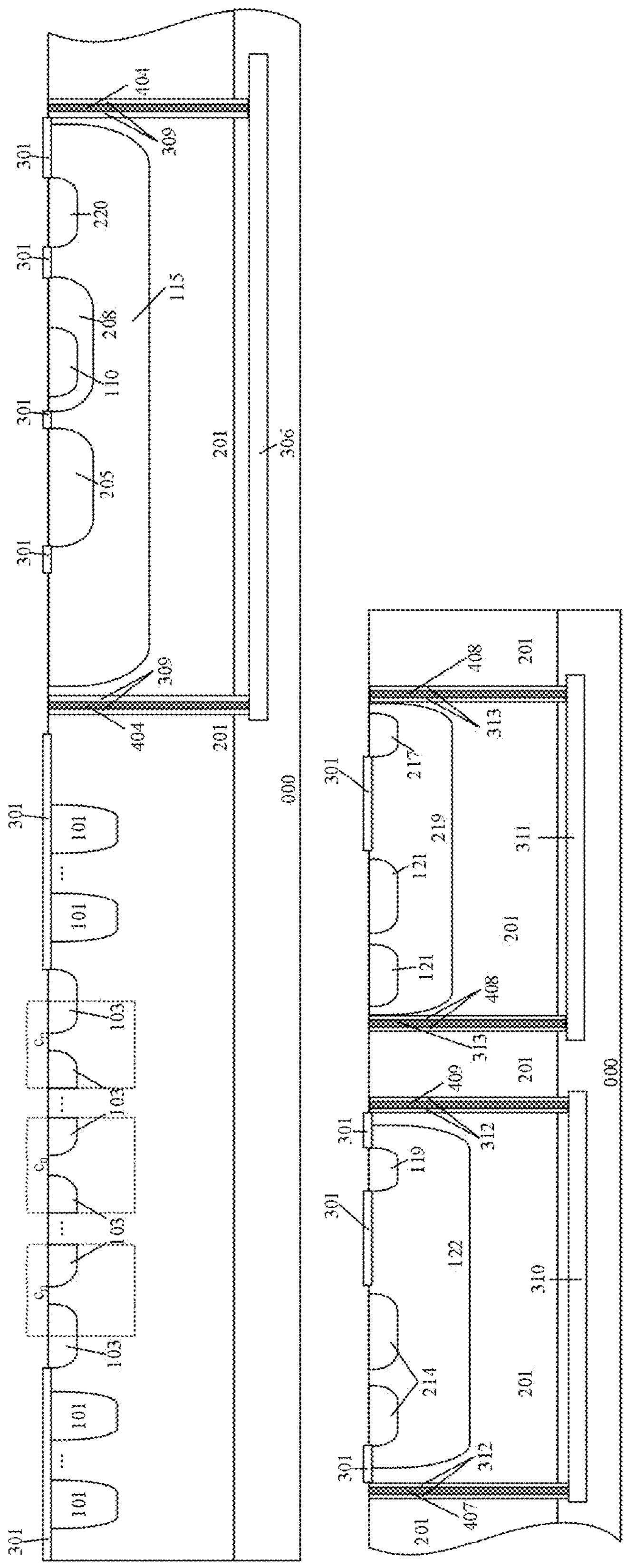
Figure 17:
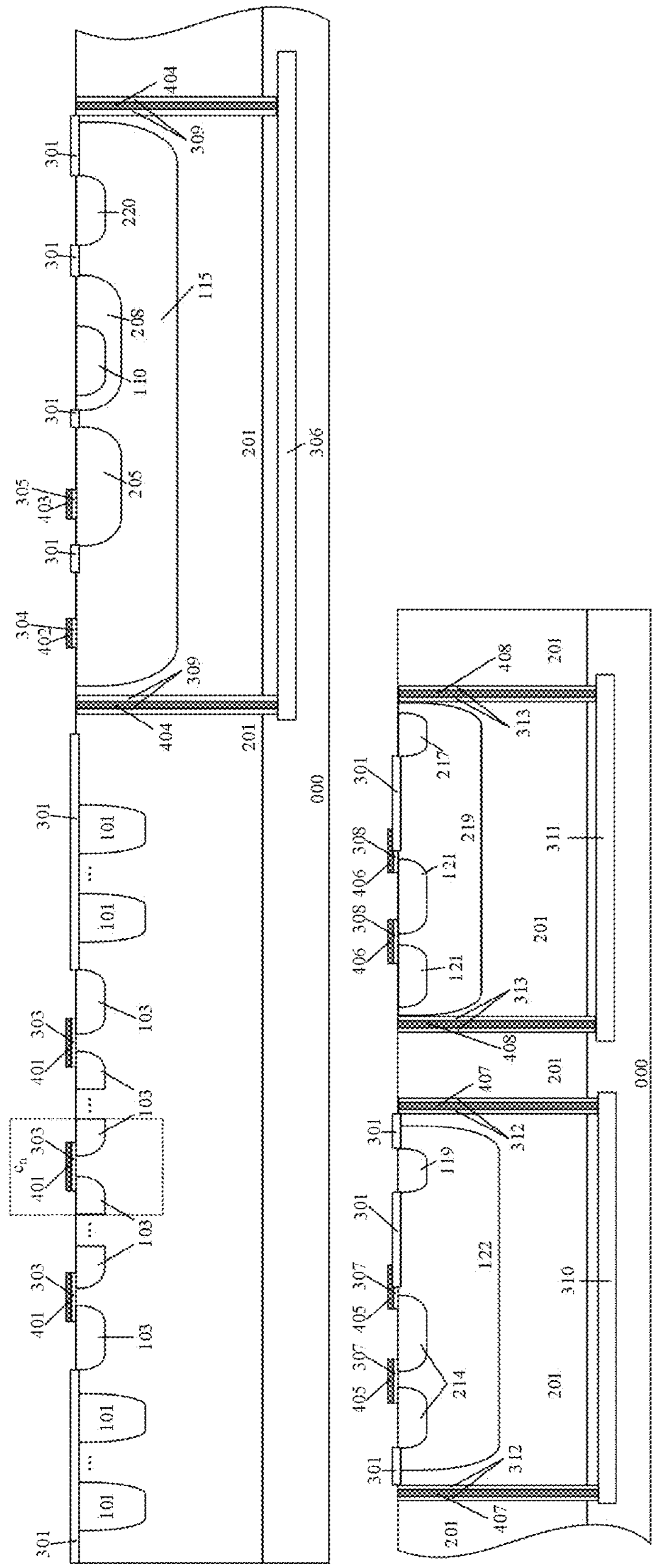
Figure 17:
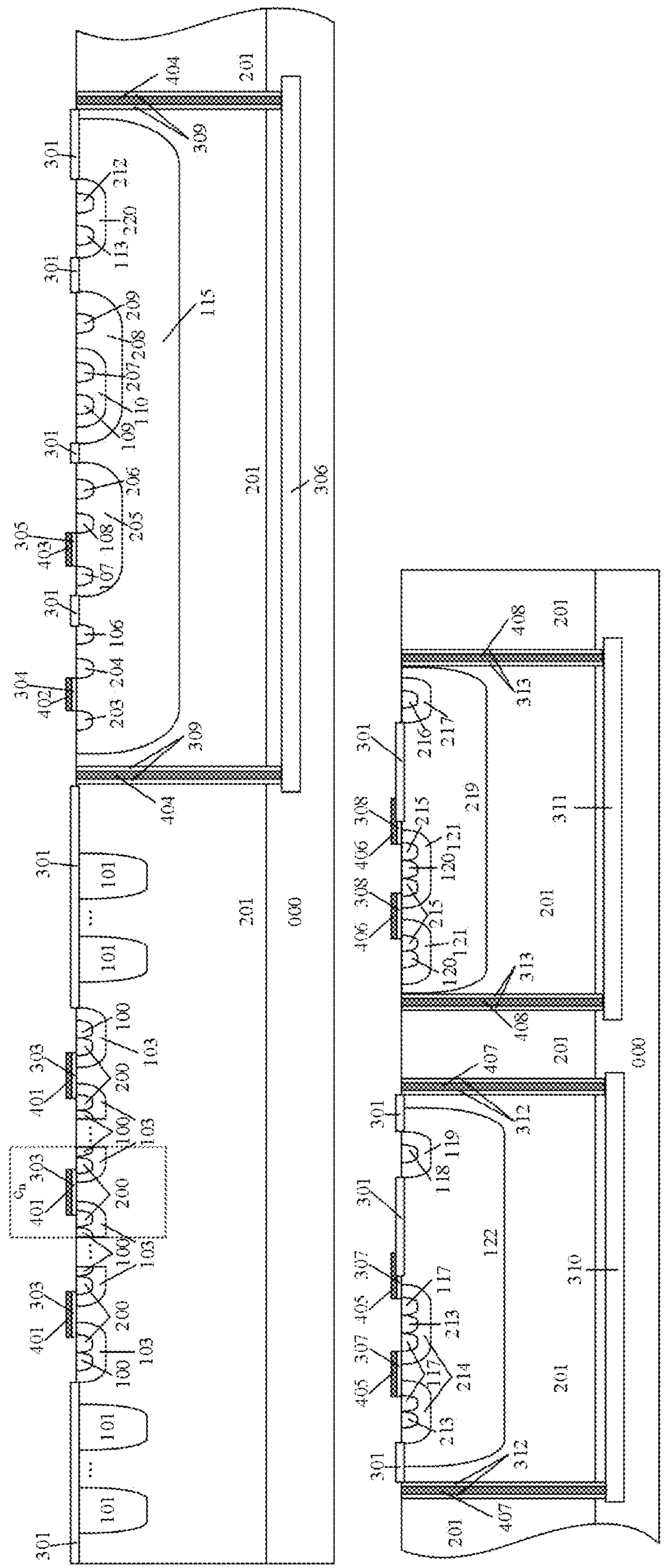
Figure 17:
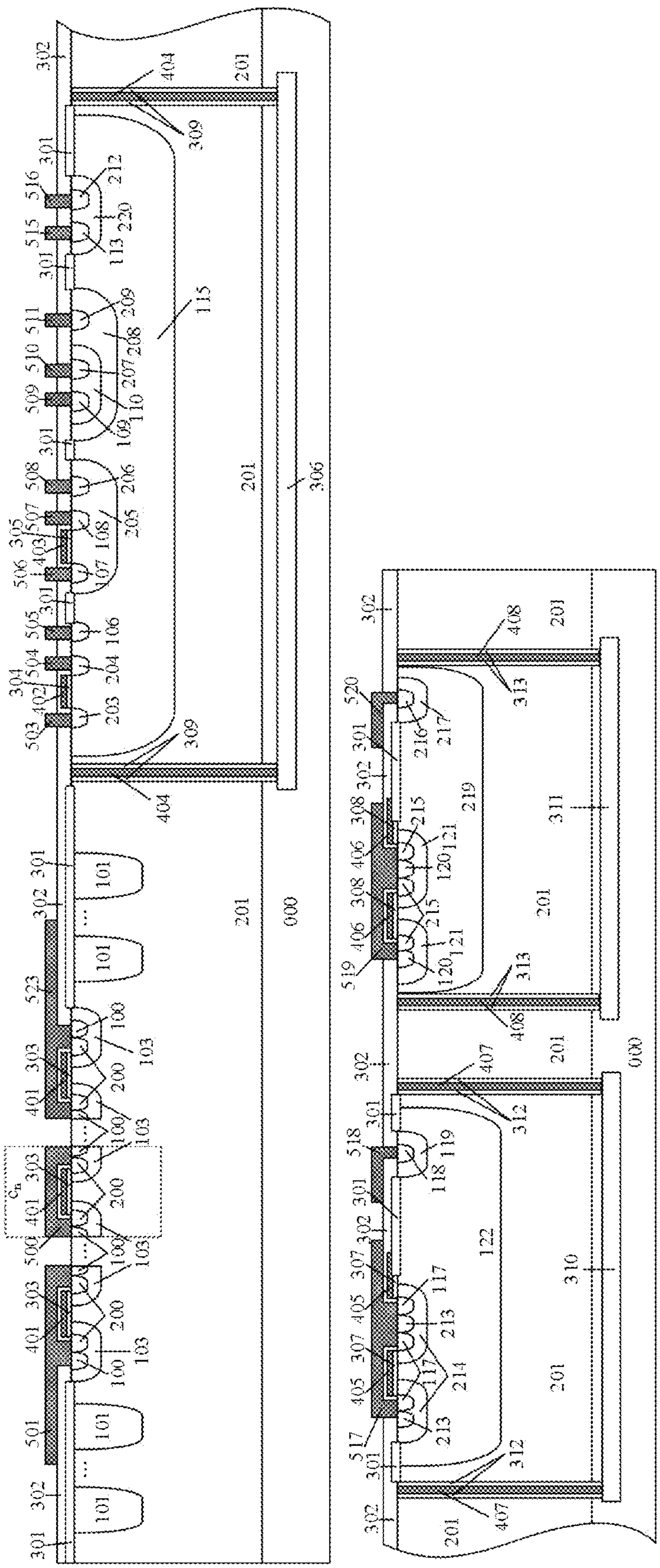

As shown in FIGS. 17 (*a*)-(*k*), the manufacturing method of the integrated power semiconductor device of this embodiment includes the following steps:

Step 1, use a substrate 000.

Step 2, oxygen ions with a predetermined amount is implanted into a substrate 000 through a photolithography technique and an ion implantation technique.

Step 3, an annealing treatment is performed to form a first oxygen ions injection layer 306, a second oxygen ions injection layer 310, a third oxygen ions injection layer 311.

Step 4, an epitaxy is performed to form a second conductivity type epitaxial layer 201

Step 5, a dielectric trench is formed through a deep trench etching process, an oxide layer is thermally grown on the side wall of the trench, a polysilicon is deposited to fill remaining gaps in the dielectric trench.

Step 6, a first conductivity type first deep well region 115, a first conductivity type first drift region 122, and a second conductivity type drift 219 are formed in the second conductivity type epitaxial layer 201 through a photolithography technique, an ion implantation technique, Ion Implantation technique and an annealing technique.

Step 7, an oxide layer is thermally grown on an upper surface of the second conductivity type epitaxial layer 201, field oxide dielectric layer 301 is formed.

Step 8, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type first field resistance region 119, a first conductivity type second body region 121, a second conductivity type first field resistance region 217.

Step 9, an oxide layer is thermally grown on the upper surface of the second conductivity type epitaxial layer 201 to form a gate dielectric layer, polysilicon is deposited, and gate terminal is formed by through a photolithography technique.

Step 10, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 11, a pre-metal dielectric layer 302 is deposited, and a metal layer is deposited after punching.

Embodiment 3

Figure 3:
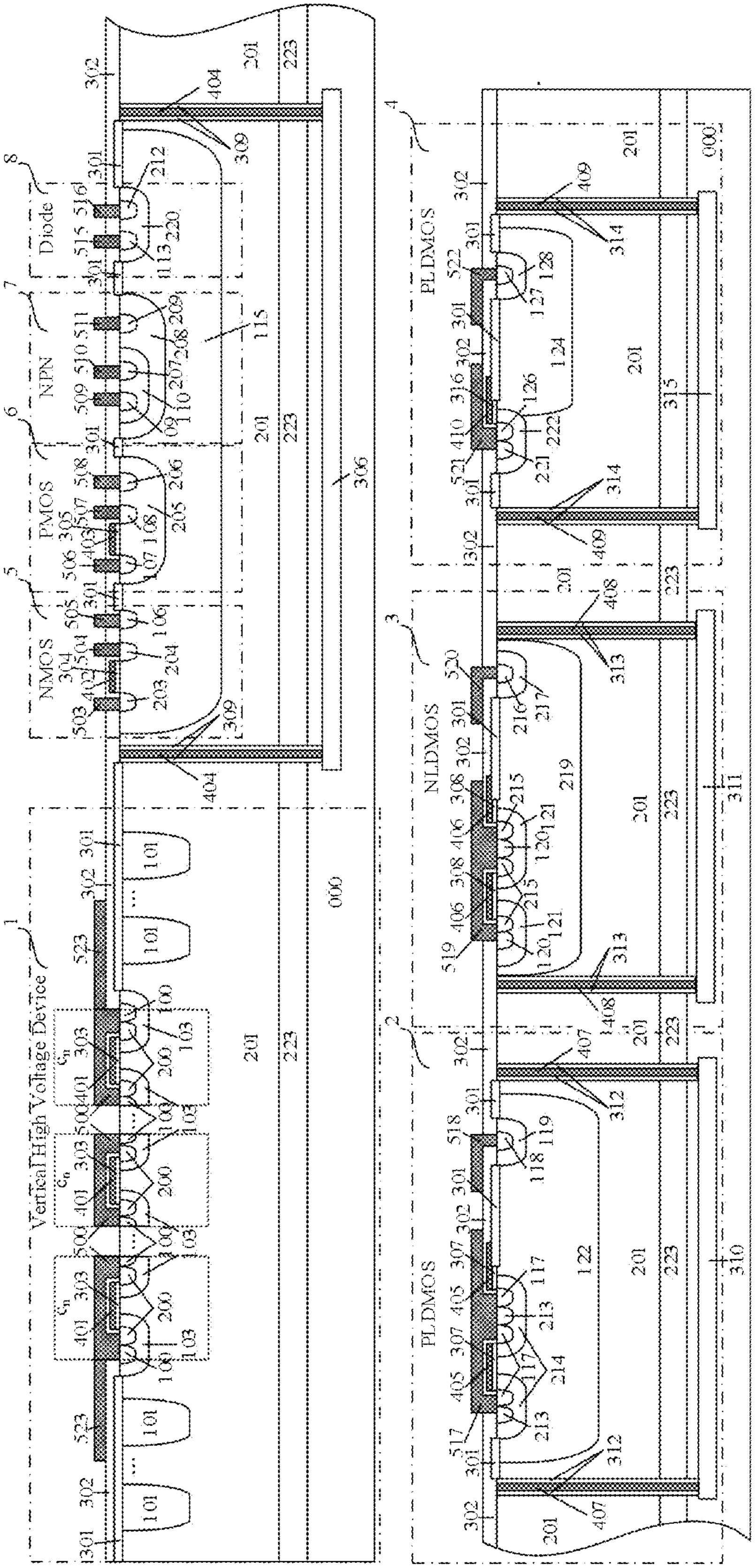
FIG. 3 is a structural schematic diagram of an integrated power semiconductor device according to Embodiment 3 of the present invention.

As shown in FIG. 3, the difference between this embodiment and the embodiment 2 is that a second conductivity type field resistance layer 223 is inserted between the substrate 000 and the second conductivity type epitaxial layer 201 in the vertical high voltage device 1.

Embodiment 4

Figure 4:
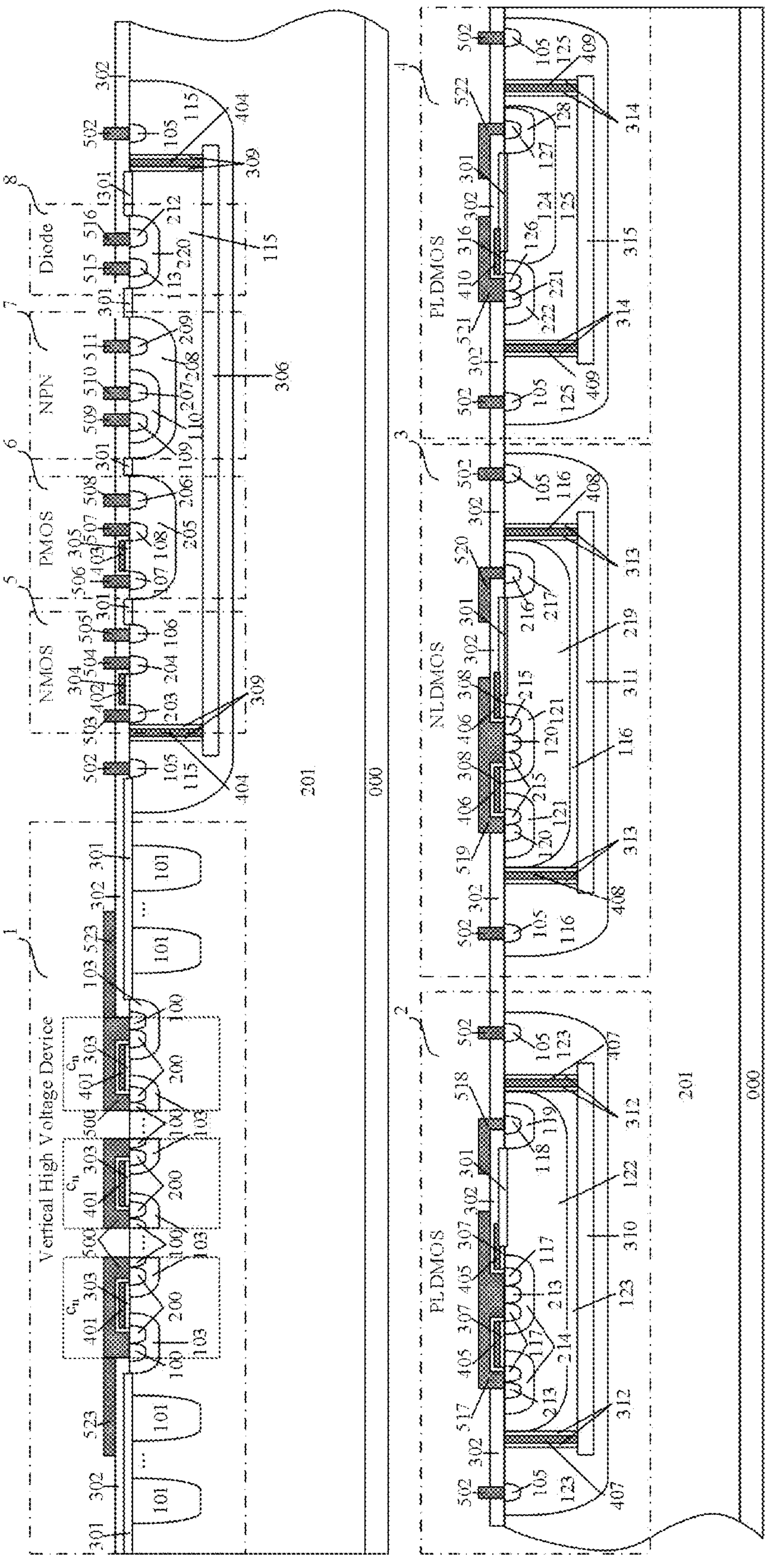
FIG. 4 is a structural schematic diagram of an integrated power semiconductor device according to Embodiment 4 of the present invention.

As shown in FIG. 4, the difference between this embodiment and the embodiment 1 is that the first conductivity type first deep well region 115 is located in an isolation region formed by the first dielectric trench 309 and the first oxygen ions injection layer 306, or the first conductivity type first deep well region 115 is located outside the isolation region formed by the first dielectric trench 309 and the first oxygen ions injection layer 306, and a first conductivity type contact ring 105 is located in the edge of first conductivity type the first deep well region 115 and is in contact with a contact ring metal 502;

The first high voltage pLDMOS device 2 is located in a first conductivity type second deep well region 123, the first conductivity type second deep well region 123 is located outside an isolation region formed by the second dielectric trench 312 and the second oxygen ions injection layer 310, and a first conductivity type contact ring 105 is located inside the edge of the first conductivity type second deep well region 123 and is in contact with a contact ring metal 502;

The high voltage nLDMOS device 3 is located in a first conductivity type third deep well region 116, the first conductivity type third deep well region 116 is located outside an isolation region formed by the third dielectric trench 313 and the third oxygen ions injection layer 311, and a first conductivity type contact ring 105 is located inside the edge of the first conductivity type third deep well region 116 and is in contact with a contact ring metal 502;

The second high voltage pLDMOS device 4 is located in a first conductivity type fourth deep well region 125, the first conductivity type fourth deep well region 125 is located outside an isolation region formed by the fourth dielectric trench 314 and the fourth oxygen ions injection layer 315, and a first conductivity type contact ring 105 is located inside the edge of the first conductivity type fourth deep well region 125 and is in contact with a contact ring metal 502.

Figure 18:
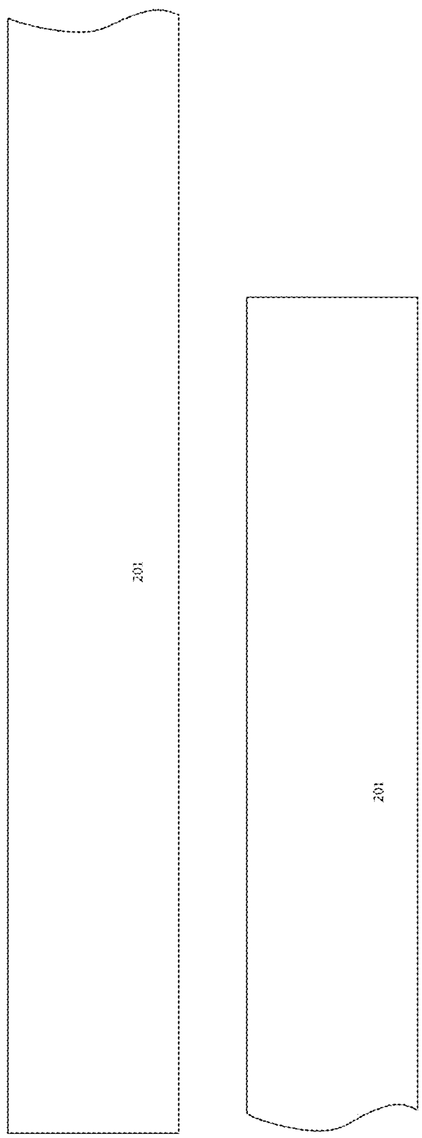
FIGS. 18 (*a*)-(*k*) show process flow diagrams of an integrated power semiconductor of Embodiment 4 of the present invention.
Figure 18:
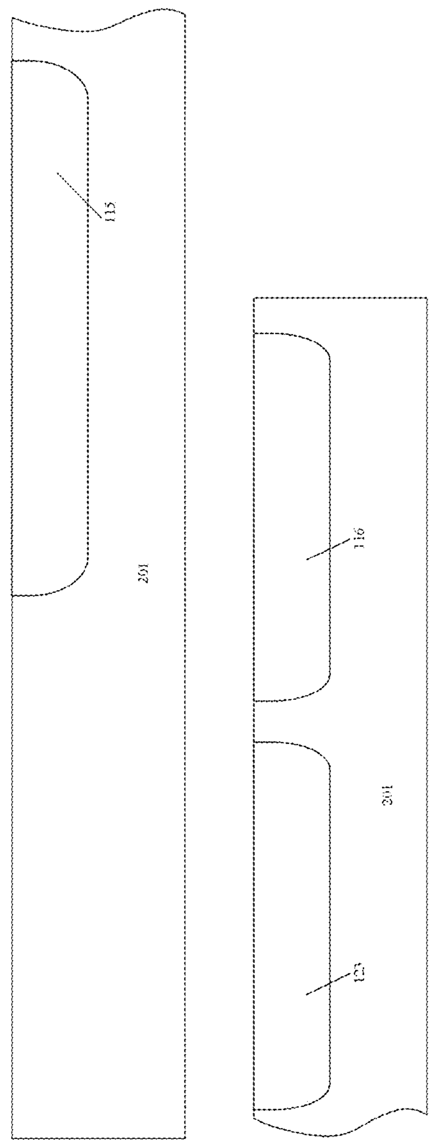
Figure 18:
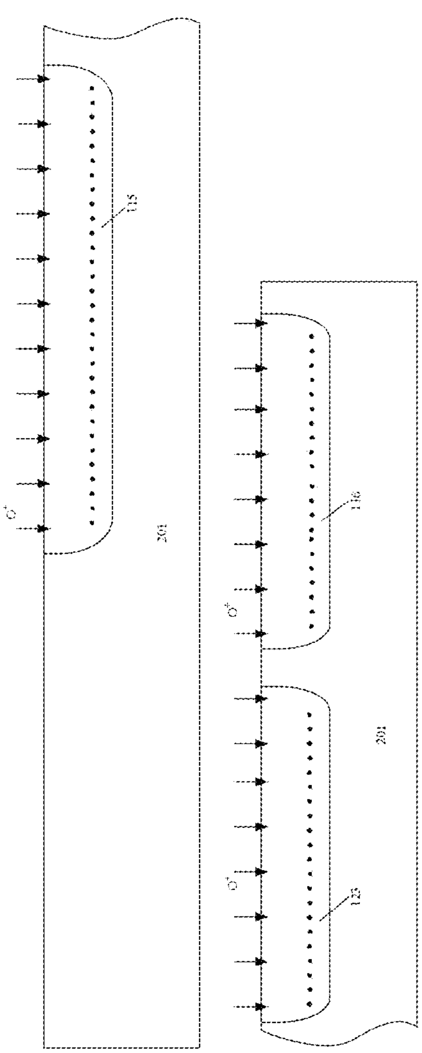
Figure 18:
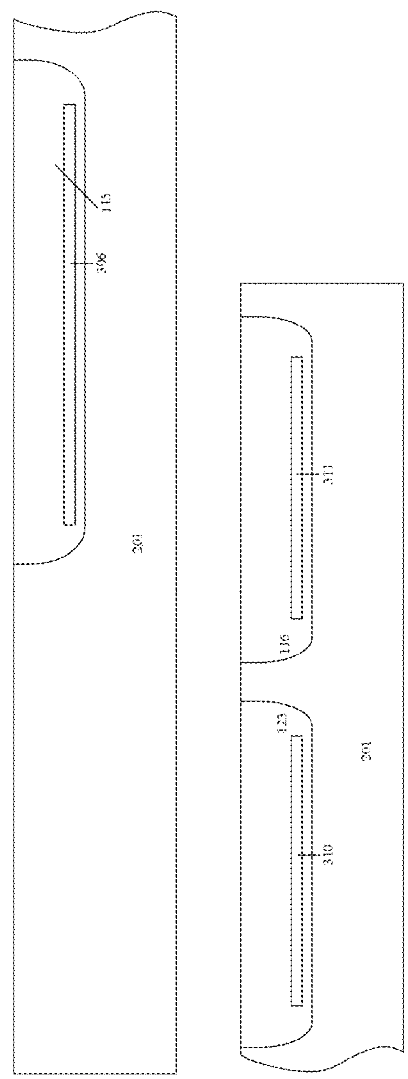
Figure 18:
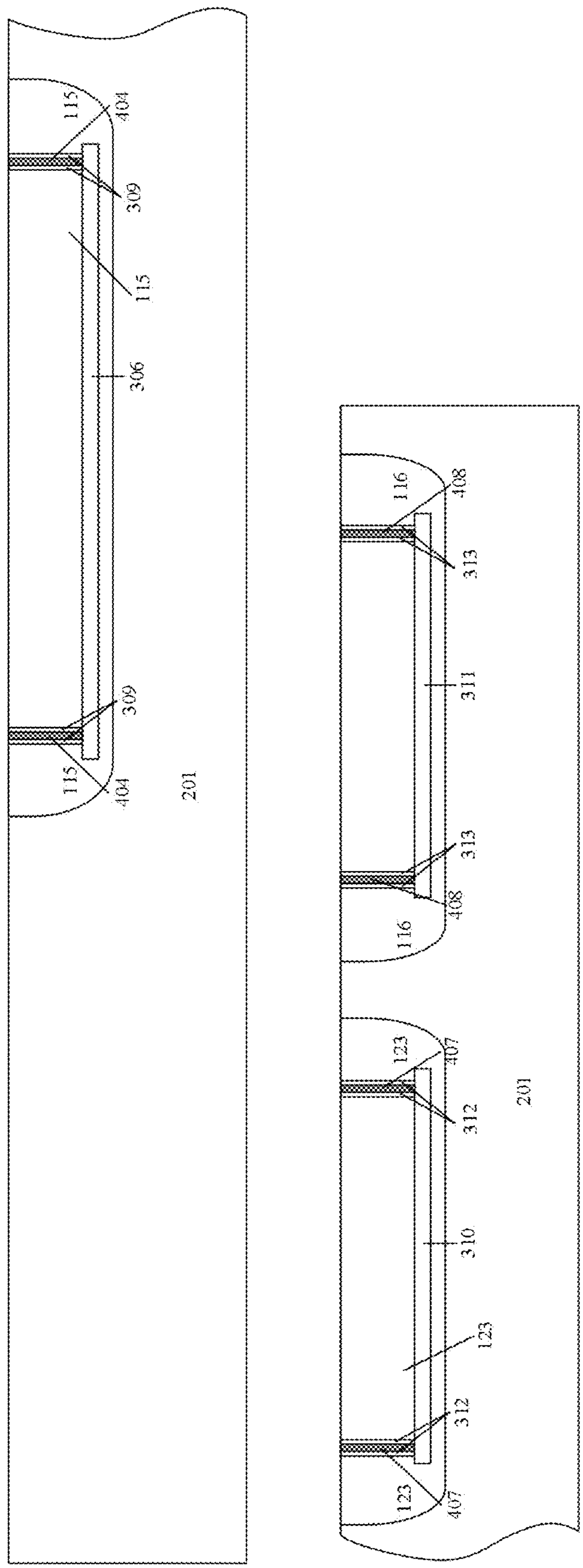
Figure 18:
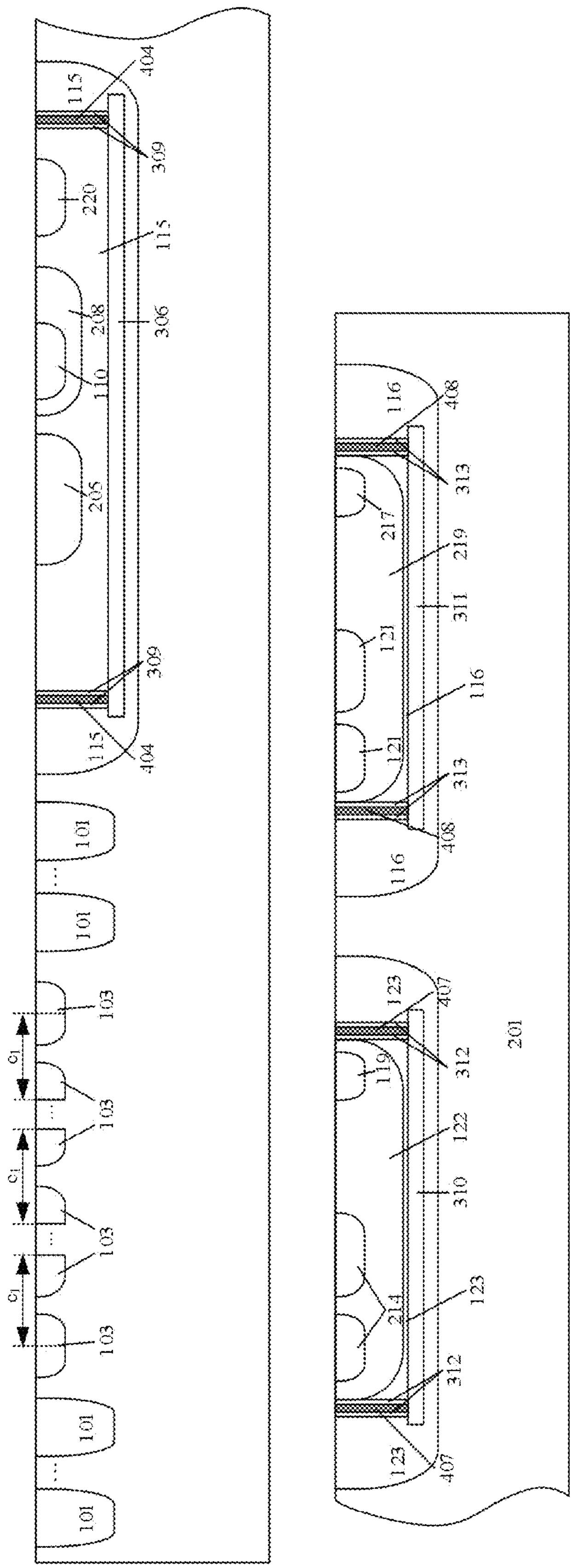
Figure 18:
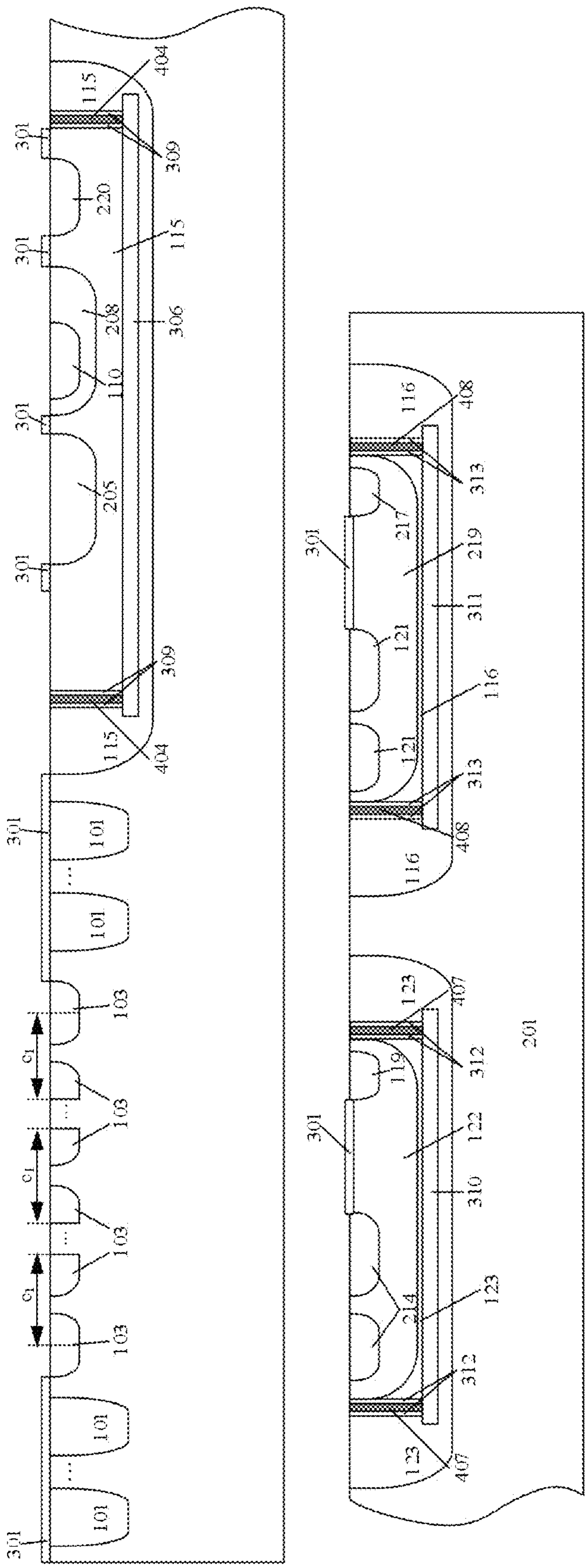
Figure 18:
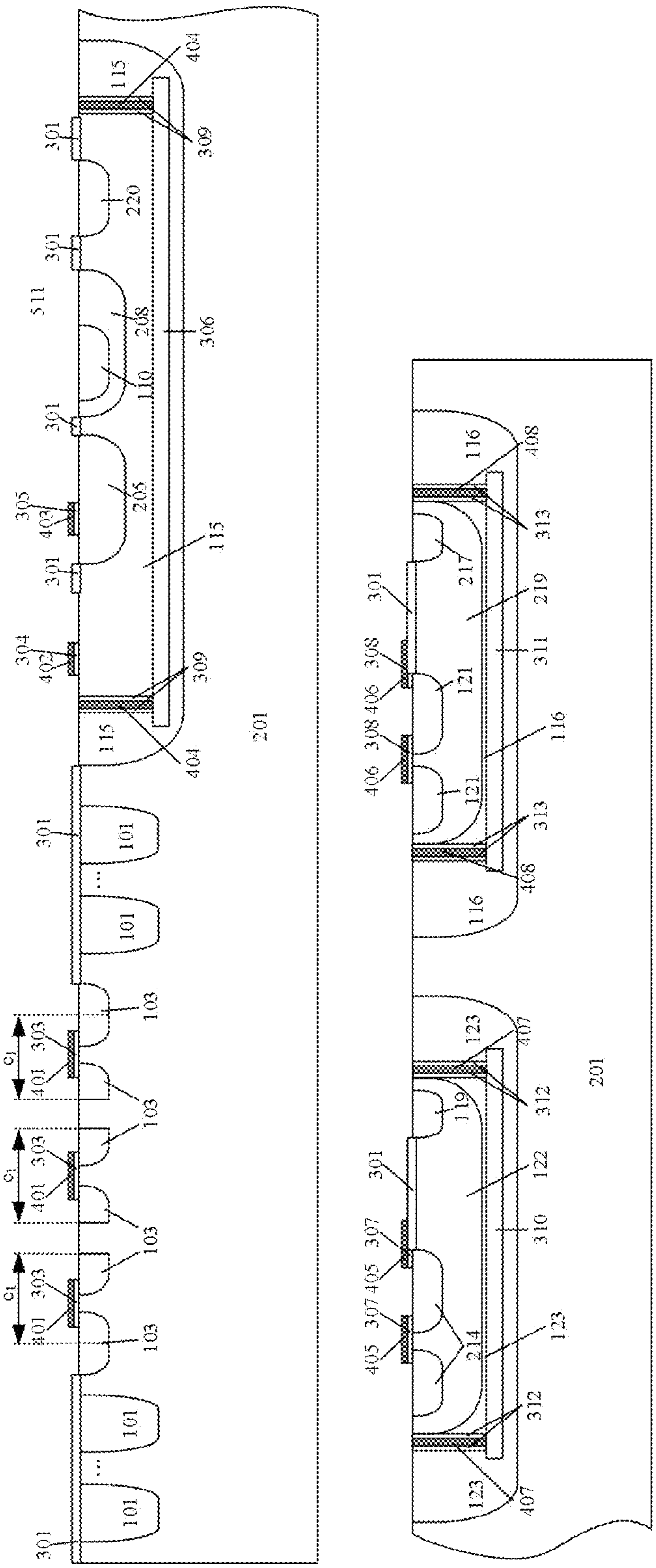
Figure 18:
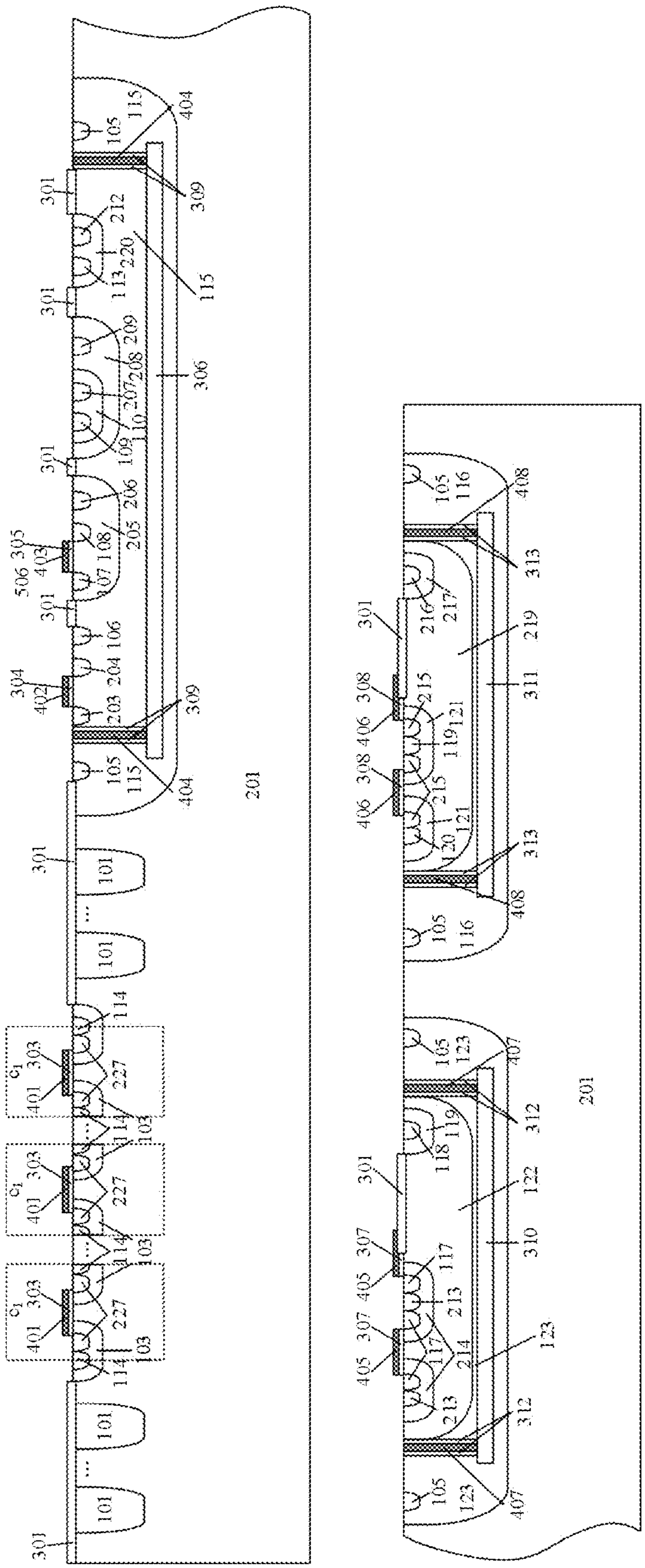
Figure 18:
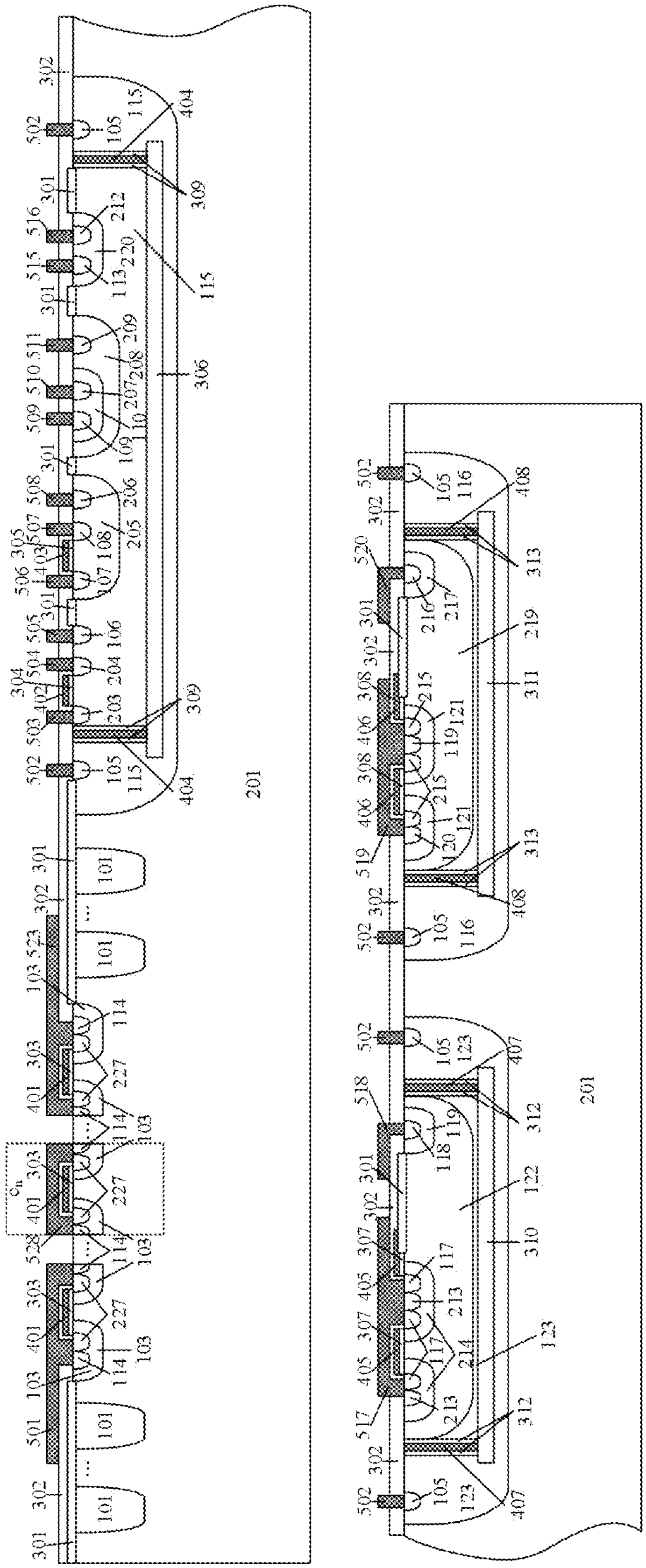
Figure 18:
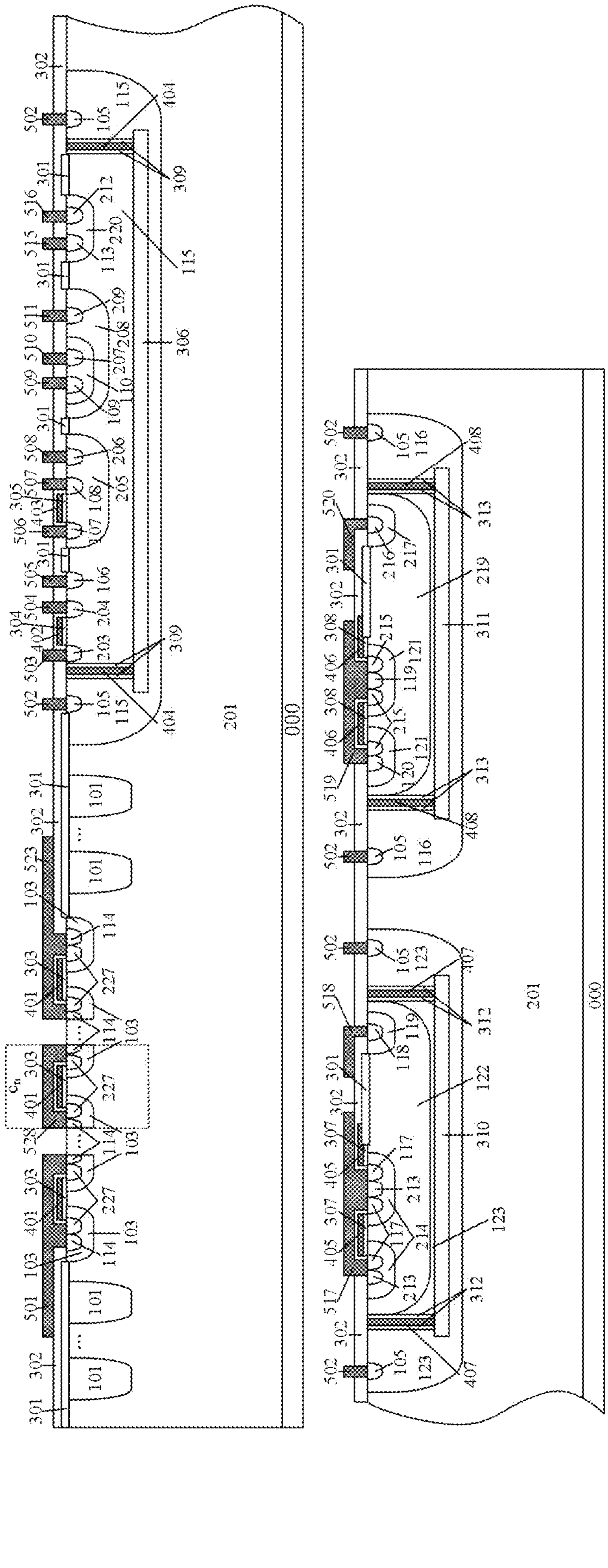

As shown in FIGS. 18 (*a*)-(*k*), the embodiment further provides a method for manufacturing the integrated power semiconductor device, includes the following steps:

Step 1, use a second conductivity type epitaxial layer 201.

Step 2, a first conductivity type first deep well region 115, a first conductivity type second deep well region 123, and a first conductivity type drift first drift region 122 are formed in the second conductivity type epitaxial layer 201 through a photolithography technique, an ion implantation technique, ion Implantation technique and an annealing technique.

Step 3, oxygen ions with a predetermined amount is implanted into the first conductivity type first deep well region 115, the first conductivity type second deep well region 123, and the first conductivity type drift first drift region 122 through a photolithography technique and an ion implantation technique.

Step 4, an annealing treatment is performed to form a first oxygen ions injection layer 306, a second oxygen ions injection layer 310, a third oxygen ions injection layer 311.

Step 5, a dielectric trench is formed through a deep trench etching process, an oxide layer is thermally grown on the side wall of the trench, a polysilicon is deposited to fill remaining gaps in the dielectric trench.

Step 6, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type first field resistance region 119, a first conductivity type second body region 121, a second conductivity type first field resistance region 217.

Step 7, an oxide layer is thermally grown on an upper surface of the second conductivity type epitaxial layer 201, field oxide dielectric layer 301 is formed.

Step 8, an oxide layer is thermally grown on the upper surface of the second conductivity type epitaxial layer 201 to form a gate dielectric layer, polysilicon is deposited, and gate terminal is formed by through a photolithography technique.

Step 9, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 10, a pre-metal dielectric layer 302 is deposited, and a metal layer is deposited after punching.

Step 11, the backside ion implant is performed to form the substrate 000.

Embodiment 5

Figure 5:
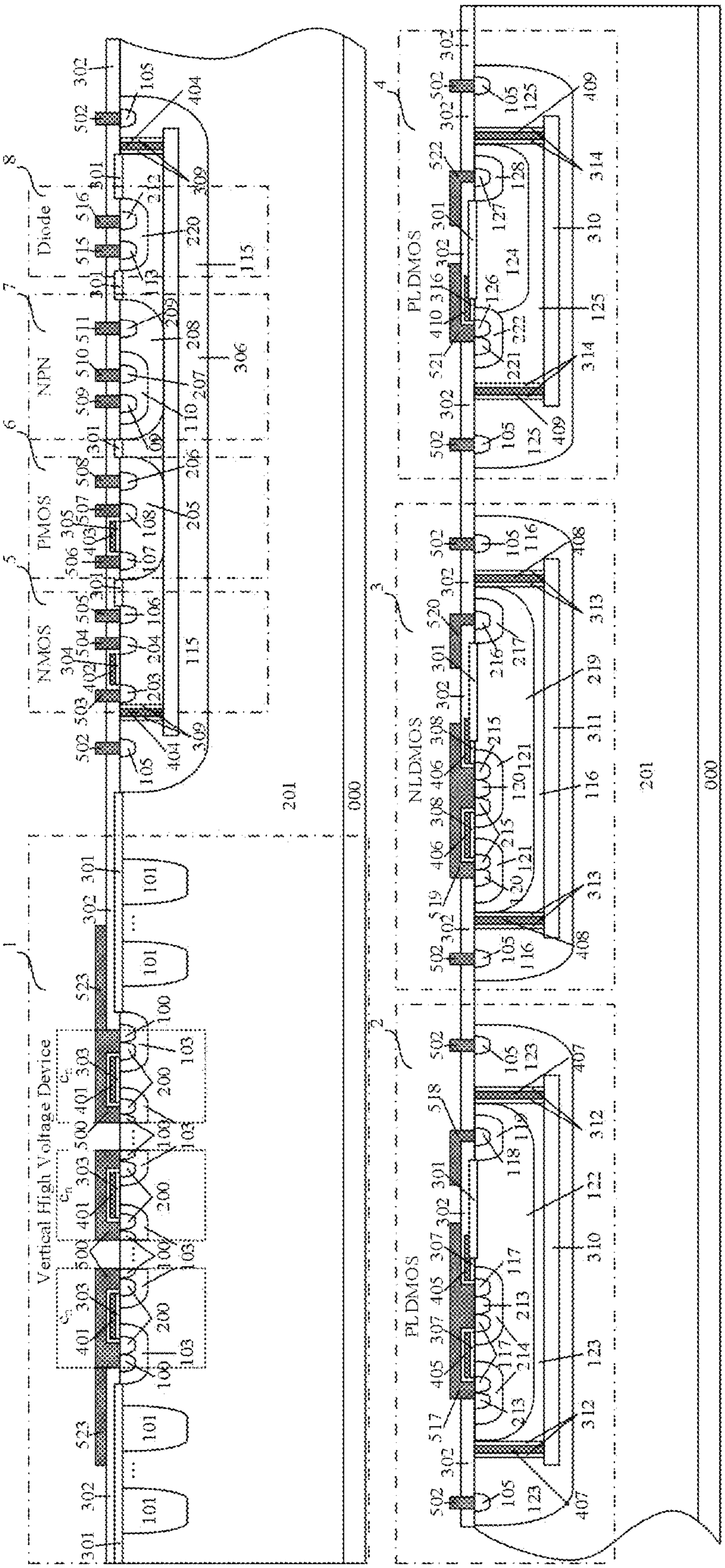
FIG. 5 is a structural schematic diagram of an integrated power semiconductor device according to Embodiment 5 of the present invention.

As shown in FIG. 5, the difference between this embodiment and the embodiment 4 is that the second conductivity type first well region 205 of the low voltage PMOS device 6 and the second conductivity type second well region 208 of the low voltage NPN device 7 are in contact with the first oxygen injection layer 306.

Embodiment 6

Figure 6:
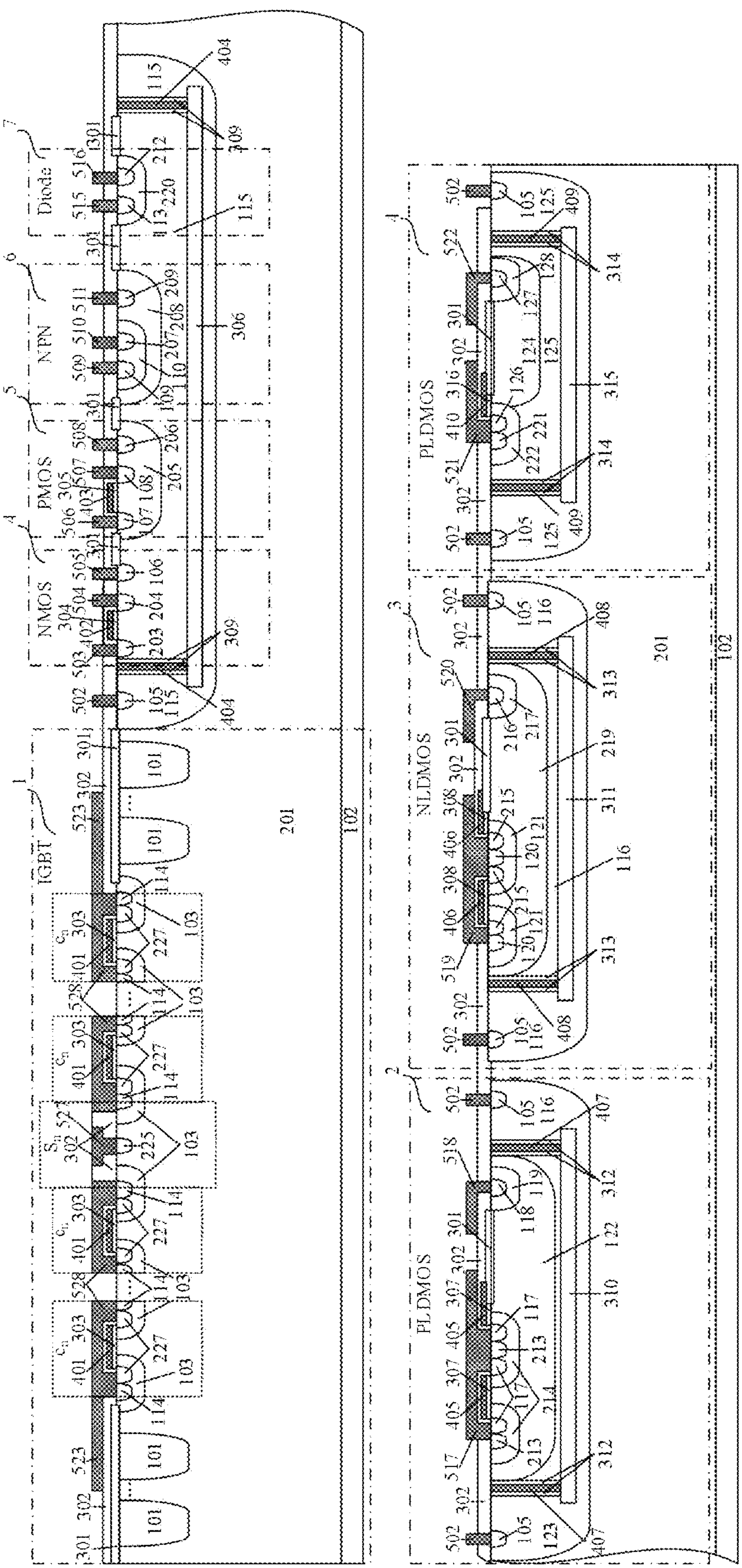
FIG. 6 is a structural schematic diagram of an integrated power semiconductor device according to Embodiment 6 of the present invention.

As shown in FIG. 6, the difference between this embodiment and the embodiment 4 is that the substrate 000 is a first conductivity type substrate 102, the vertical high voltage device 1 is a high voltage IGBT device 1, and the first conductivity type first deep well region 115 is located outside an isolation region formed by the first dielectric trench 309 and the first oxygen ions injection layer 306, and a first conductivity type contact ring 105 is located inside the edge of the f first conductivity type first deep well region 115 and in contact with a contact ring metal 502.

The high voltage IGBT device 1 further includes a Schottky contact cell $S_n$ located between the cell regions $C_n$; the Schottky contact cell $S_n$ includes a first conductivity type first body region 103 located in the second conductivity type epitaxial layer 201, a second conductivity type second cathode contact 225 located between the first conductivity type first body regions 103 and not in contact with the first conductivity type first body region 103, a second cathode metal 527 in contact with the second conductivity type second cathode contact 225, and a pre-metal dielectric layer 302 to isolate the Schottky contact cell $S_n$ and the cell region $C_n$.

Embodiment 7

Figure 7:
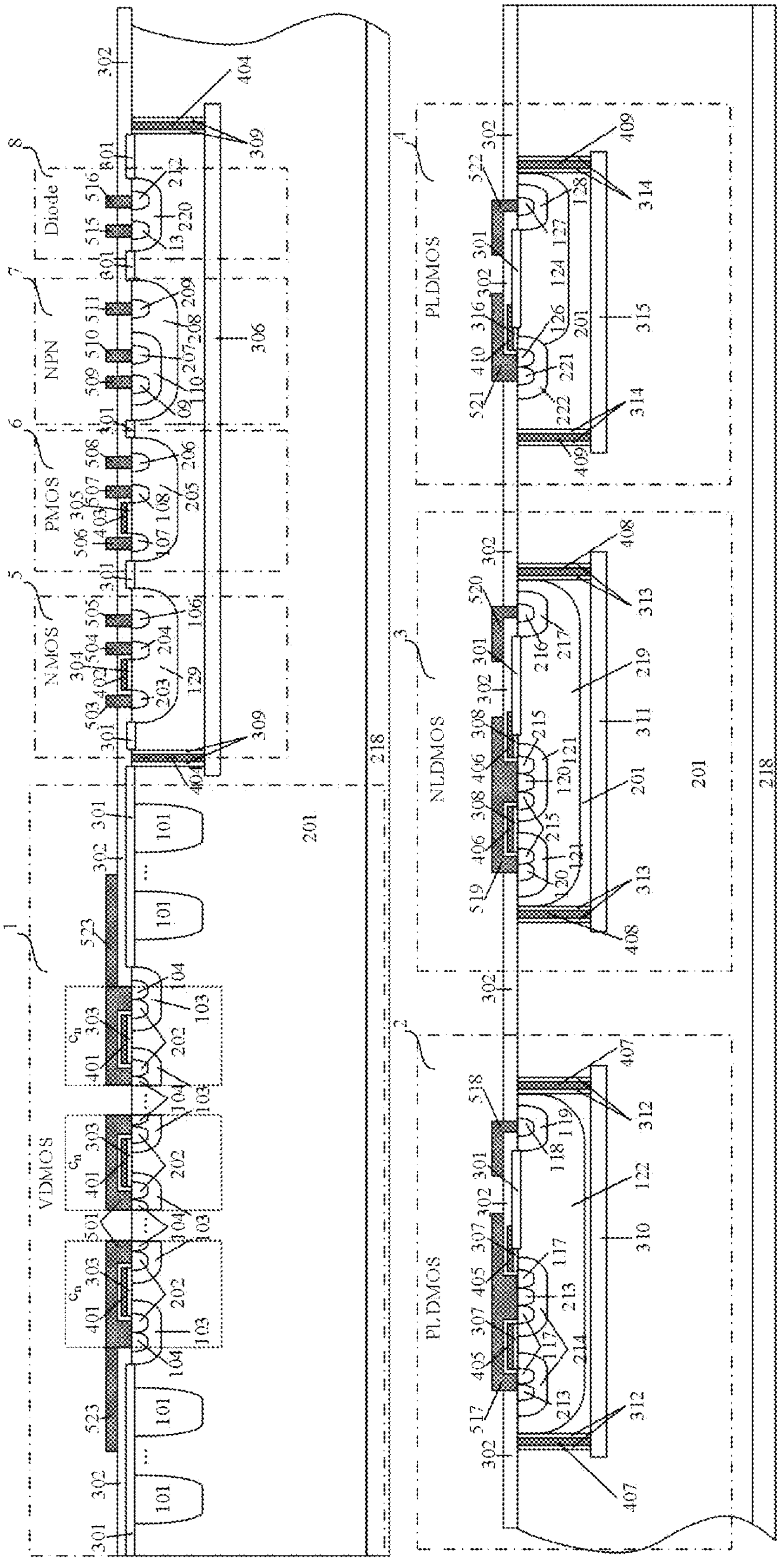
FIG. 7 is a structural schematic diagram of an integrated power semiconductor device according to Embodiment 7 of the present invention.

As shown in FIG. 7, the difference between this embodiment and the embodiment 1 is that the substrate 000 is a second conductivity type substrate 218, the low voltage NMOS device 5 includes a first conductivity type well region 129 located in an isolation region formed by the first dielectric trench 309 and the first oxygen ions injection layer 306, a fifth gate dielectric layer 304 located on an upper surface of first conductivity type well region 129, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type well region 129, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106.

Embodiment 8

Figure 8:
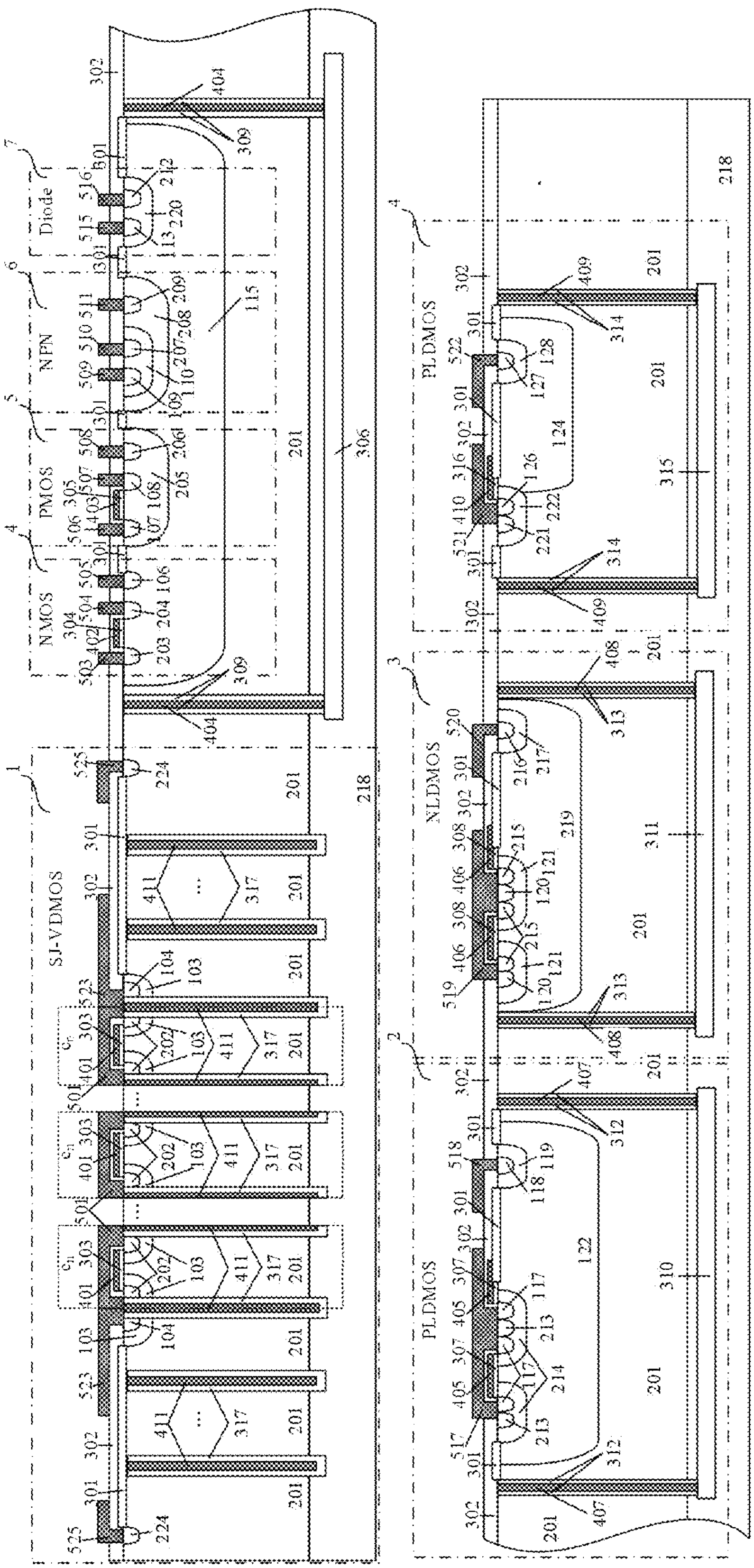
FIG. 8 is a structural schematic diagram of an integrated power semiconductor device according to Embodiment 8 of the present invention.

As shown in FIG. 8, an integrated power semiconductor device of the embodiment includes devices integrated on a single chip; the devices include a high voltage SJ-VDMOS device 1, a first high voltage pLDMOS device 2, a high voltage nLDMOS device 3, a second high voltage pLDMOS device 4, and a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices. A multi-channel design is applied to the first high voltage pLDMOS device 2, and the high voltage nLDMOS device 3; a single channel design is applied to the second high voltage pLDMOS device 4; the first oxygen ions injection layer 306, the second oxygen ions injection layer 310, the third oxygen ions injection layer 311, and the fourth oxygen ions injection layer 315 are located in the second conductivity type substrate 218;

The high voltage SJ-VDMOS device 1 includes a second conductivity type substrate 218, a second conductivity type epitaxial layer 201 located on the second conductivity type substrate 218, a closely connected cell region C located in the second conductivity type epitaxial layer 201, a first conductivity type first body region 103 located outside the outermost cell region $C_n$, a second conductivity type first source contact 104 located in the first conductivity type first body region 103, a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and located in the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the fifth dielectric trenches 317 and located on a surface of the second conductivity type epitaxial layer 201, and a first gate terminal 401 located on an upper surface of the first gate dielectric layer 303;

The first high voltage pLDMOS device 2 is located in an isolation region formed by a second dielectric trench 312 and a second oxygen ions injection layer 310, the second oxygen ions injection layer 310 is connected with the second dielectric trench 312 to form the isolation area, a second polysilicon filler 407 is located in the second dielectric trench 312; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in one side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in an isolation region formed by a third dielectric trench 313 and a third oxygen ions injection layer 311, the third oxygen ions injection layer 311 is connected with the third dielectric trench 313 to form the isolation area, a third polysilicon filler 408 is located in the third dielectric trench 313; the high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in one side of the second conductivity type drift region 219, a second conductivity type first field resistance region 217 located in the other side of the second conductivity type drift region 219, a second conductivity type third source contact 215 located in both sides of the first conductivity type second body region 121 and in contact with a third source metal 519, a first conductivity type third source contact 120 located between the second conductivity type third source contacts 215 and in contact with third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in an isolation region formed by a fourth dielectric trench 314 and a fourth oxygen ions injection layer 315, the fourth oxygen ions injection layer 315 is connected with the fourth dielectric trench 314 to form the isolation area, a fourth polysilicon filler 409 is located in the fourth dielectric trench 314; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on a outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in an isolation region formed by a first dielectric trench 309 and a first oxygen ions injection layer 306, the first oxygen ions injection layer 306 is connected with the first dielectric trench 309 to form the isolation area, and a first polysilicon filler 404 is located in the first dielectric trench 309.

Figure 19:
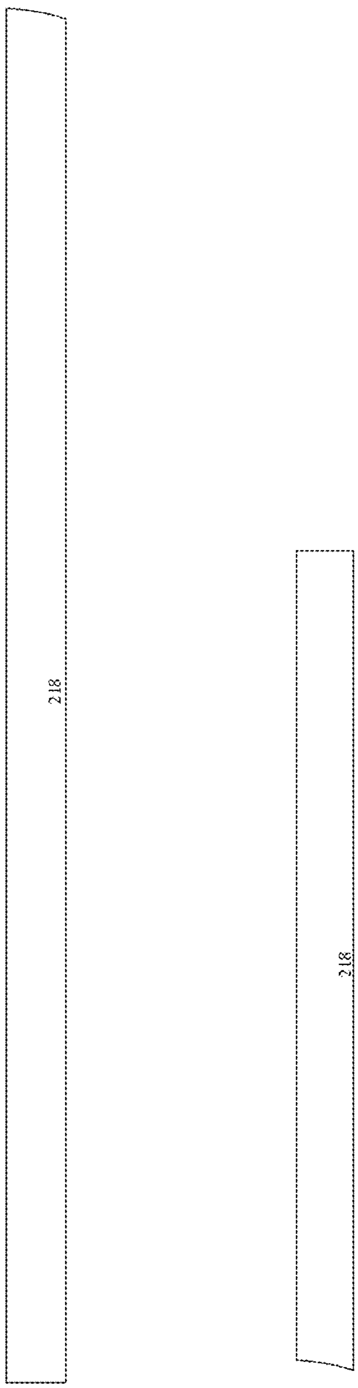
FIGS. 19 (*a*)-(*k*) show process flow diagrams of an integrated power semiconductor of Embodiment 8 of the present invention.
Figure 19:
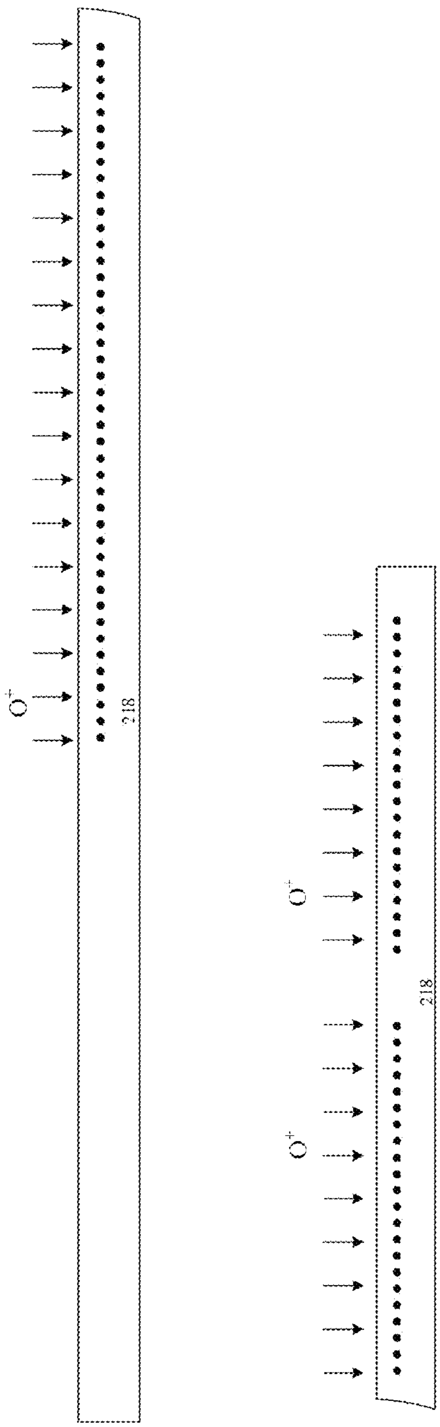
Figure 19:
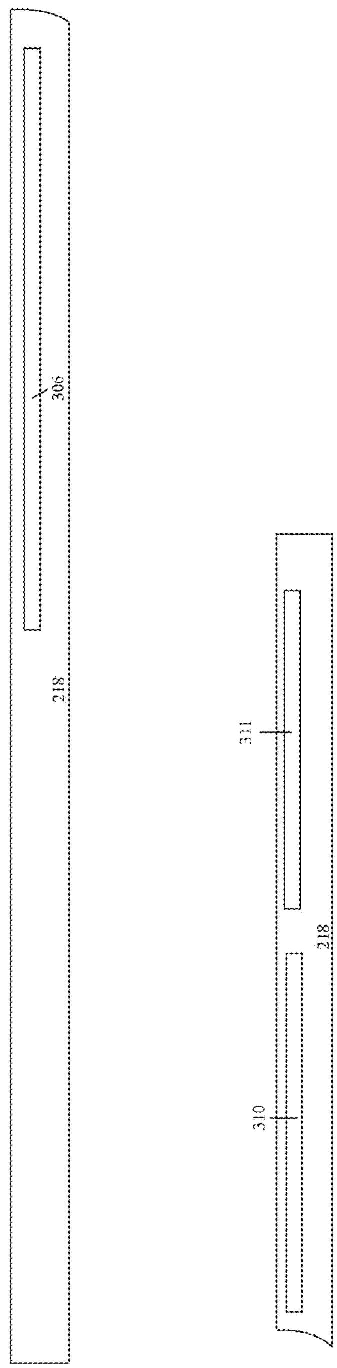
Figure 19:
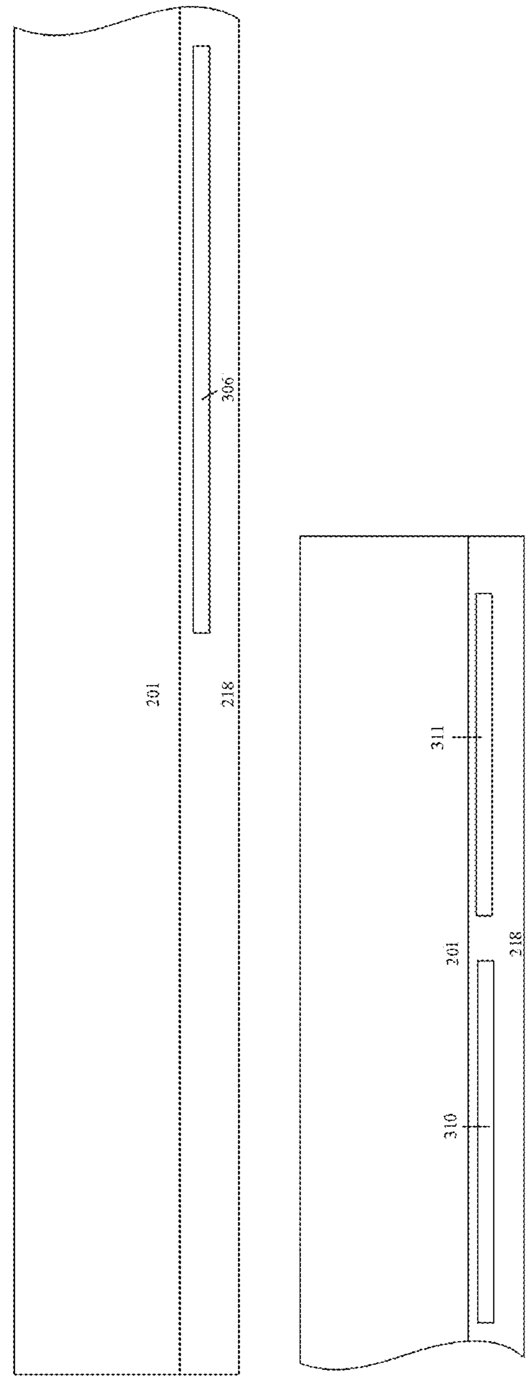
Figure 19:
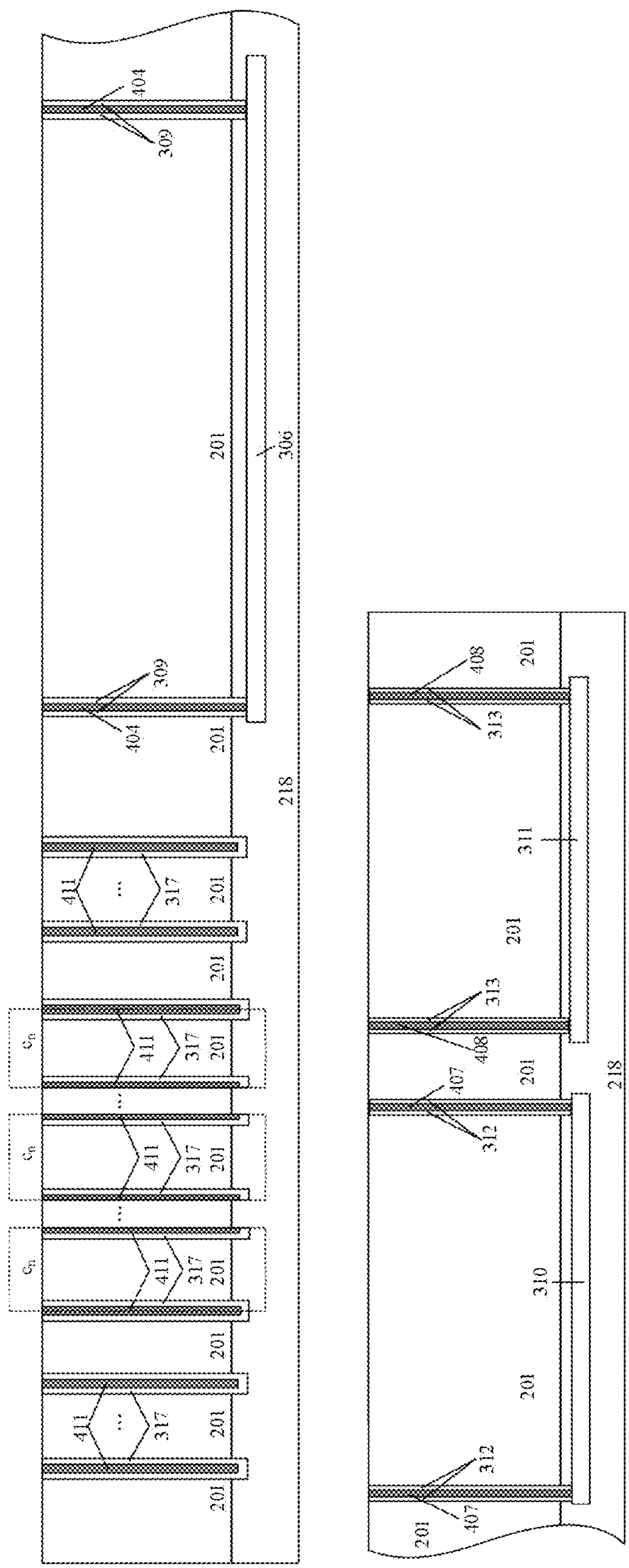
Figure 19:
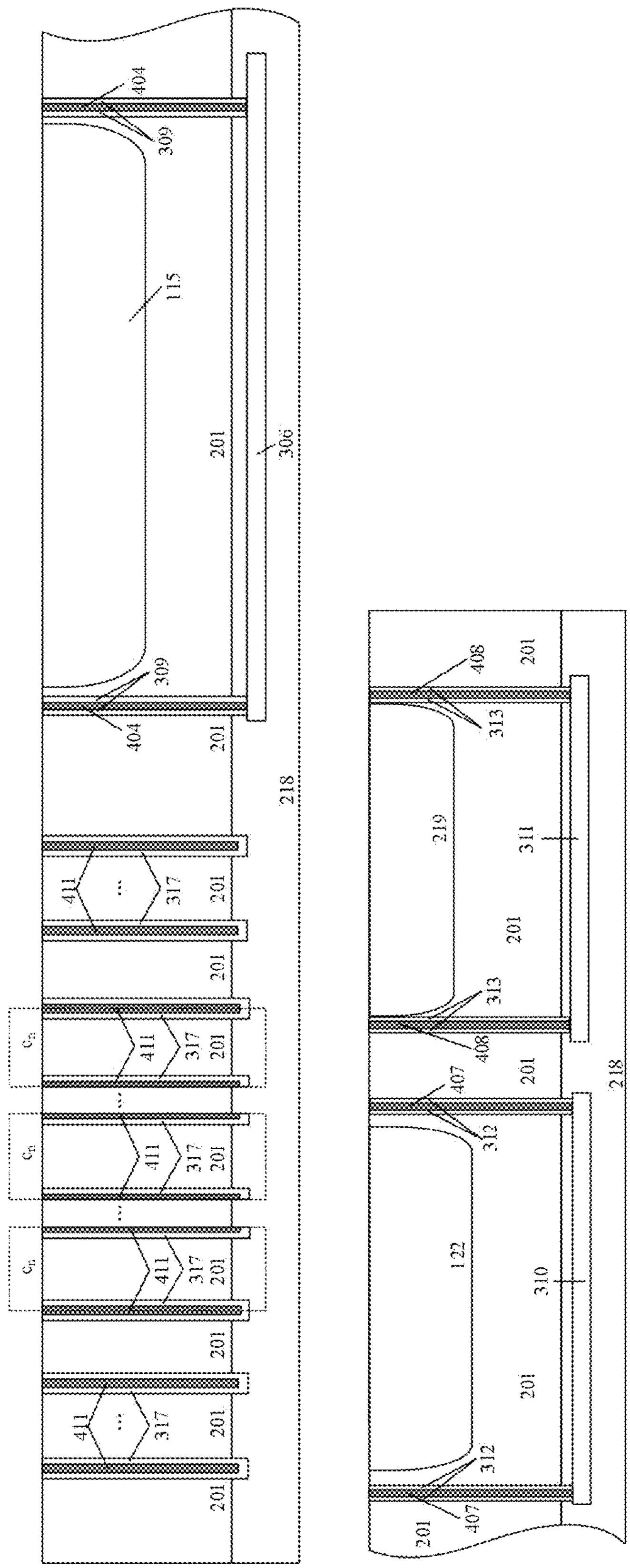
Figure 19:
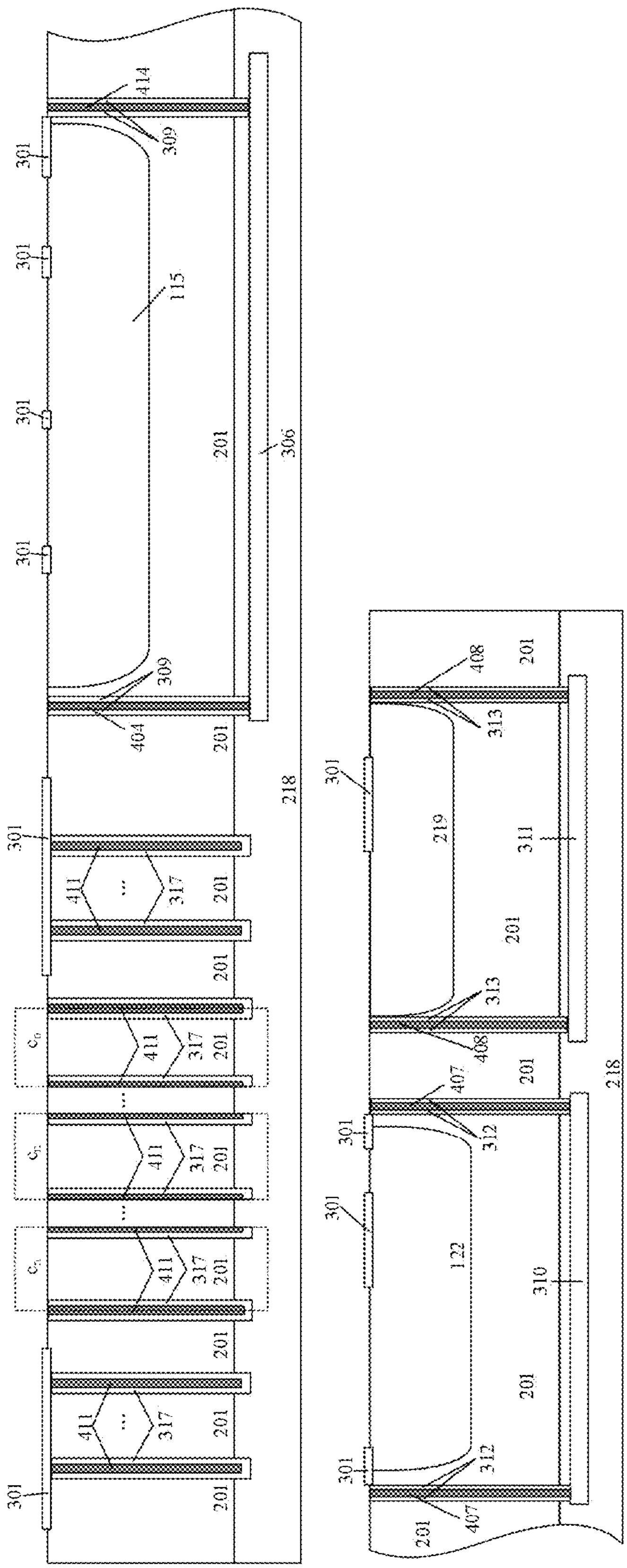
Figure 19:
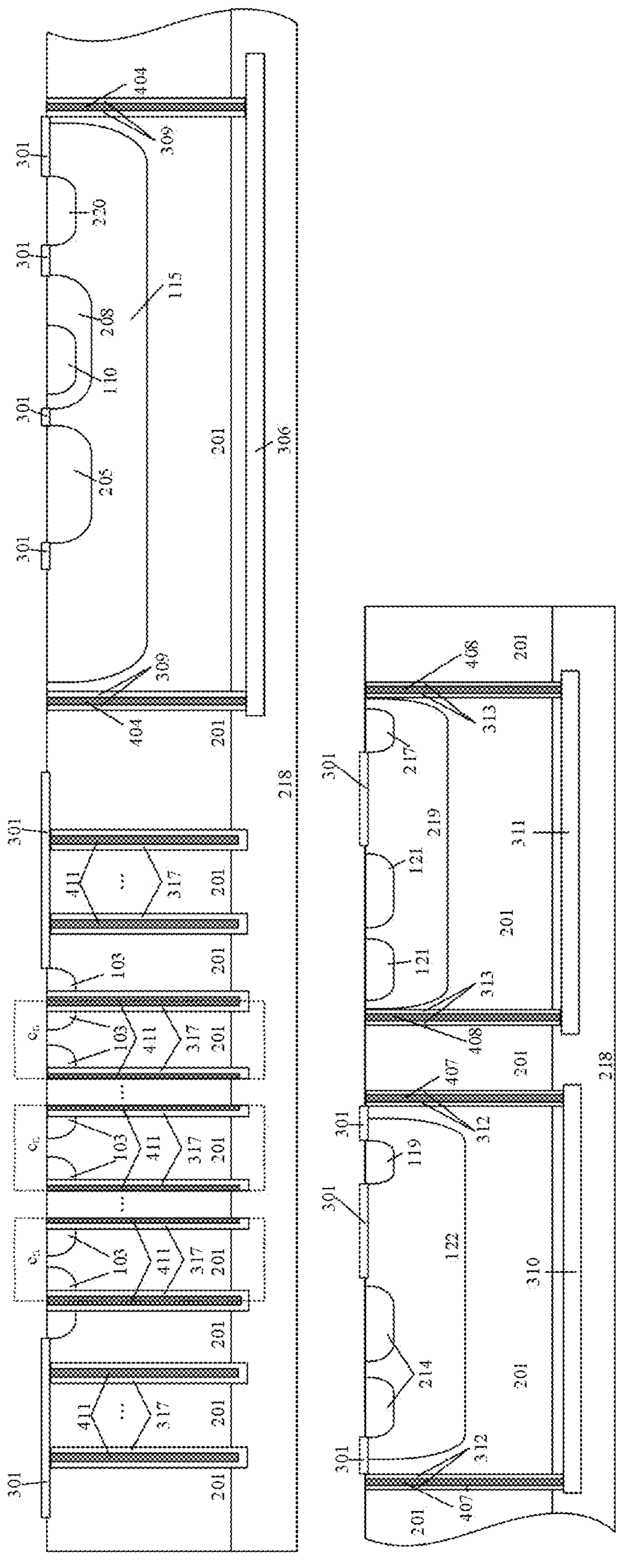
Figure 19:
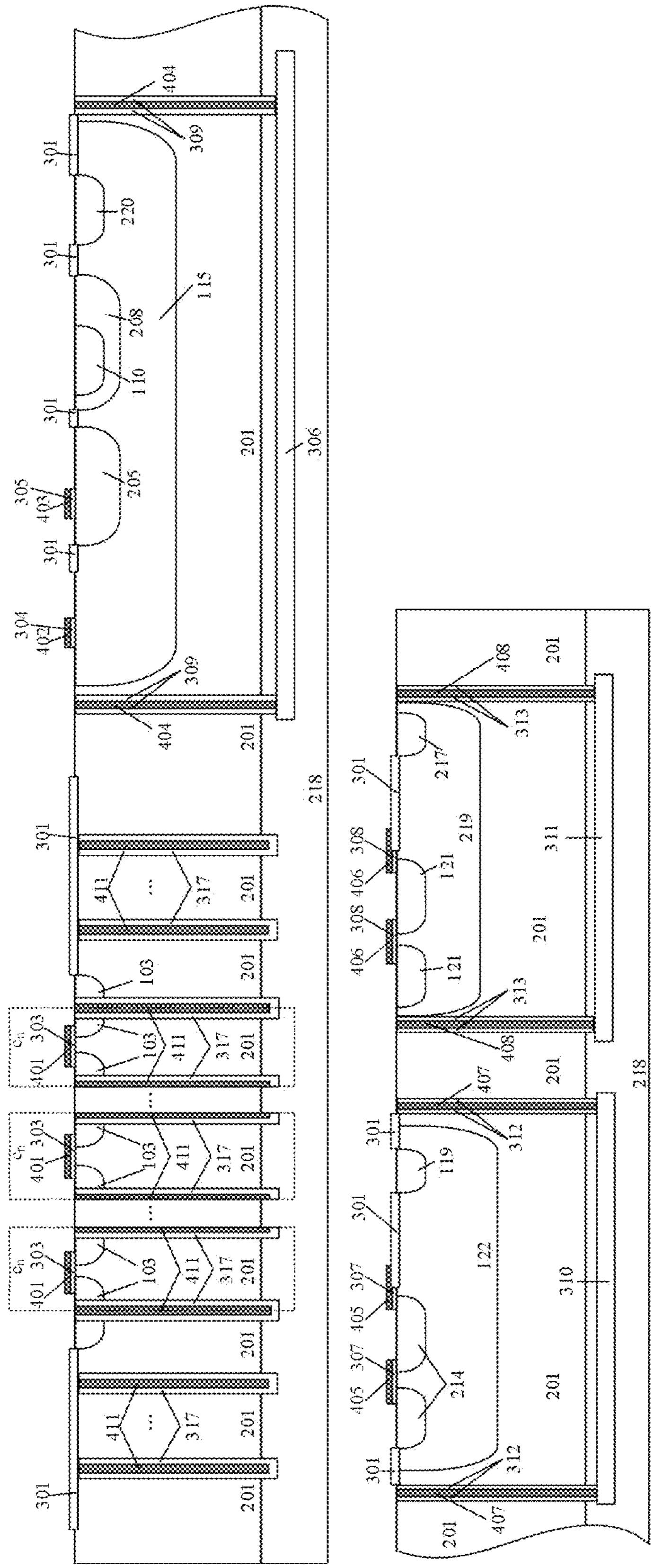
Figure 19:
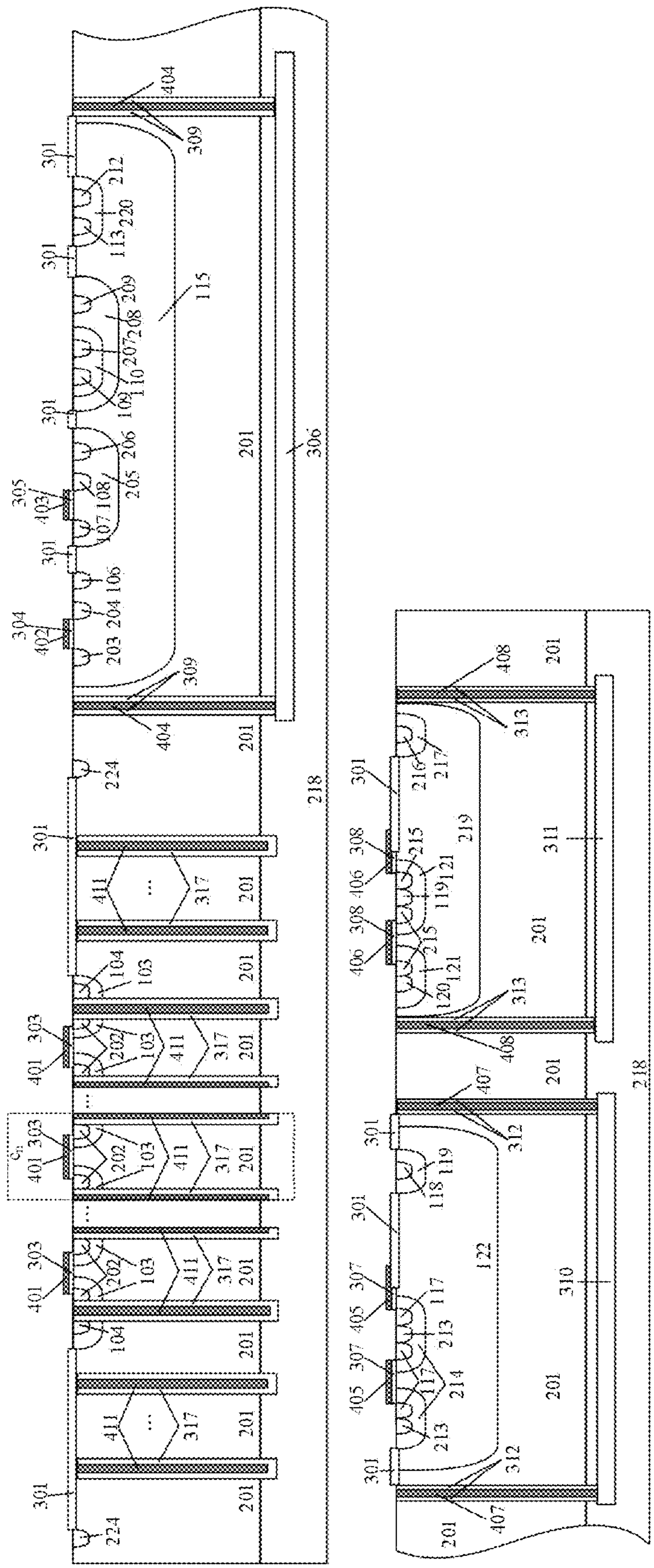
Figure 19:
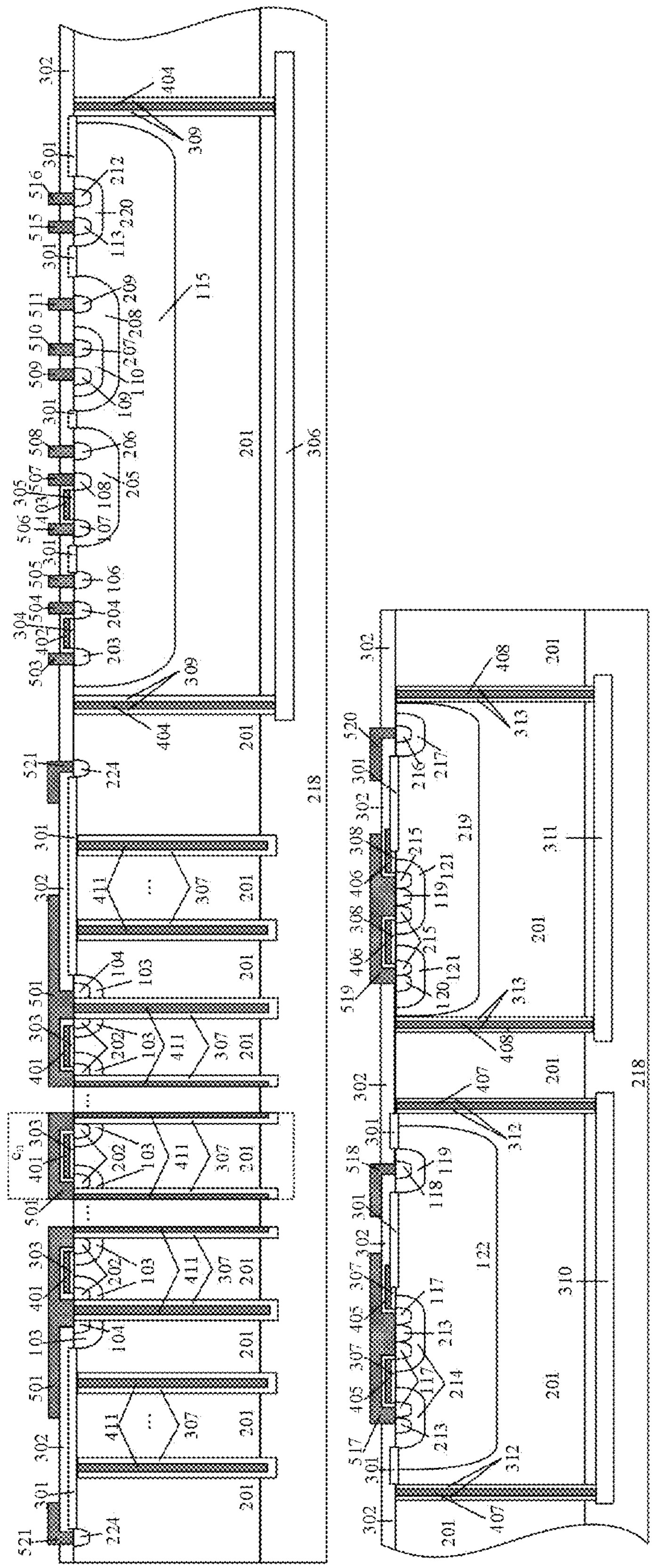

As shown in FIGS. 19 (*a*)-(*k*), the embodiment further provides a method for manufacturing the integrated power semiconductor device, includes the following steps:

Step 1, use a second conductivity type substrate 218.

Step 2, oxygen ions with a predetermined amount is implanted into the second conductivity type substrate 218 through a photolithography technique and an ion implantation technique.

Step 3, an annealing treatment is performed to form a first oxygen ions injection layer 306, a second oxygen ions injection layer 310, a third oxygen ions injection layer 311.

Step 4, an epitaxy is performed to form a second conductivity type epitaxial layer 201

Step 5, a dielectric trench is formed through a deep trench etching process, an oxide layer is thermally grown on the side wall of the trench, a polysilicon is deposited to fill remaining gaps in the dielectric trench.

Step 6, a first conductivity type a first deep well region 115, a first conductivity type a first drift region 122, and a second conductivity type drift 219 are formed in the second conductivity type epitaxial layer 201 through a photolithography technique, an ion implantation technique, Ion Implantation technique and an annealing technique.

Step 7, an oxide layer is thermally grown on an upper surface of the second conductivity type epitaxial layer 201, field oxide dielectric layer 301 is formed.

Step 8, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type first body region 103, a first conductivity type field limiting ring 101, a second conductivity type first well region 205, a second conductivity type second well region 208, a first conductivity type base region 110, a second conductivity type cathode region 220, a second conductivity type first body region 214, a first conductivity type a first field resistance region 119, a first conductivity type second body region 121, a second conductivity type first field resistance region 217.

Step 9, an oxide layer is thermally grown on the upper surface of the second conductivity type epitaxial layer 201 to form a gate dielectric layer, polysilicon is deposited, and gate terminal is formed by through a photolithography technique.

Step 10, first conductivity type impurities and second conductivity type impurities are respectively implanted into the second conductivity type epitaxial layer 201 by different energies and doses through the photolithography technique and the ion implantation technique, then the annealing treatment is performed to form a first conductivity type contact and a second conductivity type contact.

Step 11, a pre-metal dielectric layer 302 is deposited, and a metal layer is deposited after punching.

Embodiment 9

Figure 9:
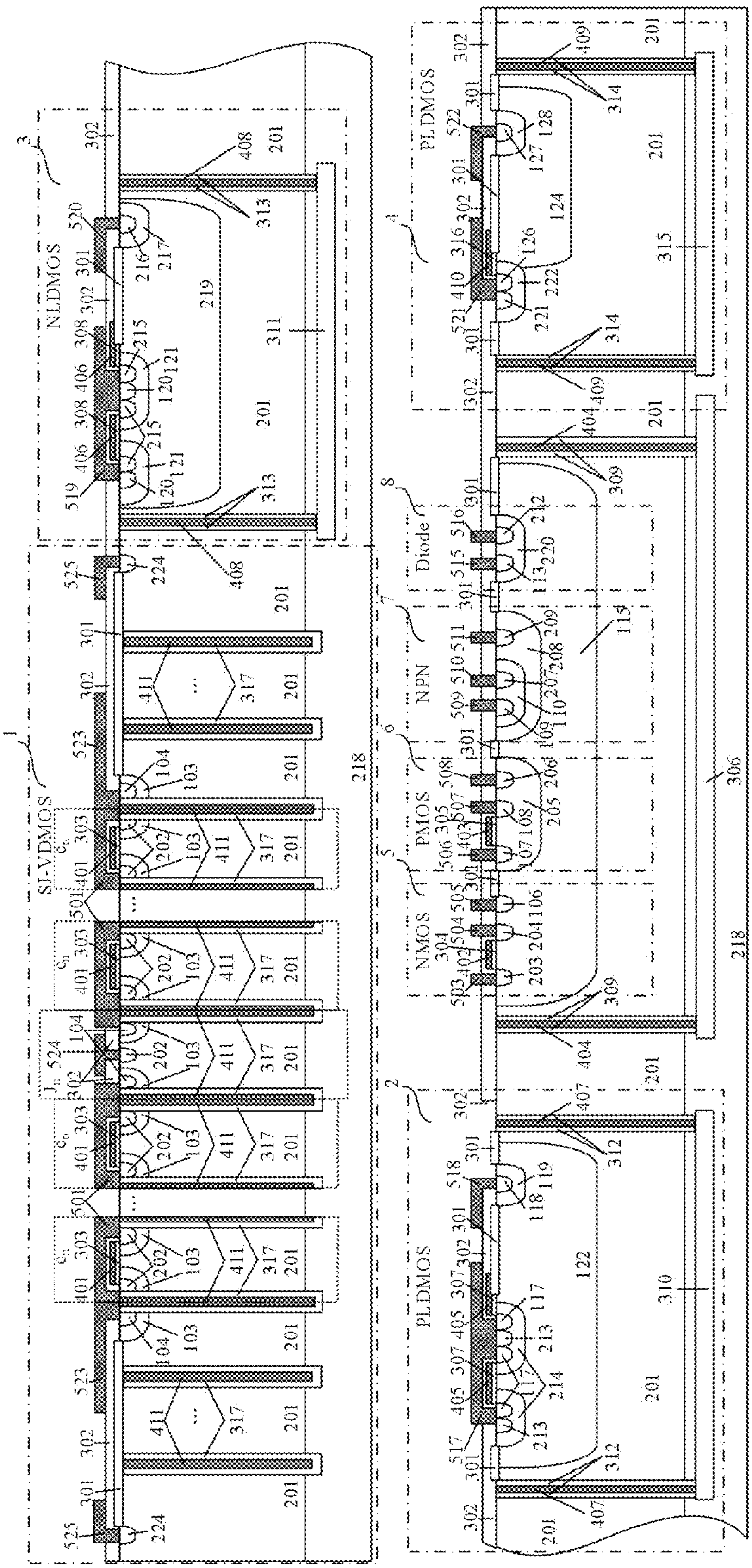
FIG. 9 is a structural schematic diagram of an integrated power semiconductor device according to Embodiment 9 of the present invention.

As shown in FIG. 9, the difference between this embodiment and the embodiment 8 is that the high voltage SJ-VDMOS device 1 further includes a JFET cell region $J_n$ located between the cell regions $C_n$; the JFET cell region $J_n$ includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and located in the second conductivity type epitaxial layer 201, a first conductivity type first source contact 104 located in the first conductivity type first body region 103, a first source metal 501 in contact with the first conductivity type first source contact 104, a second conductivity type first source contact 202 located between the first conductivity type first body regions 103, and a seventh source metal 524 in contact with the second conductivity type first source contact 202; the seventh source metal 524 is isolated from the first source metal 501 by the pre-metal dielectric layer 302.

Embodiment 10

Figure 10:
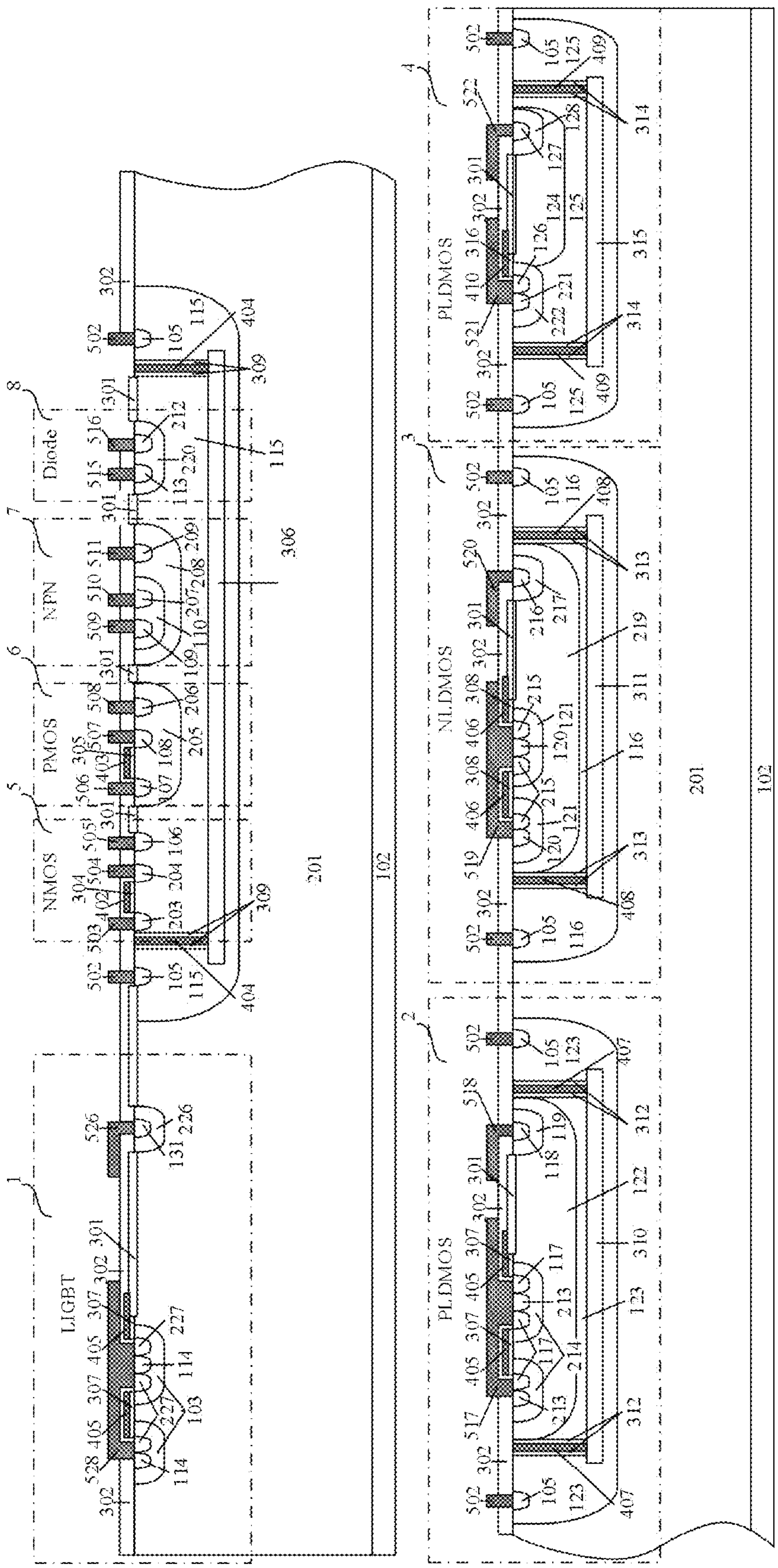
FIG. 10 is a structural schematic diagram of an integrated power semiconductor device according to Embodiment 10 of the present invention.

As shown in FIG. 10, an integrated power semiconductor device, includes devices integrated on a single chip; the devices include a high voltage LIGBT device 1, a first high voltage pLDMOS device 2, a high voltage nLDMOS device 3, a second high voltage pLDMOS device 4, and a low voltage NMOS device 5, a low voltage PMOS device 6, a low voltage NPN device 7, and a low voltage diode device 8; a dielectric isolation is applied to the first high voltage pLDMOS device 2, the high voltage nLDMOS device 3, the second high voltage pLDMOS device 4, the low voltage NMOS device 5, the low voltage PMOS device 6, the low voltage NPN device 7, and the low voltage diode device 8 to achieve a complete isolation between high voltage devices and low voltage devices; a multi-channel design is applied to the first high voltage pLDMOS device 2, and the high voltage nLDMOS device 3; a single channel design is applied to the second high voltage pLDMOS device 4;

The high voltage LIGBT device 1 includes a first conductivity type substrate 102, a second conductivity type epitaxial layer 201 located on the first conductivity type substrate 102, a first conductivity type first body region 103 located in one side of the second conductivity type epitaxial layer 201, a second conductivity type first emitter contact 227 located in both sides of the first body type first body region 103, a first conductivity type first emitter contact 114 located between the second conductivity type first emitter contacts 227, a first emitter metal 528 in contact with the first conductivity type the first emitter contact 227 and the first conductivity type first emitter contact 114, a second gate dielectric layer 307 located on an upper surface of the first conductivity type first body region 103 and the second conductivity type epitaxial layer 201, a second gate terminal 405 located on the second gate dielectric layer 307, a second conductivity type second field resistance region 226 located in the other side of the second conductivity type epitaxial layer 201, a first conductivity type first collector contact 131 located in the second conductivity type second field resistance region 226, wherein, the first conductivity type first collector contact 131 is in contact with a third collector metal 526 above it, a field oxide dielectric layer 301 located on an upper surface of the second conductivity type epitaxial layer 201 and inserted between the first conductivity type first body region 103 and the second conductivity type second field resistance region 226, and a pre-metal dielectric layer 302 located on the field oxide dielectric layer 301 and the second gate terminal 405 to isolate the first emitter metal 528 and the second gate terminal 405;

The first high voltage pLDMOS device 2 is located in a first conductivity type second deep well region 123, a first conductivity type contact ring 105 is located inside the edge of the first conductivity type second deep well region 123 and in contact with a contact ring metal 502, a second dielectric trench 312 and a second polysilicon filler 407 located in the second dielectric trench 312 are located at the medial side of the first conductivity type contact ring 105, a second oxygen ions injection layer 310 is located at the bottom of the first conductivity type second deep well region 123 and connected to the second dielectric trench 312 to form an isolation region; the first high voltage pLDMOS device 2 further includes a first conductivity type first drift region 122 located in an isolation region that includes the second oxygen ions injection layer 310, the second dielectric trench 312 and the second polysilicon filler 407, a second conductivity type first body region 214 located in one side of the first conductivity type first drift region 122, a first conductivity type first field resistance region 119 located in the other side of the first conductivity type first drift region 122, a first conductivity type second source contact 117 located in both sides of the second conductivity type first body region 214 and in contact with a second source metal 517, a second conductivity type second source contact 213 located between the first conductivity type second source contacts 117 and in contact with a second source metal 517, a first conductivity type first drain contact 118 located in the first conductivity type first field resistance region 119 and in contact with a first drain metal 518, a second gate dielectric layer 307 located on an upper surface of the first conductivity type first drift region 122, a second gate terminal 405 located on an upper surface of the second gate dielectric layer 307, a field oxide dielectric layer 301 located on an upper surface of the first conductivity type first drift region 122 and located between the second conductivity type first body region 214 and the first conductivity type first field resistance region 119, and a pre-metal dielectric layer 302 located on a surface of the field oxide dielectric layer 301 and the second gate terminal 405;

The high voltage nLDMOS device 3 is located in a first conductivity type third deep well region 116, a first conductivity type contact ring 105 is located inside the edge of the first conductivity type third deep well region 116 and in contact with a contact ring metal 502, a third dielectric trench 313 and a third polysilicon filler 408 located in the third dielectric trench 313 are located at the medial side of the first conductivity type contact ring 105, a third oxygen ions injection layer 311 is located at the bottom of the first conductivity type third deep well region 116 and connected to the third dielectric trench 313 to form an isolation region; the high voltage nLDMOS device 3 further includes a second conductivity type drift region 219 located in an isolation region that includes the third oxygen ions injection layer 311, the third dielectric trench 313 and the third polysilicon filler 408, a first conductivity type second body region 121 located in one side of the second conductivity type drift region 219, a second conductivity type first field resistance region 217 located in the other side of the second conductivity type drift region 219, a second conductivity type third source contact 215 located in both sides of the first conductivity type second body region 121 and in contact with a third source metal 519, a first conductivity type third source contact 120 located between the second conductivity type third source contacts 215 and in contact with a third source metal 519, a second conductivity type first drain contact 216 located in the second conductivity type first field resistance region 217 and in contact with a second drain metal 520, a third gate dielectric layer 308 located on an upper surface of the second conductivity type drift region 219, a third gate terminal 406 located on an upper surface of the third gate dielectric layer 308, a field oxide dielectric layer 301 located on an upper surface of the second conductivity type drift region 219 and located between the first conductivity type second body region 121 and the second conductivity type first field resistance region 217, and a pre-metal dielectric layer 302 located on a surface of the field oxide dielectric layer 301 and the third gate terminal 406;

The second high voltage pLDMOS device 4 is located in a first conductivity type fourth deep well region 125, a first conductivity type contact ring 105 is located inside the edge of the first conductivity type fourth deep well region 125 and in contact with a contact ring metal 502, a fourth dielectric trench 314 and a fourth polysilicon filler 409 located in the fourth dielectric trench 314 are located at the medial side of the first conductivity type contact ring 105, a fourth oxygen ions injection layer 315 is located at the bottom of the first conductivity type fourth deep well region 125 and connected to the fourth dielectric trench 314 to form an isolation region; the second high voltage pLDMOS device 4 further includes a first conductivity type second drift region 124 located in an isolation region that includes the fourth oxygen ions injection layer 315, the fourth dielectric trench 314 and the fourth polysilicon filler 409, a second conductivity type second body region 222 located on a outside of the first conductivity type second drift region 124, a first conductivity type second field resistance region 128 located in the other side of the first conductivity type second drift region 124, a first conductivity type fourth source contact 126 located in the second conductivity type second body region 222, near the first conductivity type second drift region 124 and in contact with a fourth source metal 521, a second conductivity type fourth source contact 221 located in the second conductivity type second body region 222, away from the first conductivity type second drift region 124, and in contact with a fourth source metal 521, a first conductivity type second drain contact 127 located in the first conductivity type second field resistance region 128 and in contact with a third drain metal 522, a fourth gate dielectric layer 316 located on an upper surface of the first conductivity type second drift region 124 and the second conductivity type second body region 222, a fourth gate terminal 410 located on an upper surface of the fourth gate dielectric layer 316, a field oxide dielectric layer 301 located on an upper surface of the first conductivity type second drift region 124 and located between the second conductivity type second body region 222 and the first conductivity type second field resistance region 128, and a pre-metal dielectric layer 302 located on a surface of the field oxide dielectric layer 301 and the fourth gate terminal 410;

The low voltage NMOS device 5, the low voltage PMOS device 6, the low voltage NPN device 7 and the low voltage diode device 8 are both located in a first conductivity type first deep well region 115, a first conductivity type contact ring 105 is located inside the edge of the first conductivity type first deep well region 115 and is in contact with a contact ring metal 502, a first dielectric trench 309 and a first polysilicon filler 404 located in the first dielectric trench 309 are located at the medial side of the first conductivity type contact ring 105, a first oxygen ions injection layer 306 is located it the bottom of the first conductivity type first deep well region 115 and is connected to the first dielectric trench 309 to form an isolation region;

The low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, and a second conductivity type body contact 206 located on a side of the first conductivity type fifth source contact 108 away from the sixth gate terminal 403, a second body metal 508 in contact with the second conductivity type body contact 206;

The low voltage NPN device 7 includes a second conductivity type second well region 208 located in a first conductivity type first deep well region 115, a second conductivity type collector contact 209 located in one side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212.

Embodiment 11

Figure 11:
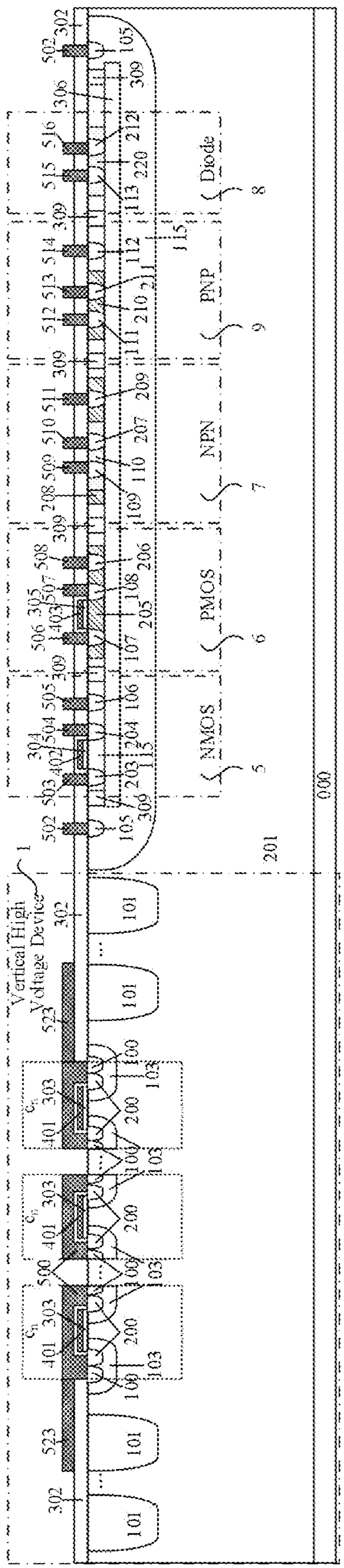
FIG. 11 is a structural schematic diagram of an integrated power semiconductor device according to Embodiment 11 of the present invention.

As shown in FIG. 11, an integrated power semiconductor device, includes devices integrated on a single chip; the devices include a vertical high voltage device 1, and a low voltage NMOS device 5, a low voltage PMOS device 6, a low voltage NPN device 7, a low voltage PNP device 9 and a low voltage diode device 8;

The low voltage NMOS device 5, the low voltage PMOS device 6, the low voltage NPN device 7, the low voltage PNP device 9 and the low voltage diode device 8 are both located inside a first conductivity type first deep well region 115, a first conductivity type contact ring 105 is located in the edge of the first conductivity type first deep well region 115 and in contact with a contact ring metal 502, a first dielectric trench 309 is located at the medial side of the first conductivity type contact ring 105, a first oxygen ions injection layer 306 is located in the bottom of the first conductivity type first deep well region 115 and is connected to the first dielectric trench 309 to form an isolation region; the low voltage NMOS device 5, the low voltage PMOS device 6, the low voltage NPN device 7, the low voltage PNP device 9 and the low voltage Diode device 8 are isolated from each other by a first dielectric trench 309;

The low voltage NMOS device 5 includes a fifth gate dielectric layer 304 located on an upper surface on a first conductivity type first deep well region 115, a fifth gate terminal 402 located on an upper surface of the fifth gate dielectric layer 304, a second conductivity type second drain contact 203 and a second conductivity type fifth source contact 204 located on both sides of the fifth gate terminal 402 and located in the first conductivity type first deep well region 115, a fourth drain metal 503 in contact with the second conductivity type second drain contact 203, a fifth source metal 504 in contact with the second conductivity type fifth source contact 204, a first conductivity type body contact 106 located on a side of the second conductivity type fifth source contact 204 away from the fifth gate terminal 402, and a first body metal 505 in contact with the first conductivity type body contact 106;

The low voltage PMOS device 6 includes a second conductivity type first well region 205 located in a first conductivity type first deep well region 115, a sixth gate dielectric layer 305 located on an upper surface on the second conductivity type first well region 205, a sixth gate terminal 403 located on an upper surface of the sixth gate dielectric layer 305, a first conductivity type third drain contact 107 and a first conductivity type fifth source contact 108 located on both sides of the sixth gate terminal 403 and located in the second conductivity type first well region 205, a fifth drain metal 506 in contact with the first conductivity type third drain contact 107, a sixth source metal 507 in contact with the first conductivity type fifth source contact 108, and a second conductivity type body contact 206 located on a side of the first conductivity type fifth source contact 108 away from the sixth gate terminal 403, a second body metal 508 in contact with the second conductivity type body contact 206;

The low voltage NPN device 7 includes a second conductivity type second well region 208 located in a first conductivity type first deep well region 115, a second conductivity type collector contact 209 located in one side of the second conductivity type second well region 208, a first collector metal 511 in contact with the second conductivity type collector contact 209, a first conductivity type base region 110 located in the other side of the second conductivity type second well region 208, a first conductivity type base contact 109 and a second conductivity type second emitter contact 207 located in the first conductivity type base region 110, a first base metal 509 in contact with the first conductivity type base contact 109, and a first emitter metal 510 in contact with the second conductivity type second emitter contact 207;

The low voltage PNP device 9 includes a first conductivity type second collector contact 112 located in a first conductivity type first deep well region 115, a second collector metal 514 in contact with the first conductivity type second collector contact 112, a second conductivity type base region 210 located in the first conductivity type first deep well region 115, a second conductivity type base contact 211 and a first conductivity type second emitter contact 111 located in the second conductivity type base region 210, a second base metal 513 in contact with the second conductivity type base contact 211, and a second emitter metal 512 in contact with the first conductivity type second emitter contact 111;

The low voltage Diode device 8 includes a second conductivity type cathode region 220 located in a first conductivity type first deep well region 115, a first conductivity type anode contact 113 and a second conductivity type first cathode contact 212 located in the second conductivity type cathode region 220, an anode metal 515 in contact with the first conductivity type anode contact 113, and a first cathode metal 516 in contact with the second conductivity type first cathode contact 212.

Embodiment 12

Figure 12:
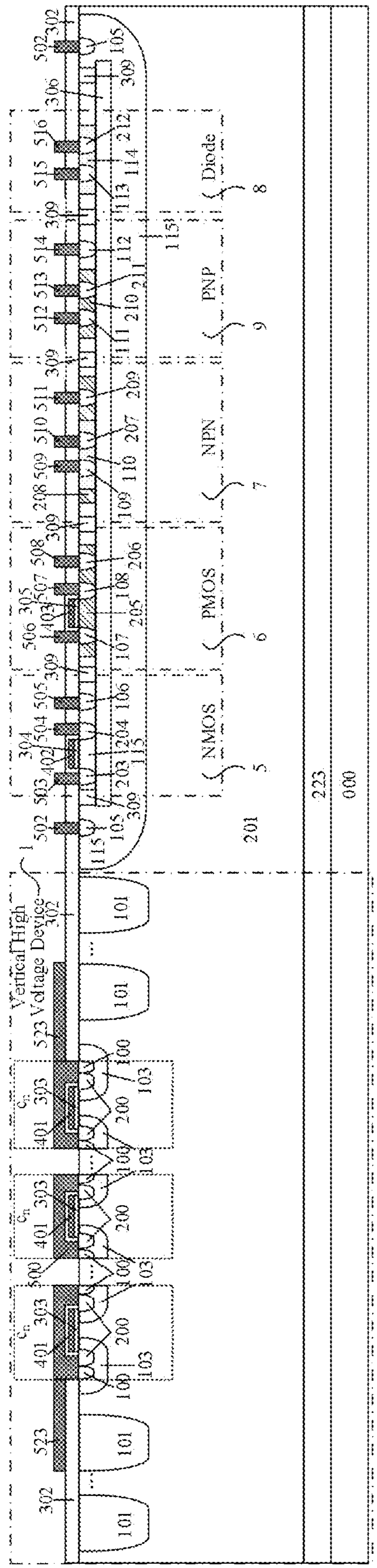
FIG. 12 is a structural schematic diagram of an integrated power semiconductor device according to Embodiment 12 of the present invention.

As shown in FIG. 12, the difference between this embodiment and the embodiment 11 is that a second conductivity type field resistance layer 223 is inserted between the substrate 000 and the second conductivity type epitaxial layer 201 in the vertical high voltage device 1;

The vertical high voltage device 1 include substrate 000, a second conductivity type epitaxial layer 201 located on the substrate 000, a closely connected cell region $C_n$ located in the second conductivity type epitaxial layer 201, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, and a first conductivity type field limiting ring 101 arranged at equal intervals below the field oxide dielectric layer 301; the cell region $C_n$ further includes a first conductivity type first body region 103 located in both sides of the cell region, a second conductivity type first emitter or source contact 200 and a first conductivity type first emitter or source contact 100, wherein the second conductivity type first emitter or source contact 200 and the first conductivity type first emitter or source contact 100 are located in the first conductivity type first body region 103 and adjacent to each other, a first emitter or source metal 500 in contact with the second conductivity type first emitter or source contact 200 and the first conductivity type first emitter or source contact 100, a first gate dielectric layer 303 located on an upper surface of the cell region $C_n$, and a first gate terminal 401 located on an upper surface of the first gate dielectric layer 303;

The substrate 000 is a first conductivity type substrate 102 or a second conductivity type substrate 218.

Embodiment 13

Figure 13:
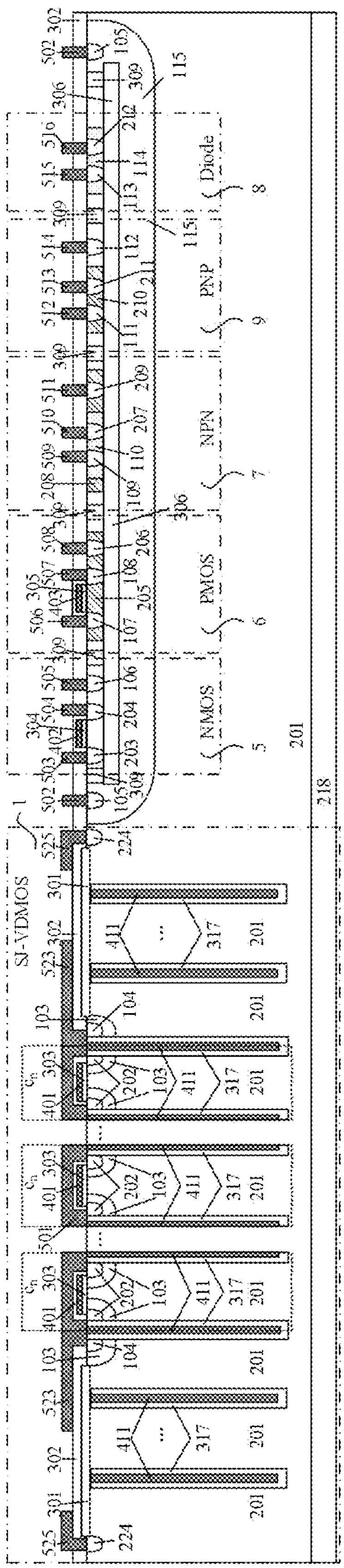
FIG. 13 is a structural schematic diagram of an integrated power semiconductor device according to Embodiment 13 of the present invention.

As shown in FIG. 13, the difference between this embodiment and the embodiment 11 is that the substrate 000 is a second conductivity type substrate 218, and the vertical high voltage device 1 is a high voltage SJ-VDMOS device; the high voltage SJ-VDMOS device 1 includes a second conductivity type substrate 218, a second conductivity type epitaxial layer 201 located on the second conductivity type substrate 218, a closely connected cell region $C_n$ located in the second conductivity type epitaxial layer 201, a first conductivity type first body region 103 located outside the outermost cell region $C_n$, a second conductivity type first source contact 104 located in the first conductivity type first body region 103, a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a field oxide dielectric layer 301 located on an upper surface of the second conductivity type epitaxial layer 201, a pre-metal dielectric layer 302 located on a surface of the field oxide dielectric layer 301, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a fifth dielectric trench 317 located in the second conductivity type epitaxial layer 201, wherein the fifth dielectric trench 317 extends to the top of the second conductivity type substrate 218 and the upper surface of the second conductivity type epitaxial layer 201, a fifth polysilicon filler 411 located in the fifth dielectric trench 317, a first conductivity type first body region 103 located at the medial side of the fifth dielectric trench 317 and in of the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the fifth dielectric trenches 317 and located on an upper surface of the second conductivity type epitaxial layer 201, and a first gate terminal 401 located on an upper surface of the first gate dielectric layer 303.

Embodiment 14

Figure 14:
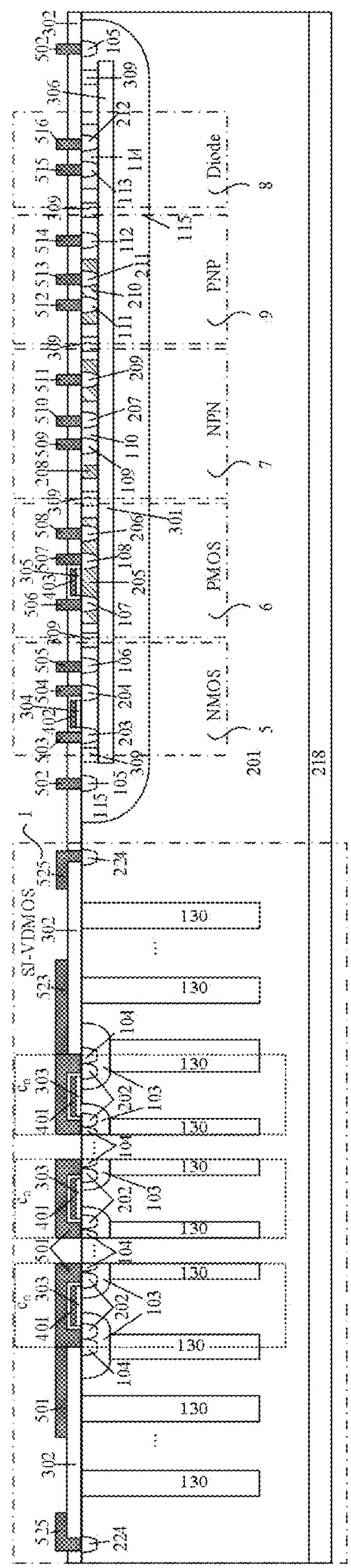
FIG. 14 is a structural schematic diagram of an integrated power semiconductor device according to Embodiment 14 of the present invention.

As shown in FIG. 14, the difference between this embodiment and the embodiment 11 is that the substrate 000 is a second conductivity type substrate 218, and the vertical high voltage device 1 is a high voltage SJ-VDMOS device; the high voltage SJ-VDMOS device 1 includes a second conductivity type substrate 218, a second conductivity type epitaxial layer 201 located on the second conductivity type substrate 218, a closely connected cell region $C_n$ located in the second conductivity type epitaxial layer 201, a first conductivity type first body region 103 located outside the outermost cell region $C_n$, a second conductivity type first source contact 104 located in the first conductivity type first body region 103, a first conductivity type super junction pillar 130 located in the second conductivity type epitaxial layer 201, a pre-metal dielectric layer 302 located on a surface of the second conductivity type epitaxial layer 201, a metal field plate 523 located on a surface of the pre-metal dielectric layer 302, a second conductivity type cutoff ring 224 located at the outermost periphery of the high voltage SJ-VDMOS device 1 and a cutoff ring metal 525 located on the second conductivity type cutoff ring 224; the cell region $C_n$ further includes a first conductivity type super junction pillar 130 located in the second conductivity type epitaxial layer 201, a first conductivity type first body region 103 located at the medial side of the first conductivity type super junction pillar 130 and located in the second conductivity type epitaxial layer 201, a second conductivity type first source contact 202 and a first conductivity type first source contact 104, wherein the second conductivity type first source contact 202 and the first conductivity type first source contact 104 are located in the first conductivity type first body region 103 and adjacent to each other, a first source metal 501 in contact with the second conductivity type first source contact 202 and the first conductivity type first source contact 104, a first gate dielectric layer 303 located between the first conductivity type super junction pillars 130 and located in the second conductivity type epitaxial layer 201, and a first gate terminal 401 located on an upper surface of the first gate dielectric layer 303.

Embodiment 15

Figure 15:
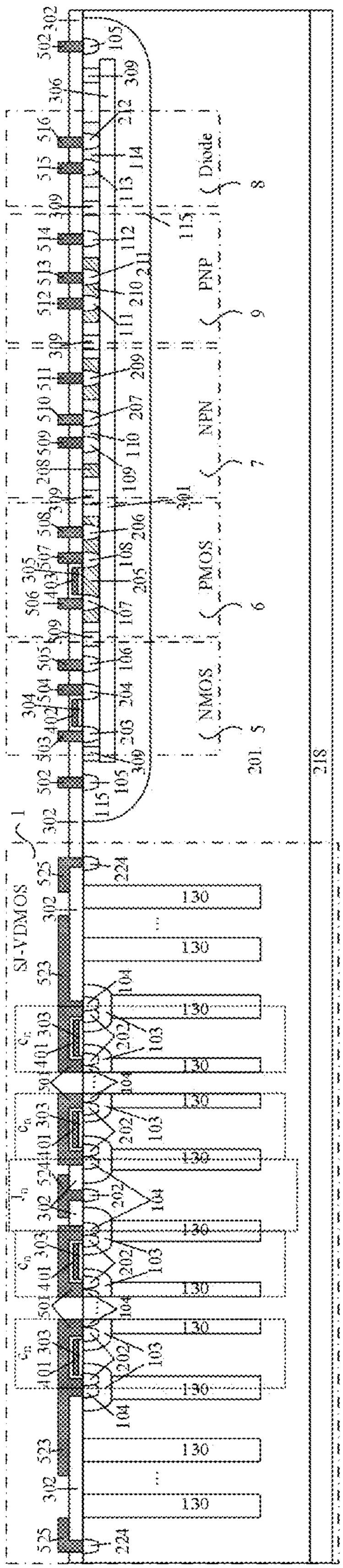
FIG. 15 is a structural schematic diagram of an integrated power semiconductor device according to Embodiment 15 of the present invention.

As shown in FIG. 15, the difference between this embodiment and the embodiment 14 is that the substrate 000 is a second conductivity type substrate 218, the high voltage SJ-VDMOS device 1 further includes a JFET cell region $J_n$ located between the cell regions $C_n$; the JFET cell region $J_n$ includes a first conductivity type super junction pillar 130 located in the second conductivity type epitaxial layer 201, wherein the first conductivity type super junction pillar 130 extends to the top of the second conductivity type substrate 218 and the upper surface of the second conductivity type epitaxial layer 201, a first conductivity type first body region 103 located at the medial side of the first conductivity type super junction pillars 130 and located in the second conductivity type epitaxial layer 201, a first conductivity type first source contact 104 located in the first conductivity type first body region 103, a first source metal 501 in contact with the first conductivity type first source contact 104, a second conductivity type first source contact 202 located between the first conductivity type first body regions 103, and a seventh source metal 524 in contact with the second conductivity type first source contact 202; the seventh source metal 524 is isolated from the first source metal 501 by the pre-metal dielectric layer 302.

Embodiment 16

Figure 16:
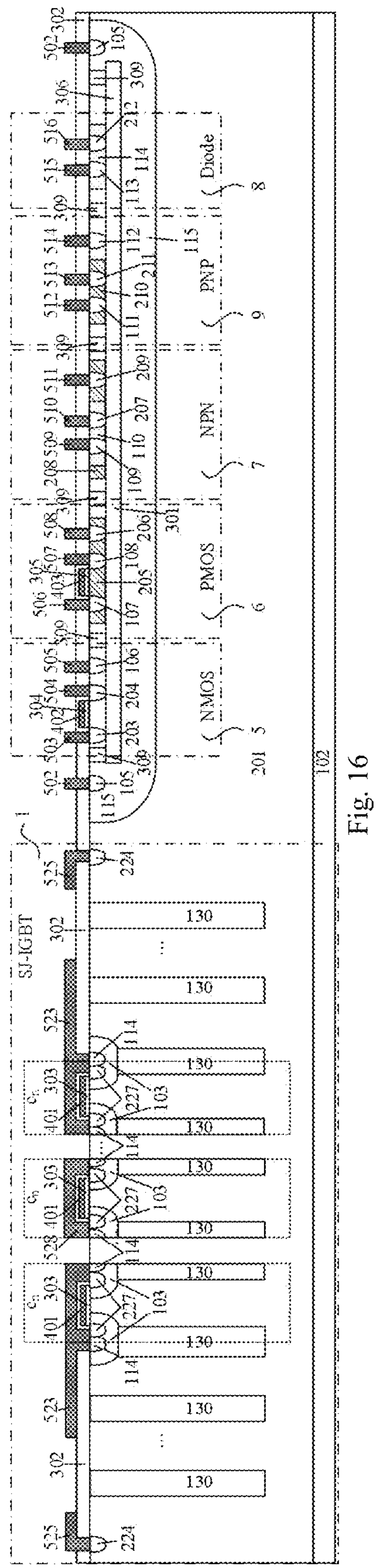
FIG. 16 is a structural schematic diagram of an integrated power semiconductor device according to Embodiment 16 of the present invention.

As shown in FIG. 16, the difference between this embodiment and the embodiment 11 is that the substrate 000 is a first conductivity type substrate 102 and the vertical high voltage device 1 is a high voltage SJ-IGBT device; the high voltage SJ-IGBT device 1 includes a first conductivity type substrate 102, a second conductivity type epitaxial layer 201 located on the first conductivity type substrate 102, a closely connected cell region $C_n$ located in the second conductivity type epitaxial layer 201, a first conductivity type first body region 103 located outside the outermost cell region $C_n$, a second conductivity type first emitter contact 104 located in the first conductivity type first body region 103, a first conductivity type super junction pillar 130 located in the second conductivity type epitaxial layer 201, a pre-metal dielectric layer 302 located on a surface of the second conductivity type epitaxial layer 201, a metal field plate 523 located on a surface of the pre-metal dielectric layer 302, a second conductivity type cutoff ring 224 located at the outermost periphery of the high voltage SJ-IGBT device 1 and a cutoff ring metal 525 located on the second conductivity type cutoff ring 224; the cell region $C_n$ further includes a first conductivity type super junction pillar 130 located in the second conductivity type epitaxial layer 201, a first conductivity type first body region 103 located at the medial side of the first conductivity type super junction pillar 130 and located in the second conductivity type epitaxial layer 201, a second conductivity type first emitter contact 227 and a first conductivity type first emitter contact 114, wherein the second conductivity type first emitter contact and the first conductivity type first emitter contact are located in the first conductivity type first body region 103 and adjacent to each other, a first emitter metal 528 in contact with the second conductivity type first emitter contact 227 and the first conductivity type first emitter contact 114, a first gate dielectric layer 303 located between the first conductivity type super junction pillars 130 and located in the second conductivity type epitaxial layer 201, and a first gate terminal 401 located on an upper surface of the first gate dielectric layer 303.

The above-mentioned embodiments merely illustrate the principle and effects of the present invention, exemplarily rather than limit the present invention. Modifications and variations may be derived by those skilled in the art according to the above-mentioned embodiments without departing from the spirit and scope of the present invention. Therefore, any equivalent modification or variation made by those of common knowledge in the art without departing from the spirit and technical idea disclosed by the present invention should still be considered as falling within the scope of the appended claims of the present invention.

What is claimed is:

1. An integrated power semiconductor device comprising a plurality of devices integrated on a single chip, wherein the plurality of devices comprises a vertical high voltage device, a first high voltage pLDMOS device, a high voltage nLDMOS device, a second high voltage pLDMOS device, a low voltage NMOS device, a low voltage PMOS device, a low voltage NPN device, and a low voltage diode device;

wherein a dielectric isolation is applied to the first high voltage pLDMOS device, the high voltage nLDMOS device, the second high voltage pLDMOS device, the low voltage NMOS device, the low voltage PMOS device, the low voltage NPN device, and the low voltage diode device to achieve a complete isolation between high voltage devices and low voltage devices;

wherein multi-channel design is applied to the first high voltage pLDMOS device, and the high voltage nLDMOS device; wherein a single channel design is applied to the second high voltage pLDMOS device;

wherein the vertical high voltage device comprises a substrate, a second conductivity type epitaxial layer located on the substrate, a closely connected cell region $C_n$ located in the second conductivity type epitaxial layer, a field oxide dielectric layer located on an upper surface of the second conductivity type epitaxial layer, a pre-metal dielectric layer located on a surface of the field oxide dielectric layer, a metal field plate located on a surface of the pre-metal dielectric layer, and a first conductivity type field limiting ring arranged at equal intervals below the field oxide dielectric layer; the cell region $C_n$ further comprises a first conductivity type first body region located in both sides of the cell region, a second conductivity type first emitter or source contact and a first conductivity type first emitter or source contact, wherein the second conductivity type first emitter or source contact and the first conductivity type first emitter or source contact are located in the first conductivity type first body region and adjacent to each other, a first emitter or source metal in contact with the second conductivity type first emitter or source contact and the first conductivity type first emitter or source contact, a first gate dielectric layer located on an upper surface of the cell region $C_n$, and a first gate terminal located on an upper surface of the first gate dielectric layer;

wherein the first high voltage pLDMOS device is located in an isolation region formed by a second dielectric trench and a second oxygen ions injection layer, the second oxygen ions injection layer is connected with the second dielectric trench to form the isolation area, a second polysilicon filler is located in the second dielectric trench; the first high voltage pLDMOS device further comprises a first conductivity type first drift region located in an isolation region including the second oxygen ions injection layer, the second dielectric trench and the second polysilicon filler, a second conductivity type first body region located in one side of the first conductivity type first drift region, a first conductivity type first field resistance region located in the other side of the first conductivity type first drift region, a first conductivity type second source contact located in both sides of the second conductivity type first body region and in contact with a second source metal, a second conductivity type second source contact between the first conductivity type second source contacts and in contact with a second source metal, a first conductivity type first drain contact located in the first conductivity type first field resistance region and in contact with a first drain metal, a second gate dielectric layer located on an upper surface of the first conductivity type first drift region, a second gate terminal located on an upper surface of the second gate dielectric layer, a field oxide dielectric layer located on an upper surface of the first conductivity type first drift region and located between the second conductivity type first body region and the first conductivity type first field resistance region, and a pre-metal dielectric layer located on a surface of the field oxide dielectric layer and the second gate terminal;

wherein the high voltage nLDMOS device is located in an isolation region formed by a third dielectric trench and a third oxygen ions injection layer, the third oxygen ions injection layer is connected with the third dielectric trench to form the isolation area, a third polysilicon filler is located in the third dielectric trench; the high voltage nLDMOS device further comprises a second conductivity type drift region located in an isolation region including the third oxygen ions injection layer, the third dielectric trench and the third polysilicon filler, a first conductivity type second body region located in one side of the second conductivity type drift region, a second conductivity type first field resistance region located in the other side of second conductivity type drift region, a second conductivity type third source contact located in both sides of the first conductivity type second body region and in contact with a third source metal, a first conductivity type third source contact between the second conductivity type third source contacts and in contact with a third source metal, a second conductivity type first drain contact located in the second conductivity type first field resistance region and in contact with a second drain metal, a third gate dielectric layer located on an upper surface of the second conductivity type drift region, a third gate terminal located on an upper surface of the third gate dielectric layer, a field oxide dielectric layer located on an upper surface of the second conductivity type drift region and located between the first conductivity type second body region and the second conductivity type first field resistance region, and a pre-metal dielectric layer located on a surface of the field oxide dielectric layer and the third gate terminal;

wherein the second high voltage pLDMOS device is located in an isolation region formed by a fourth dielectric trench and a fourth oxygen ions injection layer, the fourth oxygen ions injection layer is connected with the fourth dielectric trench to form the isolation area, a fourth polysilicon filler is located in the fourth dielectric trench; the second high voltage pLDMOS device further comprises a first conductivity type second drift region located in an isolation region including the fourth oxygen ions injection layer, the fourth dielectric trench and the fourth polysilicon filler, a second conductivity type second body region located on an outside of the first conductivity type second drift region, a first conductivity type second field resistance region located in the other side of the first conductivity type second drift region, a first conductivity type fourth source contact located in the second conductivity type second body region near the first conductivity type second drift region and in contact with a fourth source metal, a second conductivity type fourth source contact located in the second conductivity type second body region away from the first conductivity type second drift region and in contact with a fourth source metal, a first conductivity type a second drain contact located in the first conductivity type second field resistance region and in contact with a third drain metal, a fourth gate dielectric layer located on an upper surface of the first conductivity type second drift region and the second conductivity type second body region a fourth gate terminal located on an upper surface of the fourth gate dielectric layer, a field oxide dielectric layer located on an upper surface of the first conductivity type second drift region and located between the second conductivity type second body region and the first conductivity type second field resistance region, and a pre-metal dielectric layer located on a surface of the field oxide dielectric layer and the fourth gate terminal;

wherein the low voltage NMOS device, the low voltage PMOS device, the low voltage NPN device and the low voltage diode device are both located in an isolation region formed by a first dielectric trench and a first oxygen ions injection layer, the first oxygen ions injection layer is connected with the first dielectric trench to form the isolation area, and a first polysilicon filler is located in the first dielectric trench.

2. The integrated power semiconductor device according to claim 1, wherein the low voltage NMOS device comprises a fifth gate dielectric layer located on an upper surface on a first conductivity type first deep well region, a fifth gate terminal located on an upper surface of the fifth gate dielectric layer, a second conductivity type second drain contact and a second conductivity type fifth source contact located on both sides of the fifth gate terminal and located in the first conductivity type first deep well region, a fourth drain metal in contact with the second conductivity type second drain contact, a fifth source metal in contact with the second conductivity type fifth source contact, a first conductivity type body contact located on a side of the second conductivity type fifth source contact away from the fifth gate terminal, and a first body metal in contact with the first conductivity type body contact;

the low voltage PMOS device comprises a second conductivity type first well region located in a first conductivity type first deep well region, a sixth gate dielectric layer located on an upper surface on the second conductivity type first well region, a sixth gate terminal located on an upper surface of the sixth gate dielectric layer, a first conductivity type third drain contact and a first conductivity type fifth source contact located on both sides of the sixth gate terminal and located in the second conductivity type first well region, a fifth drain metal in contact with the first conductivity type third drain contact, a sixth source metal in contact with the first conductivity type fifth source contact, a second conductivity type body contact located on a side of the first conductivity type fifth source contact away from the sixth gate terminal, and a second body metal in contact with the second conductivity type body contact;

the low voltage NPN device comprises a second conductivity type second well region located in a first conductivity type first deep well region, a second conductivity type collector contact located in one side of the second conductivity type second well region, a first collector metal in contact with the second conductivity type collector contact, a first conductivity type base region located in the other side of the second conductivity type second well region, a first conductivity type base contact and a second conductivity type second emitter contact located in the first conductivity type base region, a first base metal in contact with the first conductivity type base contact, and a first emitter metal in contact with the second conductivity type second emitter contact;

the low voltage Diode device comprises a second conductivity type cathode region located in a first conductivity type first deep well region, a first conductivity type anode contact and a second conductivity type first cathode contact located in the second conductivity type cathode region, an anode metal in contact with the first conductivity type anode contact, and a first cathode metal in contact with the second conductivity type first cathode contact.

3. The integrated power semiconductor device according to claim 2, wherein the second oxygen ions injection layer, the third oxygen ions injection layer, the fourth oxygen ions injection layer, and the first oxygen ions injection layer are located in the second conductivity type epitaxial layer.

4. The integrated power semiconductor device according to claim 3, wherein the first conductivity type first deep well region is located in an isolation region formed by the first dielectric trench and the first oxygen ions injection layer; or the first conductivity type first deep well region is located outside the isolation region formed by the first dielectric trench and the first oxygen ions injection layer, and a first conductivity type contact ring is located in the edge of first conductivity type the first deep well region and in contact with a contact ring metal; wherein the first high voltage pLDMOS device is located in a first conductivity type second deep well region, the first conductivity type second deep well region is located outside an isolation region formed by the second dielectric trench and the second oxygen ions injection layer, and a first conductivity type contact ring is located inside the edge of the first conductivity type second deep well region and is in contact with a contact ring metal; wherein the high voltage nLDMOS device is located in a first conductivity type third deep well region, the first conductivity type third deep well region is located outside an isolation region formed by the third dielectric trench and the third oxygen ions injection layer, a first conductivity type contact ring is located inside the edge of the first conductivity type third deep well region and is in contact with a contact ring metal; wherein the second high voltage pLDMOS device is located in a first conductivity type fourth deep well region, the first conductivity type fourth deep well region is located outside an isolation region formed by the fourth dielectric trench and the fourth oxygen ions injection layer, and a first conductivity type contact ring is located inside the edge of the first conductivity type fourth deep well region and is in contact with a contact ring metal.

5. The integrated power semiconductor device according to claim 4, wherein the second conductivity type first well region of the low voltage PMOS device and the second conductivity type second well region of the low voltage NPN device are in contact with the first oxygen injection layer.

6. The integrated power semiconductor device according to claim 4, wherein

- the substrate is a first conductivity type substrate, the vertical high voltage device is a high voltage IGBT device, the first conductivity type first deep well region is located outside an isolation region formed by the first dielectric trench and the first oxygen ions injection layer, and a first conductivity type contact ring is located inside the edge of the f first conductivity type first deep well region and is in contact with a contact ring metal;
- the high voltage IGBT device further comprises a Schottky contact cell $S_n$ located between the cell regions $C_n$, wherein the Schottky contact cell $S_n$ comprises a first conductivity type first body region located in the second conductivity type epitaxial layer, a second conductivity type second cathode contact located between the first conductivity type first body regions and not in contact with the first conductivity type first body region, a second cathode metal in contact with the second conductivity type second cathode contact, and a pre-metal dielectric layer to isolate the Schottky contact cell $S_n$ and the cell region $C_n$.

7. A method for manufacturing the integrated power semiconductor device according to claim 4, comprising:

- step 1, use a second conductivity type epitaxial layer;
- step 2, a first conductivity type first deep well region, a first conductivity type second deep well region, and a first conductivity type drift first drift region are formed in the second conductivity type epitaxial layer through a photolithography technique, an ion implantation technique, ion implantation technique and an annealing technique;
- step 3, oxygen ions with a predetermined amount is implanted into the first conductivity type first deep well region, the first conductivity type second deep well region, and the first conductivity type drift first drift region through a photolithography technique and an ion implantation technique;
- step 4, an annealing treatment is performed to form a first oxygen ions injection layer, a second oxygen ions injection layer, a third oxygen ions injection layer;
- step 5, a dielectric trench is formed through a deep trench etching process, an oxide layer is thermally grown on the side wall of the trench, a polysilicon is deposited to fill remaining gaps in the dielectric trench;
- step 6, first conductivity type impurities and second conductivity type impurities are respectively implanted into the second conductivity type epitaxial layer by different energies and doses through the photolithography technique and the ion implantation technique, then the annealing treatment is performed to form a first conductivity type first body region, a first conductivity type field limiting ring, a second conductivity type first well region, a second conductivity type second well region, a first conductivity type base region, a second conductivity type cathode region, a second conductivity type first body region, a first conductivity type first field resistance region, a first conductivity type second body region, a second conductivity type first field resistance region;
- step 7, an oxide layer is thermally grown on an upper surface of the second conductivity type epitaxial layer, field oxide dielectric layer is formed;
- step 8, an oxide layer is thermally grown on the upper surface of the second conductivity type epitaxial layer to form a gate dielectric layer, polysilicon is deposited, and gate terminal is formed by through a photolithography technique;
- step 9, first conductivity type impurities and second conductivity type impurities are respectively implanted into the second conductivity type epitaxial layer by different energies and doses through the photolithography technique and the ion implantation technique, then the annealing treatment is performed to form a first conductivity type contact and a second conductivity type contact;
- step 10, a pre-metal dielectric layer is deposited, and a metal layer is deposited after punching; and
- step 11, the backside ion implant is performed to form the substrate.

8. The integrated power semiconductor device according to claim 2, wherein the first oxygen ions injection layer, the second oxygen ions injection layer, the third oxygen ions injection layer, and the fourth oxygen ions injection layer are located in the substrate.

9. The integrated power semiconductor device according to claim 8, wherein, a second conductivity type field resistance layer is inserted between the substrate and the second conductivity type epitaxial layer in the vertical high voltage device.

10. A method for manufacturing the integrated power semiconductor device according to claim 8, comprising:

- step 1, use a substrate;
- step 2, oxygen ions with a predetermined amount is implanted into a substrate 000 through a photolithography technique and an ion implantation technique;
- step 3, an annealing treatment is performed to form a first oxygen ions injection layer 306, a second oxygen ions injection layer, a third oxygen ions injection layer;
- step 4, an epitaxy is performed to form a second conductivity type epitaxial layer;
- step 5, a dielectric trench is formed through a deep trench etching process, an oxide layer is thermally grown on the side wall of the trench, a polysilicon is deposited to fill remaining gaps in the dielectric trench;
- step 6, a first conductivity type first deep well region, a first conductivity type first drift region, and a second conductivity type drift are formed in the second conductivity type epitaxial layer through a photolithography technique, an ion implantation technique, Ion Implantation technique and an annealing technique;

step 7, an oxide layer is thermally grown on an upper surface of the second conductivity type epitaxial layer, field oxide dielectric layer is formed;

step 8, first conductivity type impurities and second conductivity type impurities are respectively implanted into the second conductivity type epitaxial layer by different energies and doses through the photolithography technique and the ion implantation technique, then the annealing treatment is performed to form a first conductivity type first body region, a first conductivity type field limiting ring, a second conductivity type first well region, a second conductivity type second well region, a first conductivity type base region, a second conductivity type cathode region, a second conductivity type first body region, a first conductivity type first field resistance region, a first conductivity type second body region, a second conductivity type first field resistance region;

step 9, an oxide layer is thermally grown on the upper surface of the second conductivity type epitaxial layer to form a gate dielectric layer, polysilicon is deposited, and gate terminal is formed by through a photolithography technique;

step 10, first conductivity type impurities and second conductivity type impurities are respectively implanted into the second conductivity type epitaxial layer by different energies and doses through the photolithography technique and the ion implantation technique, then the annealing treatment is performed to form a first conductivity type contact and a second conductivity type contact; and step 11, a pre-metal dielectric layer is deposited, and a metal layer is deposited after punching.

11. The integrated power semiconductor device according to claim 1, wherein the substrate is a first conductivity type substrate or a second conductivity type substrate.

12. The integrated power semiconductor device according to claim 1, wherein, the substrate is a second conductivity type substrate, the low voltage NMOS device comprises a first conductivity type well region located in an isolation region formed by the first dielectric trench and the first oxygen ions injection layer, a fifth gate dielectric layer located on an upper surface of first conductivity type well region, a fifth gate terminal located on an upper surface of the fifth gate dielectric layer, a second conductivity type second drain contact and a second conductivity type fifth source contact located on both sides of the fifth gate terminal and in the first conductivity type well region, a fourth drain metal in contact with the second conductivity type second drain contact, a fifth source metal in contact with the second conductivity type fifth source contact, a first conductivity type body contact located on a side of the second conductivity type fifth source contact away from the fifth gate terminal, and a first body metal in contact with the first conductivity type body contact.

* * * * *